United States Patent
Kawamoto et al.

(10) Patent No.: US 7,446,614 B2
(45) Date of Patent: Nov. 4, 2008

(54) LOGICAL LEVEL CONVERTER AND PHASE LOCKED LOOP USING THE SAME

(75) Inventors: Takashi Kawamoto, Kokubunji (JP); Masaru Kokubo, Foster, CA (US); Takashi Oshima, Albany, CA (US)

(73) Assignee: Renesas Technology Corp., Tokyo (JP)

( * ) Notice: Subject to any disclaimer, the term of this patent is extended or adjusted under 35 U.S.C. 154(b) by 228 days.

(21) Appl. No.: 11/403,968

(22) Filed: Apr. 14, 2006

(65) Prior Publication Data

US 2006/0261873 A1 Nov. 23, 2006

(30) Foreign Application Priority Data

Apr. 15, 2005 (JP) ............................. 2005-117753

(51) Int. Cl.
*H03L 7/085* (2006.01)
*H03L 7/089* (2006.01)
*H03L 7/099* (2006.01)

(52) U.S. Cl. ......................................... 331/1 A; 331/74

(58) Field of Classification Search ................. 331/1 A, 331/74, 15, 182, 183, 185, 186; 327/77, 327/78, 85, 164, 365, 403; 360/39, 51; 369/59.16, 369/59.19, 59.21, 47.26, 47.28, 124.12

See application file for complete search history.

(56) References Cited

U.S. PATENT DOCUMENTS 5,210,712 A 5/1993 Saito 6,215,364 B1 4/2001 Hwang et al.

FOREIGN PATENT DOCUMENTS

| JP | 05-007135 | 1/1993 |
|----|-----------|---------|
| JP | 11-298302 | 10/1999 |
| JP | 2001-358565 | 12/2001 |

*Primary Examiner*—Robert J. Pascal
*Assistant Examiner*—Gerald Stevens
(74) *Attorney, Agent, or Firm*—Mattingly, Stanger, Malur & Brundidge, PC

(57) ABSTRACT

A logical level converter generates an output signal by which a succeeding logical circuit accurately operates even if there is a threshold fluctuation factor. In the logical level converter, an output signal of a voltage control oscillator in a phase locked loop is inputted to a threshold variable inverter. A DC component of another output signal from the threshold variable inverter is inputted to a comparator, and compared with a comparison voltage. A threshold setting signal is outputted on the basis of a comparison result. The threshold value of the threshold variable inverter is changed according to the threshold variable signal, and the output signal is converted into the other output signal. When the comparison result comes to a given state, the value of the threshold setting signal is held, and the other output signal is outputted as a further different output signal.

15 Claims, 35 Drawing Sheets

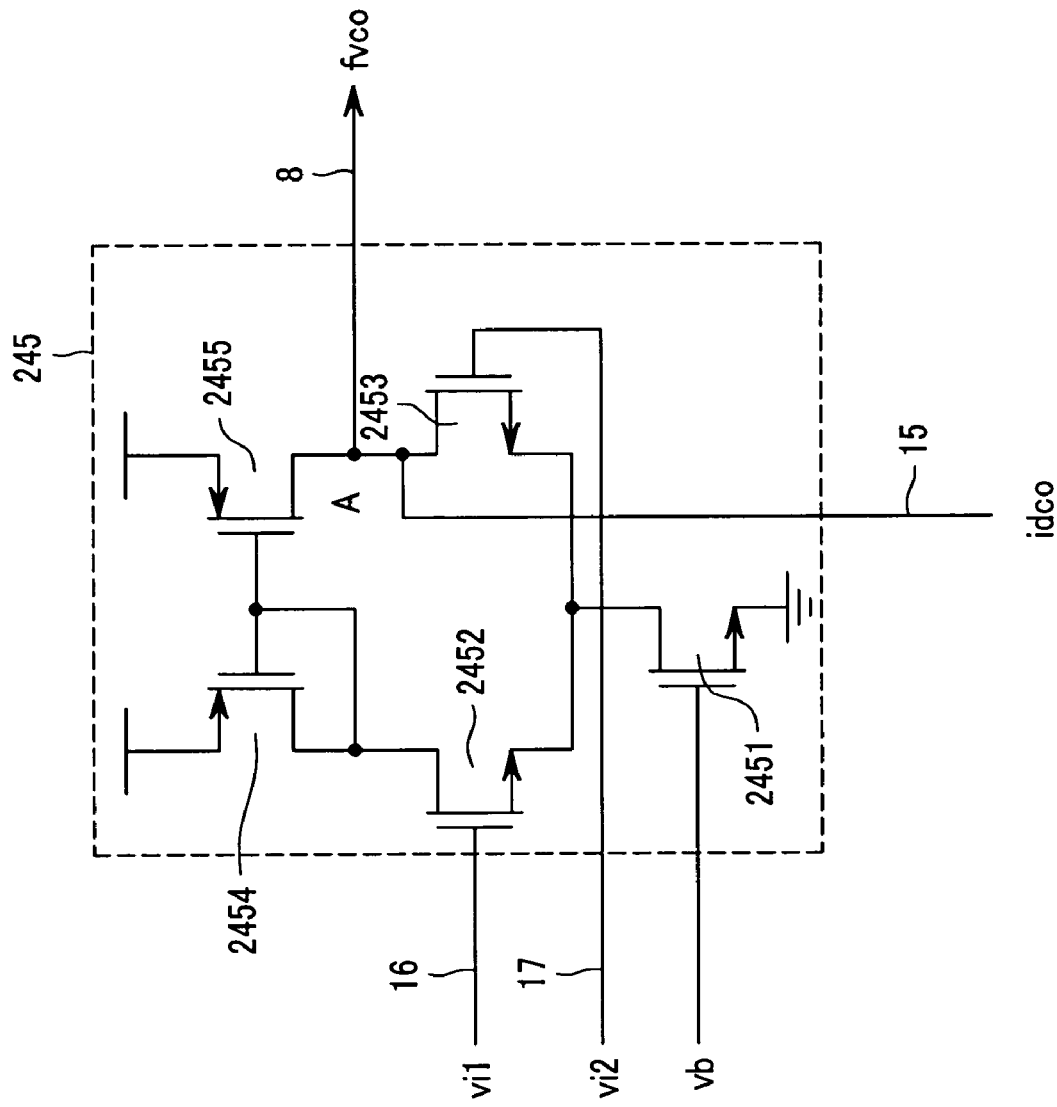

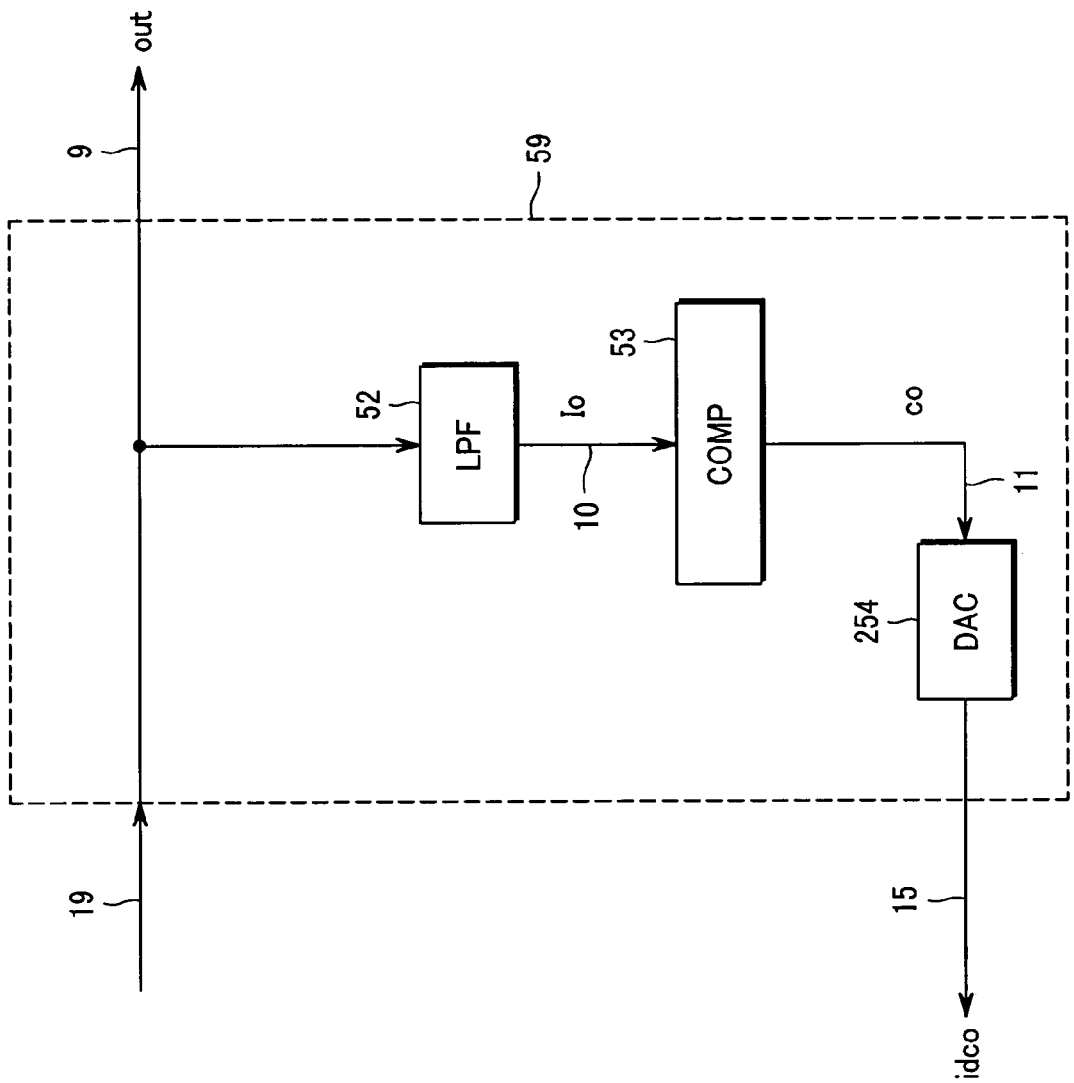

LOGICAL LEVEL CONVERTER AND PHASE LOCKED LOOP USING THE SAME

CLAIM OF PRIORITY

The present patent application claims priority from Japanese application JP No. 2005-117753 filed on Apr. 15, 2005, the content of which is hereby incorporated by reference into this application.

FIELD OF THE INVENTION

The present invention relates to a logical level converter that converts a signal having an amplitude lowered and a DC level changed as a frequency becomes higher into a logical level, and a phase locked loop using the logical level converter. More particularly, the present invention relates to a logical level converter that is suitable for a semiconductor integrated circuit device which operates in a broad frequency range from a low band to a GHz band at a low supply voltage, and a phase locked loop using the logical level converter.

BACKGROUND OF THE INVENTION

In an optical disk representative of a magnetic disc driver (hereinafter, referred to as "HDD: hard disk drive"), a CD (compact disc), and a DVD (digital versatile disc), or a radio communication mobile terminal, a phase locked loop is used in generation of a clock signal for operating a logical circuit. It is general that the phase locked loop is constituted as a semiconductor integrated circuit device together with a peripheral circuit. In recent years, the operating speed of those information devices is remarkably higher, and the operating frequency of the phase locked loop reaches the GHz band.

As an example of the phase locked loop having a high speed operation which is suitable for a structure of the semiconductor integrated circuit device, for example, patent document #1: Japanese Patent Laid-open No. H11-298302 and patent document #2: Japanese Patent Laid-open No. 2001-358565 disclose an example in which a frequency variable oscillator circuit that is one of the main structural circuits is made up of an oscillator circuit in which delay circuits that change the amount of delay according to a current are annularly connected at a multistage.

Also, in a digital signal analysis device, an inputted digital signal is liable to lower the amplitude or to change the DC level, that is, to produce the DC offset as the frequency becomes higher. Patent document #3: Japanese Patent Laid-open No. H5-7135 discloses an example of a correction circuit that shapes the waveform of the above digital signal to correct the amplitude change and the DC offset.

SUMMARY OF THE INVENTION

Since the frequency variable oscillator circuit is generally formed of an analog circuit, the phase locked loop that outputs a digital signal is normally integrated by an analog digital hybrid signal processing LSI (large scale integrated circuit) (hereinafter referred to as "analog digital hybrid LSI"). For that reason, in the phase locked loop of the analog digital hybrid LSI, a voltage control oscillator (hereinafter referred to as "VCO") that is a frequency variable oscillator circuit is connected with a logical level converter that converts an analog VCO output signal into a digital signal.

In particular, in recent years, since the analog digital hybrid LSI is remarkably lower in the power consumption and higher in the processing speed, and the VCO output signal is higher in the speed, it is necessary that the power consumption of the logical level converter is lower and the band is broader.

In this example, an example of the VCO disclosed in the above two conventional documents is shown in FIG. 30. A VCO 24 includes a voltage to current converter circuit (VIC) 241 that converts a control voltage vc into a current, a current control oscillator (ICO) 247 that adjusts the amount of delay according to a current that is copied upon receiving a voltage vcont for copying the current generated by the voltage to current converter circuit 241, and a differential-to-single converter circuit (DSC) 246 that converts an analog differential output signal of the current control oscillator 247 into a digital single signal (single phase signal). The differential-to-single converter circuit 246 also functions as a logical level converter. Also, the current control oscillator 247 is structured in such a manner that delay circuits that adjust the amount of delay according to a driving current are connected in the form of a ring. Referring to FIG. 30, the current control oscillator 247 is structured in such a manner that the delay circuits (DL) 242a to 242c are connected at odd stages (three stages).

FIG. 31 shows a structural example of the delay circuit 242. The delay circuit 242 includes a first amplifier that constitutes one of a differential pair by transistors M1 and M3, a second amplifier that constitutes the other of the differential pair by transistors M2 and M4 likewise, third and fourth amplifiers that are constituted by transistors M6 and M7 and mutually connect the outputs to the inputs, and a variable current source using a transistor M5. The first and second amplifiers constitute a differential type, and the differential amplifier inputs differential signals vi1 and vi2, and outputs differential signals vo1 and vo2.

The delay circuit 242 is a delay circuit that shares a load between the first and third amplifiers, and also shares a load between the second and fourth amplifiers, to thereby reduce the number of transistors and to reduce a load capacity of the delay circuit. Also, the delay circuit 242 is an asymmetric delay circuit that drives the variable current source by only side due to the transistor M5 for adapting to a low supply voltage. For that reason, in particular, in the high speed operation, an output signal of the delay circuit 242 is offset at the ground side. The differential to signal converter circuit 246 converts the high speed differential signals vo1 and vo2 that have been offset at the ground side into a single signal.

FIG. 32 shows a circuit example of the differential-to-single converter circuit 246. The differential to signal converter circuit 246 includes the driving transistors M2 and M3, a current source using the transistor M1 that supplies a driving current to the driving transistors M2 and M3, and the load transistors M4 and M5 that are loads of the driving transistors M2 and M3, respectively.

In the high frequency, because an output signal of the upstream delay circuit 242c is offset toward the ground side and outputted, differential signals vi1 and vi2 that are inputted to the differential-to-single converter circuit 246 are offset to the ground side. In this case, fvco that is an output signal of the differential-to-single converter circuit 246 is offset toward the supply voltage side and outputted. For that reason, a next stage logical circuit (not shown) that receives an output signal (fvco) 8 of the differential-to-single converter circuit 246 must process a high speed signal that has been offset to the supply voltage side.

On the other hand, in recent years, a fluctuation in threshold values due to threshold fluctuation factors (process, temperature, supply voltage) becomes large because the finer process is conducted. For that reason, in the analog digital hybrid LSI, there can occur a phenomenon in which a threshold value of the logical circuit fluctuates due to the threshold fluctuation factor, and the offset analog signal cannot be accurately recognized. The threshold fluctuation becomes larger as the finer process is conducted, and therefore the high speed operation is required. In the analog digital hybrid LSI that is constituted by the finer process, malfunction is particularly liable to occur at the transmission portions of the analog signal and the digital signal.

FIG. 33 shows an example of a phase locked loop that is incorporated into the analog digital hybrid LSI. The phase locked loop includes a phase frequency detector (PFD) 1, a charge pump (CP) 2, a loop filter (LF) 3, a VCO 4, and a frequency divider (MMD) 6 that divides an output frequency of the VCO4. An output signal (fvco) 8 of the VCO 4 is inputted to a next stage logical circuit (not shown). The output signal 8 is a signal equivalent to the digital signal of a logical level (for example, voltage is 0 to supply voltage Vdd).

In the phase locked loop, the frequency divider 6 divides the output signal 8 of the VCO 4. A comparison signal (fdiv) 32 obtained by the frequency division is fed back to the phase frequency detector 1. The phase frequency detector 1 detects a phase difference between a reference signal (fref) 31 and a comparison signal 32, and then outputs a voltage pulse of a pulse width corresponding to the phase difference to the charge pump 2.

The charge pump 2 comes to any state of discharge or charge of electric charges or high impedances according to the voltage pulse, and outputs an output current of the charge pump 2 to a loop filter 3. The output current of the charge pump 2 is smoothed and subjected to voltage conversion into a control voltage of the VCO 4 by the loop filter 3.

In the analog digital hybrid LSI having the phase locked loop and the logical circuit incorporated thereinto, the output signal 8 fluctuates due to the threshold fluctuation factor (process, temperature, supply voltage), and the logical circuit that receives the output signal 8 cannot accurately operate, resulting in malfunction. In other words, when the frequency becomes high, the VCO 4 allows the DC level and the signal amplitude of the output signal 8 of the VCO 4 to largely fluctuate due to the threshold fluctuation factor. On the other hand, the logical circuit that inputs the output signal 8 also allows the threshold value to largely fluctuate due to the threshold fluctuation factor. In this situation, it is possible that the DC level of the inputted output signal 8 cannot break the threshold value of the logical circuit under a given condition. This causes the logical circuit to malfunction. In this way, as the finer process is advanced, deterioration of the yield and the production efficiency cannot be prevented, and the low prices of the analog digital hybrid LSI are impeded in the analog digital hybrid LSI.

Therefore, in an interface device that includes the analog digital hybrid LSI having the phase locked loop incorporated thereinto, or in a recording and reproducing device of the HDD/DVD access, as the finer process is advanced, not only the manufacture yield is reduced, but also there is a high risk that the operation failure occurs. As a result, deterioration of the reliability and the productivity cannot be prevented. Also, in a radio communication terminal device that includes an analog digital hybrid LSI having the phase locked loop incorporated thereinto, a risk that induces the malfunction during the communication operation becomes high, so deterioration of the reliability cannot be avoided.

Up to now, measures to broaden the gain and band of the differential-to-single converter circuit have been conducted against the above problems. However, the power consumption is not prevented from increasing due to the broader band. Also, the higher operating speed of the logical circuit in recent years makes it difficult to mount the differential-to-single converter circuit having a necessary band. In the phase locked loop for use in a recording and reproducing device such as a DVD access, a demand is made to adapt to a broadband frequency from a low frequency to a high frequency. For that reason, the correction circuit having the characteristics that blocks the low band and passes the high band as disclosed in the patent document #3 makes the capacity area to be used large in order to pass the low frequencies, thereby making it difficult to mount the correction circuit on the large scaled integrated circuit. Also, in all of the interface device, the recording and reproducing device, and the radio communication terminal device, because the use environments are various, the lower reliability is facilitated.

The present invention has been made to solve the above problems with the conventional art, and therefore an object of the present invention is to provide a logical level converter that generates an output signal by which a next stage logical circuit accurately operates even if there is a threshold fluctuation factor (process, temperature, supply voltage), and a phase locked loop using the logical level converter.

In order to achieve the above object, according to the present invention, there is provided a logical level converter comprising a threshold variable inverter that inputs a first signal and a second signal and converts the first signal into a third signal by a threshold value that is set according to the second signal, a judgment circuit that judges the third signal on the basis of a given state after the second signal is set to a given value, newly generates the second signal on the basis of the judgment result, and outputs the third signal as a fourth signal, wherein the judgment circuit holds the value of the second signal when the third signal is in the given state.

The logical level converter adjusts the DC level of the first signal and the threshold value of the threshold variable inverter so as to be substantially identical with each other, to thereby adjust the amplitude and DC level of the first signal to be the logical level. As a result, it is possible to generate the first signal, that is, the output signal by which the next stage logical circuit accurately operates even if there is the threshold fluctuation factor (process, temperature, supply voltage).

In order to achieve the above object, according to the present invention, there is provided a phase locked loop comprising a phase comparator that compares an inputted comparison signal with an inputted reference signal to output a phase difference, a charge pump that converts the phase difference into a current; a loop filter that extracts a low band frequency component of the current which is outputted from the charge pump and converts the low band frequency component of the extracted current into a control voltage, a voltage control oscillator that changes an oscillation frequency according to the control voltage and outputs an oscillation output as a first signal, a frequency divider that divides the first signal and outputs the reference signal, and a logical level converter that inputs the first signal and outputs a fourth signal.

Since the first signal by which the next stage logical circuit accurately operates is outputted from the logical level converter that is disposed at an output stage of the phase locked loop, the phase locked loop is capable of being applied to a wide field in which a broadband signal is dealt with. As the field of this type, there are, for example, an interface device for connecting an optical disk device representative of a CD or a DVD, or an HDD to a computer, a recording and reproducing device used within the HDD or the optical disk, or a radio communication mobile terminal.

According to the present invention, since the amplitude and DC level of the output signal are adjusted to the logical level by the logical level converter, it is possible that a next stage logical circuit that inputs the above output signal appropriately operates even if there is a threshold fluctuation factor (process, temperature, supply voltage).

These and other objects and many of the attendant advantages of the invention will be readily appreciated as the same becomes better understood by reference to the following detailed description when considered in connection with the accompanying drawings.

BRIEF DESCRIPTION OF THE DRAWINGS

FIG. 16 is a circuit diagram for explaining an example of a differential-to-single converter for use in the VCO shown in FIG. 14;

FIG. 18 is a block diagram for explaining an example of a first judgment circuit for use in the logical level converter shown in FIG. 17A and FIG. 17B;

DETAILED DESCRIPTION OF THE PREFERRED EMBODIMENTS

Figure 1:
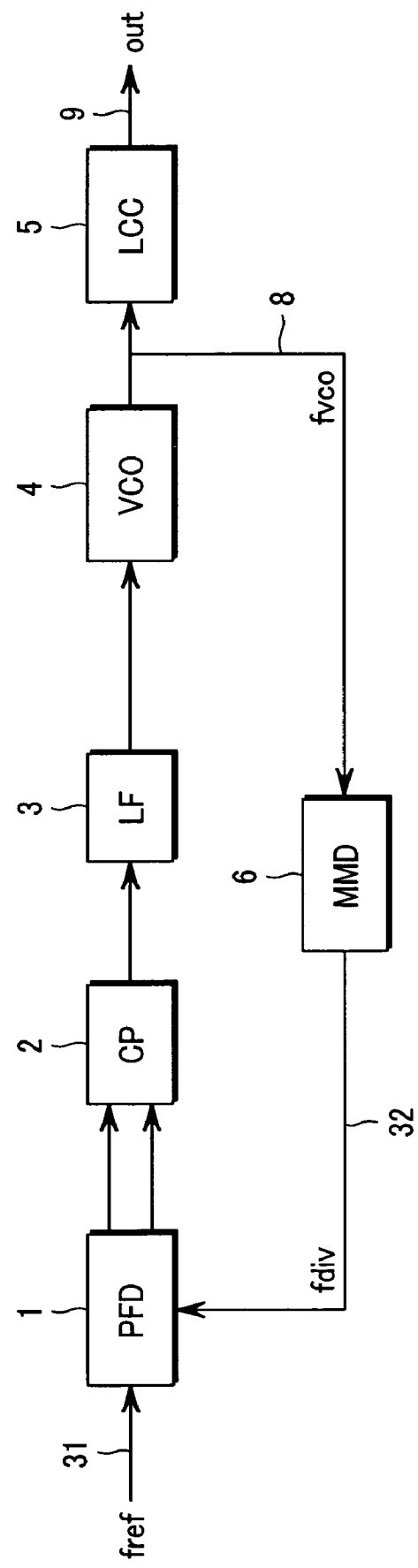
FIG. 1 is a block diagram for explaining a logical level converter and a phase locked loop using the logical level converter according to a first embodiment of the present invention.

Hereinafter, a description will be given in more detail of a logical level converter, a phase locked loop using the logical level converter, and an interface device, a recording and reproducing circuit, and a radio communication terminal device which use the phase locked loop according to preferred embodiments of the present invention with reference to the accompanying drawings. In all of the figures used for description, the same reference numerals denote the identical parts or similar parts.

First Embodiment

Figure 2:
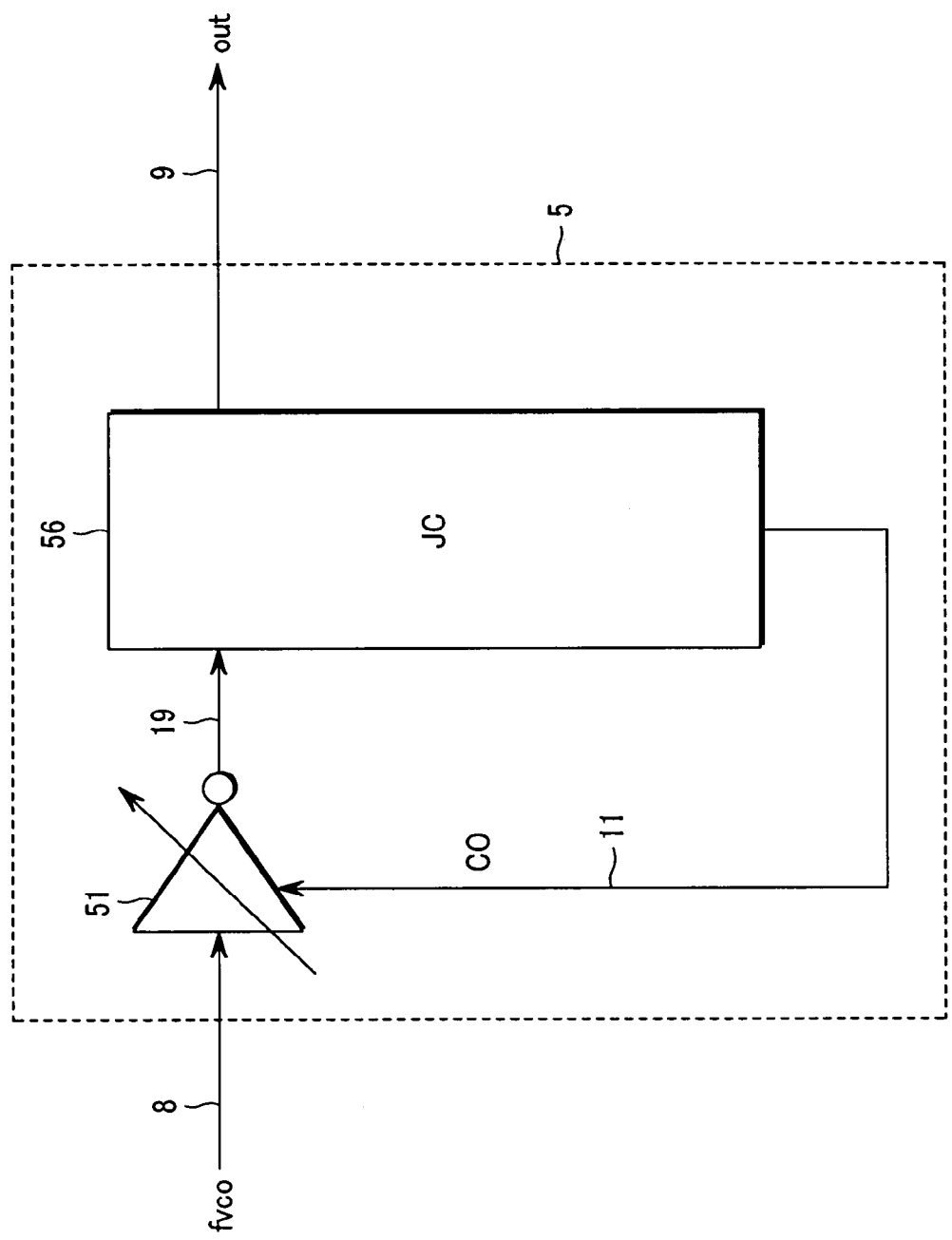
FIG. 2 is a block diagram for explaining an example of a first logical level converter for use in the phase locked loop shown in FIG. 1.

FIGS. 1 and 2 show a first embodiment of the present invention. This embodiment pertains to a logical level converter that most expresses the features of the present invention, and a phase locked loop (PLL) using the logical level converter.

As shown in FIG. 1, the phase locked loop according to this embodiment includes a phase frequency detector (PFD) 1, a charge pump (CP) 2, a loop filter (LF) 3, a voltage control oscillator (hereinafter referred to as "VCO") 4, a logical level converter (LCC) 5 that converts an output signal (fvco) 8 of the VCO 4 into a digital output signal (out) 9 that can be accurately recognized by a next stage logical circuit (not shown), and a frequency divider (MMD) 6 that divides the output signal 8.

Figure 30:
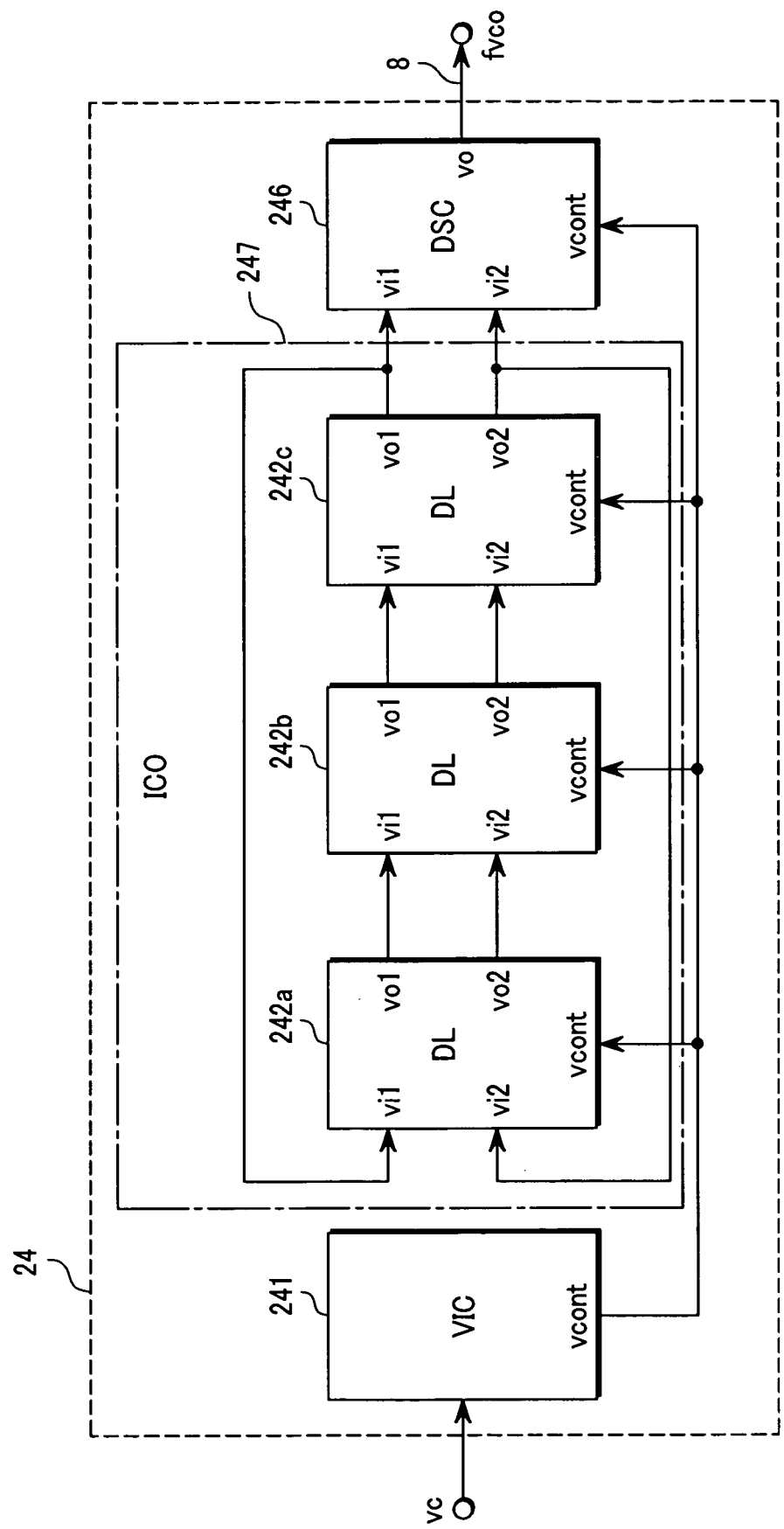
FIG. 30 is a block diagram for explaining an example of a voltage control oscillator for use in a conventional phase locked loop.
Figure 31:
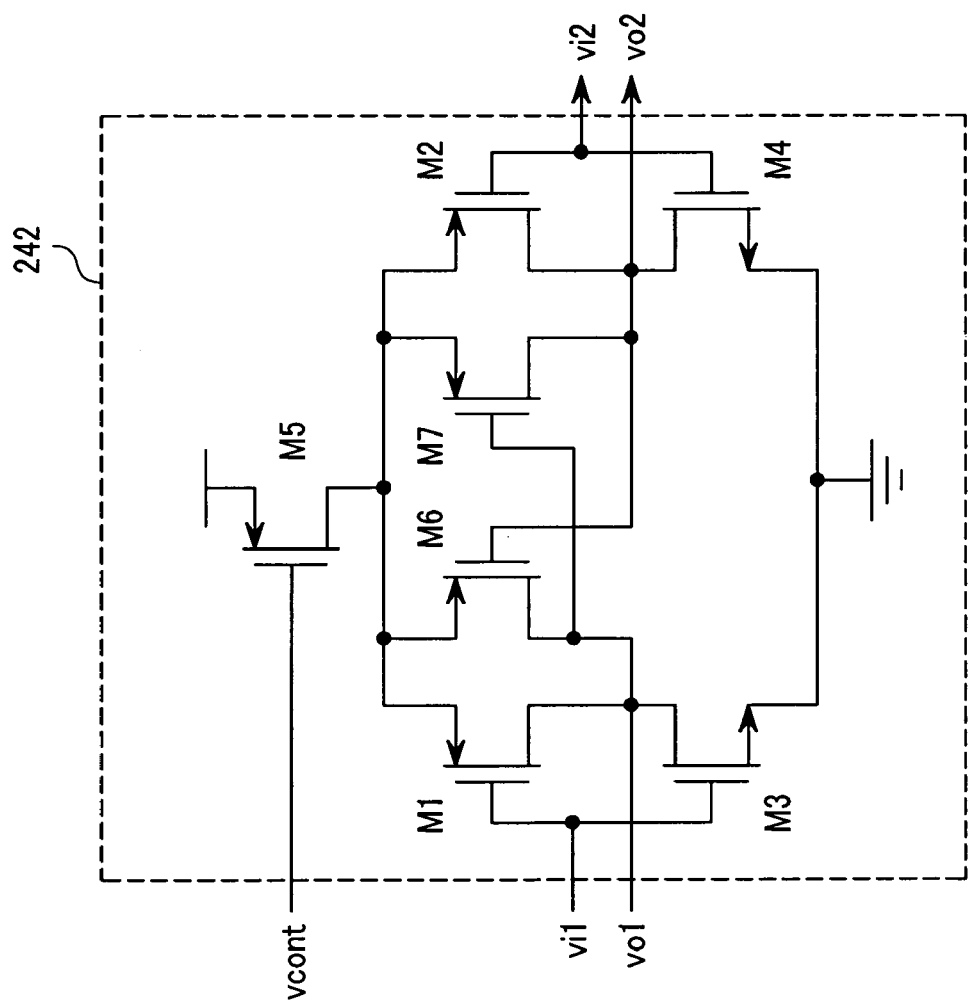
FIG. 31 is a circuit diagram for explaining an example of a delay circuit for use in the voltage control oscillator shown in FIG. 25.
Figure 32:
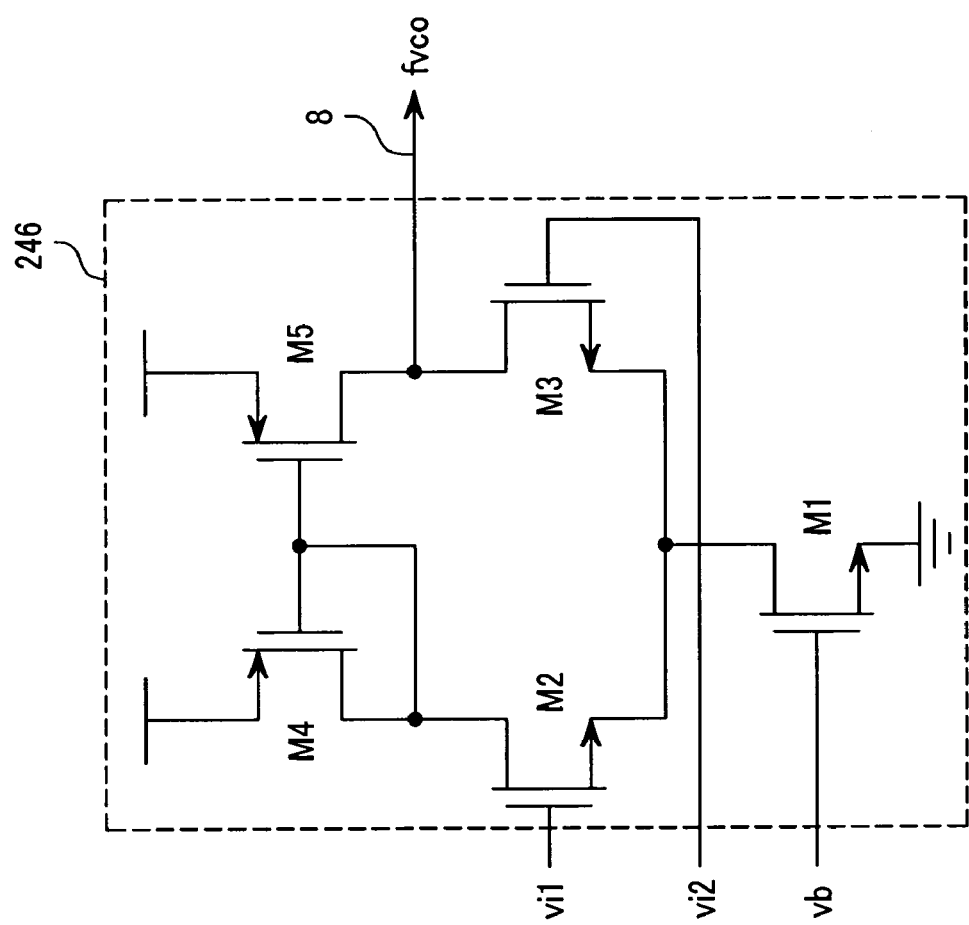
FIG. 32 is a circuit diagram for explaining an example of a differential-to-single converter circuit for use in the voltage control oscillator shown in FIG. 25.
Figure 33:
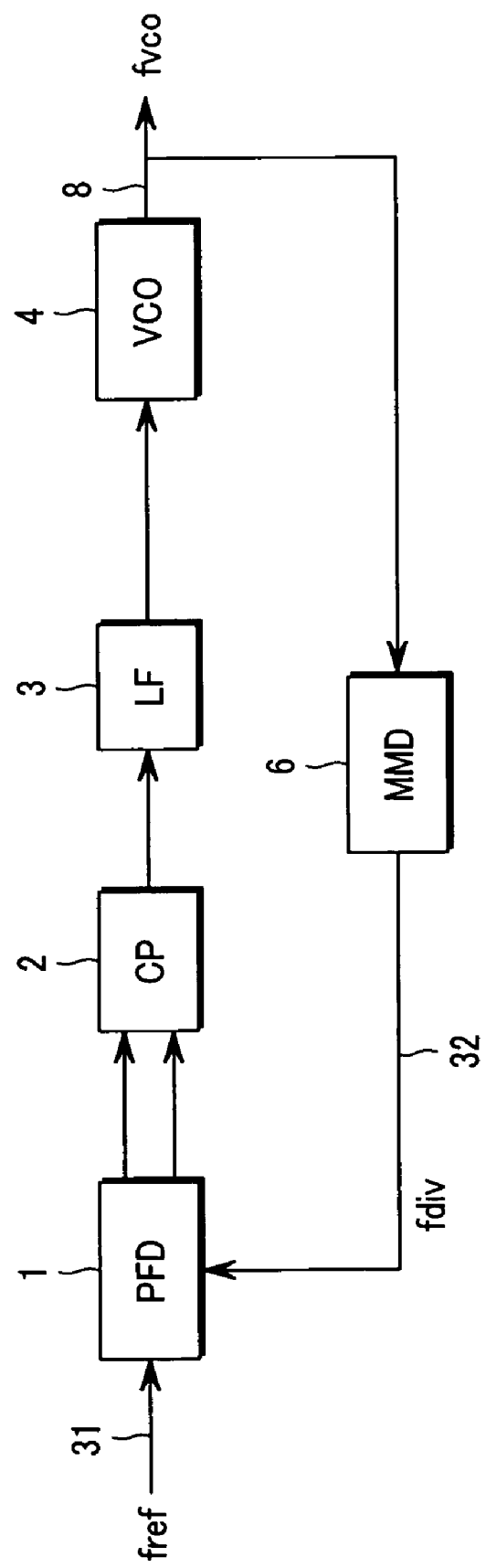
FIG. 33 is a block diagram for explaining an example of a conventional phase locked loop.

The VCO 4 is, for example, a VCO 24 shown in FIG. 30. Referring to FIG. 30, the VCO 24 includes a voltage to current converter circuit (VIC) 241 that converts a control voltage vc into a current, a current control oscillator (ICO) 247 that adjusts the amount of delay according to a current that is copied upon receiving a voltage vcont for copying the current which has been generated by the voltage to current converter circuit 241, and a differential-to-single converter circuit (DSC) 246 that converts an analog differential output signal of the current control oscillator 247 into a digital single signal (single phase signal). The current control oscillator 247 is structured in such a manner that delay circuits (DL) 242a to 242c that adjust the amount of delay according to the driving current are connected in the form of a ring. The delay circuit 242 is structured, for example, by a circuit shown in FIG. 31. The delay circuit 242 shown in FIG. 31 includes a first amplifier that constitutes one of a differential pair by transistors M1 and M3, a second amplifier that constitutes the other of the differential pair by transistors M2 and M4 likewise, third and fourth amplifiers that are constituted by transistors M6 and M7 and mutually connect the outputs to the inputs, and a variable current source using a transistor M5. The first and second amplifiers constitute a differential type, and the differential amplifier inputs differential signals vi1 and vi2, and outputs differential signals vo1 and vo2. A circuit that converts the differential signals vo1 and vo2 into a single signal is a differential single converter-circuit 246. The differential-to-single converter circuit 246 is structured by, for example, a circuit shown in FIG. 32. The differential-to-single converter circuit 246 includes a current source using the transistor M1 that generates a driving current, the driving transistors M2 and M3, and the load transistors M4 and M5. The differential-to-single converter circuit 246 inputs the differential signals vo1 and vo2 as the differential signals vi1 and vi2, and then outputs an output signal which is a single signal.

In the phase locked loop shown in FIG. 1, the frequency divider 6 divides the output signal 8 of the VCO 4. A comparison signal (fdiv) 32 that has been obtained by the frequency division is fed back to the phase frequency detector 1. The phase frequency detector 1 detects a phase difference between a reference signal (fref) 31 and the comparison signal 32, and then outputs a voltage pulse having a pulse width corresponding to the phase difference to the charge pump 2.

The charge pump 2 comes to any state of the discharge or charge of electric charges or a high impedance according to the voltage pulse, and then outputs a charge pump output current to the loop filter 3. The output current of the charge pump is smoothed and subjected to voltage conversion into a control voltage of the voltage control oscillator 4 by the loop filter 3.

Subsequently, a description will be given of a structural example of the logical level converter 5 and the operation thereof with reference to FIG. 2. The logical level converter 5 inputs an output signal 8 (first signal) of the VCO 4 and a threshold setting signal (co) 11 (second signal), processes the output signal 8 by a threshold value that is set according to the threshold setting signal 11, and outputs a signal 19 (third signal), and a judgment circuit 56 that inputs the signal 19, judges the inputted signal 19, and outputs an output signal (out) 9 (fourth signal) of the phase locked loop and the threshold setting signal 11 on the basis of the judgment result.

Figure 3:
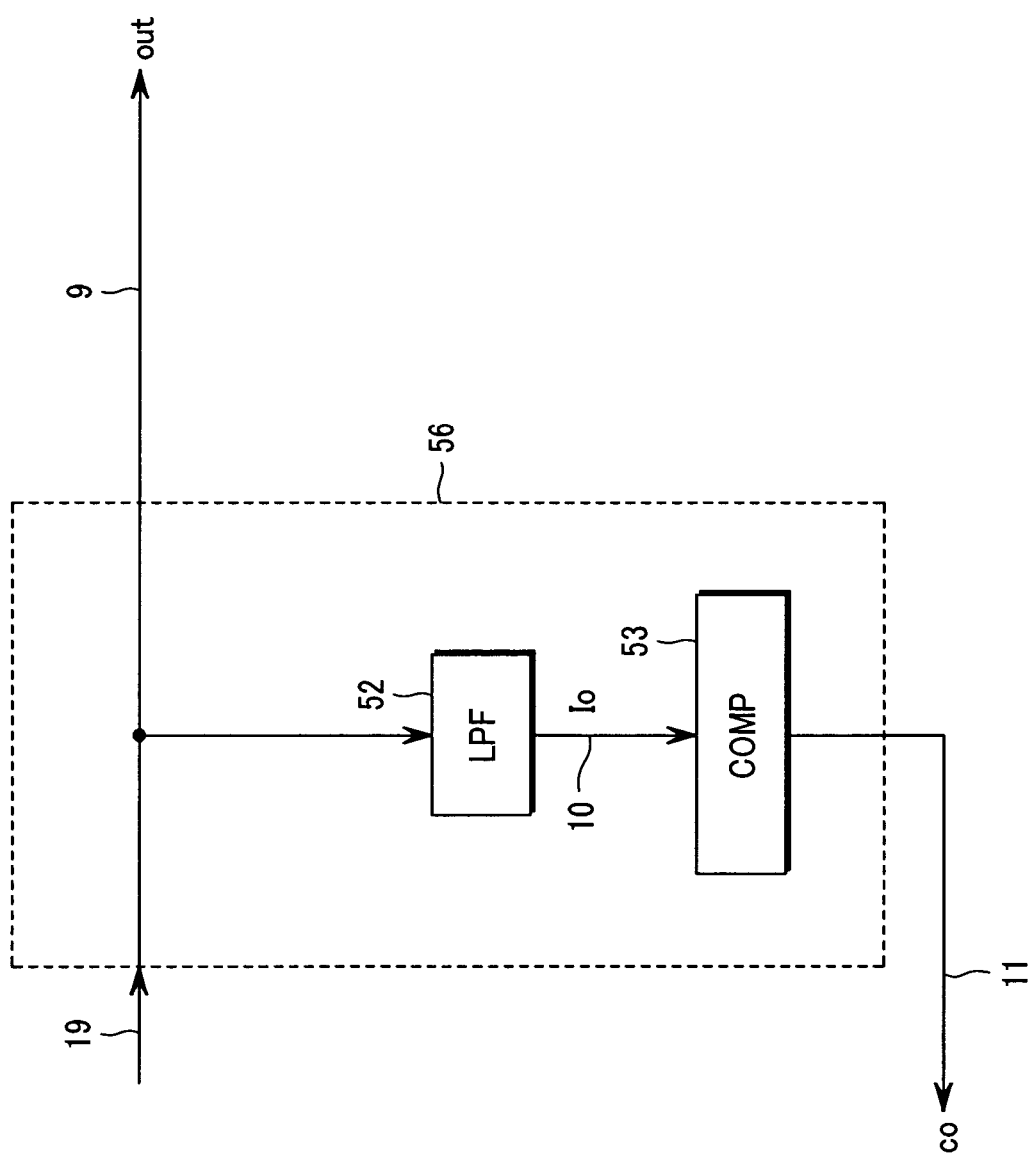
FIG. 3 is a block diagram for explaining an example of a first judgment circuit for use in the first logical level converter shown in FIG. 2.

FIG. 3 shows a first structural example of the judgment circuit 56 shown in FIG. 2. The first judgment circuit 56 outputs the signal 19 as an output signal 9. The first judgment circuit 56 also includes a low pass filter (LPF) 52 that inputs the signal 19 and outputs a DC component (1o) 10 of the signal 19, and a comparator (COMP) 53 that inputs the DC component 10 and outputs the threshold setting signal 11 on the basis of a result compared with the comparison voltage.

Figure 4:
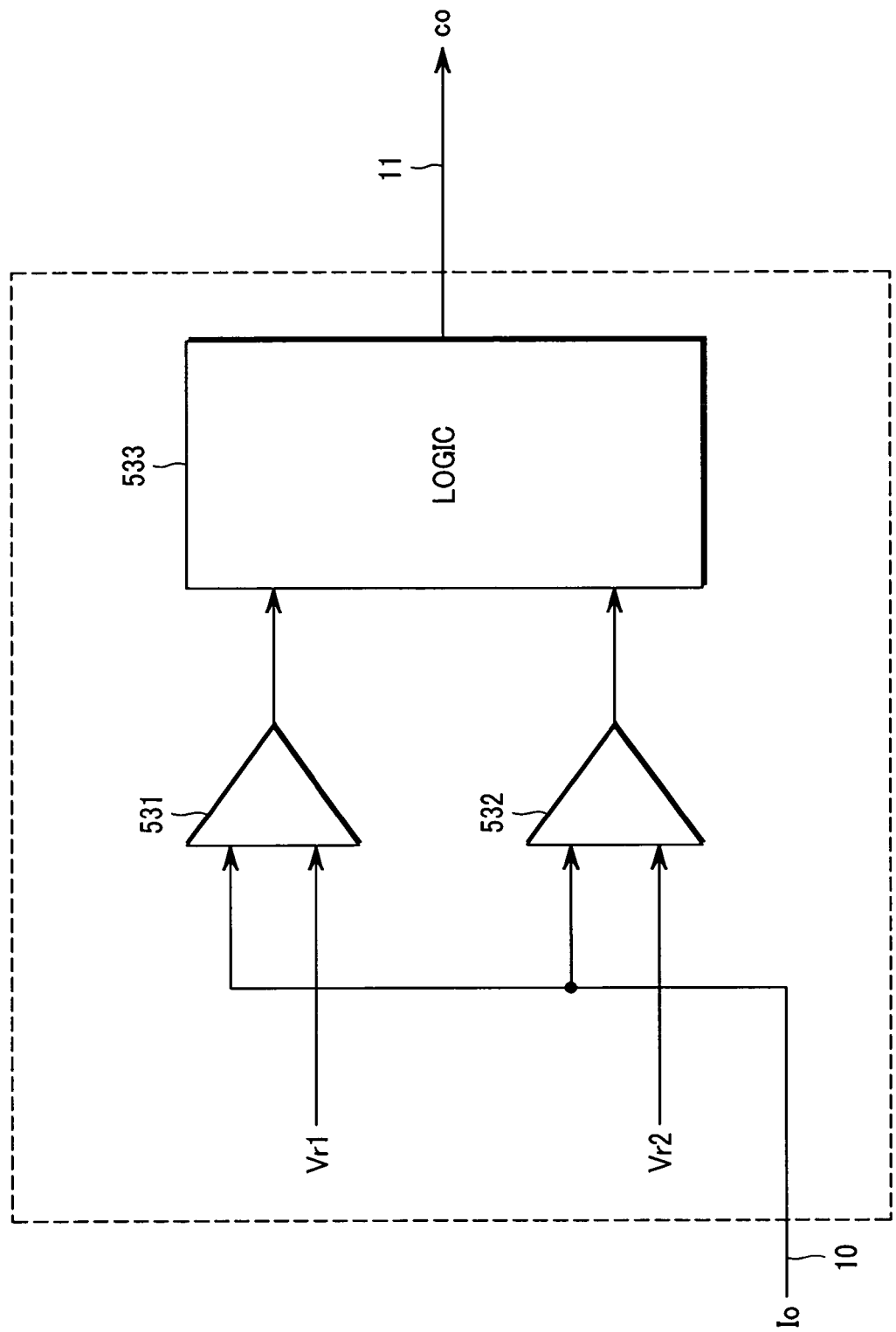
FIG. 4 is a block diagram for explaining an example of a comparator for use in the logical level converter shown in FIG. 3.

FIG. 4 shows a structural example of the comparator 53. The comparator 53 includes a comparator 531 that inputs a comparison voltage Vr1 and the DC component 10 and outputs a comparison signal, a comparator 532 that inputs a comparison voltage Vr2 and the DC component 10 and outputs a comparison signal, and a logical circuit (LOGIC) 533 that inputs the comparison signal that is outputted from the comparator 531 and the comparison signal that is outputted from the comparator 532, generates a comparison result, and outputs the threshold setting signal 11 on the basis of the comparison result.

Figure 5:
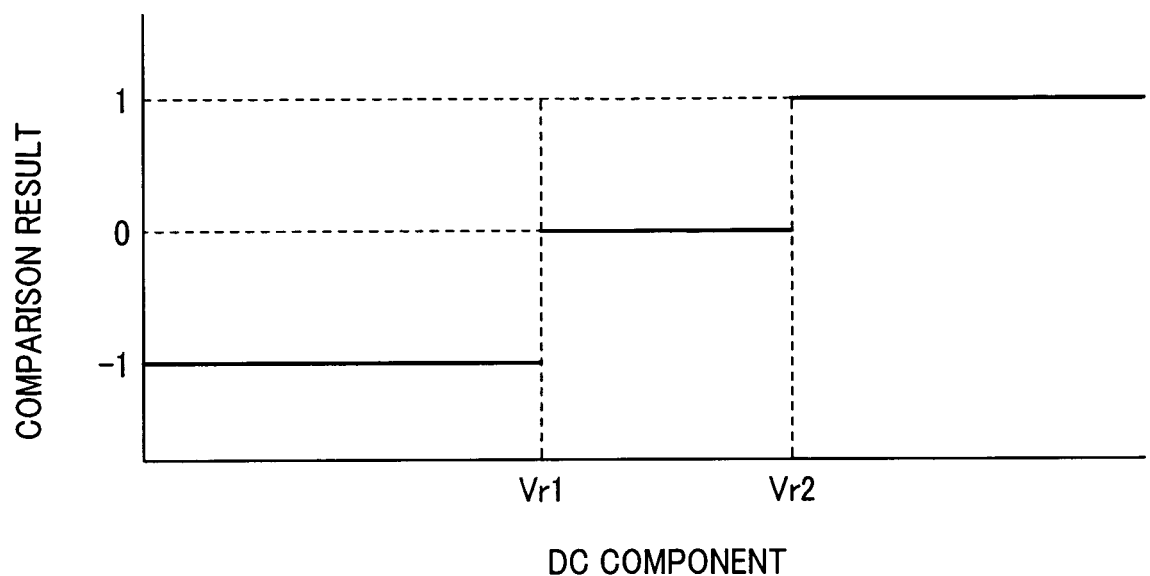
FIG. 5 is a diagram for explaining an input to output characteristic of the comparator shown in FIG. 4.

FIG. 5 shows an input to output characteristic of the comparator 53. When the DC component 10 is smaller than the comparison voltage Vr, the comparison result becomes −1. In this situation, the comparator 53 outputs the threshold setting signal 11 so that the threshold value of the threshold variable inverter 51 is made higher by one step. When the DC component 10 is larger than the comparison voltage Vr1 but smaller than Vr2, the comparison result becomes 0. In this situation, the comparator 53 outputs the threshold setting signal 11 that holds the threshold value of the threshold variable inverter 51. When the DC component 10 is larger than the comparison voltage Vr2, the comparison result becomes 1. In this situation, the comparator 53 outputs the threshold setting signal 11 so that the threshold value of the threshold variable inverter 51 is made lower by one step. This operation is conducted until the comparison result becomes 0. The configuration of the comparator 53 may be different from the above-described means if the configuration realizes the above operation.

In this example, it is assumed that the signal 19 is in a given state when the signal 19 is in a state where the comparison result is 0. Therefore, the judgment circuit 56 judges the signal 19 on the basis of the given state, and generates the threshold setting signal 11 according to that result.

Figure 6:
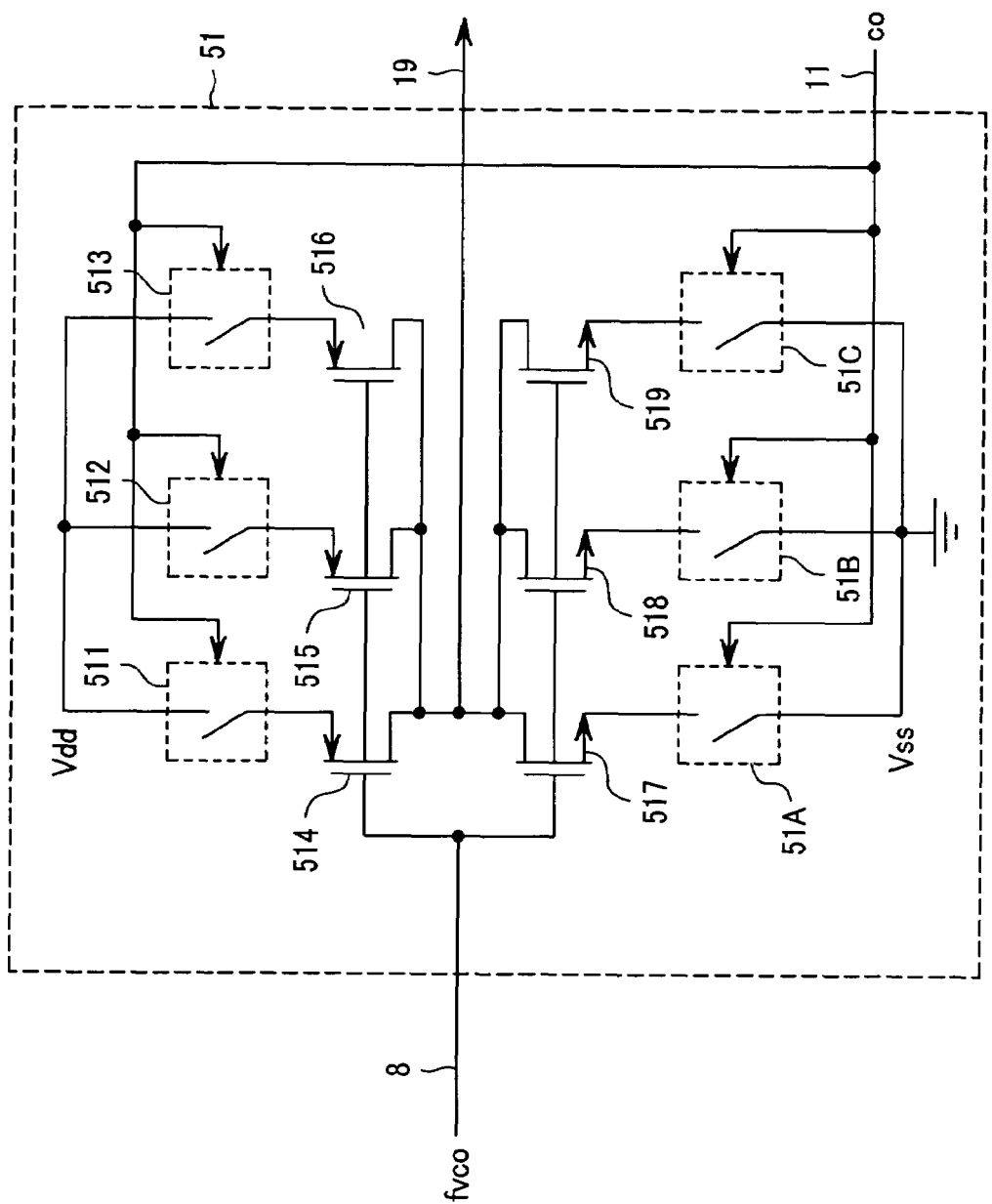
FIG. 6 is a block diagram for explaining an example of a first threshold variable inverter for use in the logical level converter shown in FIG. 2.

FIG. 6 shows a structural example of the first threshold variable inverter 51 that inputs the output signal 8 and the threshold setting signal 11 and outputs the signal 19 as shown in FIG. 2, and its operation will be described. The first threshold variable inverter 51 includes PMOS transistors 514, 515, 516 and NMOS transistors 517, 518, 519, switches 511, 512, 513 (first switches) which are controlled by the threshold setting signal 11 and inserted between the supply voltage and the PMOS transistors, respectively, and switches 51A, 51B, 51C (second switches) which are similarly controlled by the threshold setting signal 11 and inserted between the ground and the NMOS transistors, respectively. The first threshold variable inverter 51 may be different from the above structure if the operation can be controlled according to the threshold setting signal 11.

Figure 7:
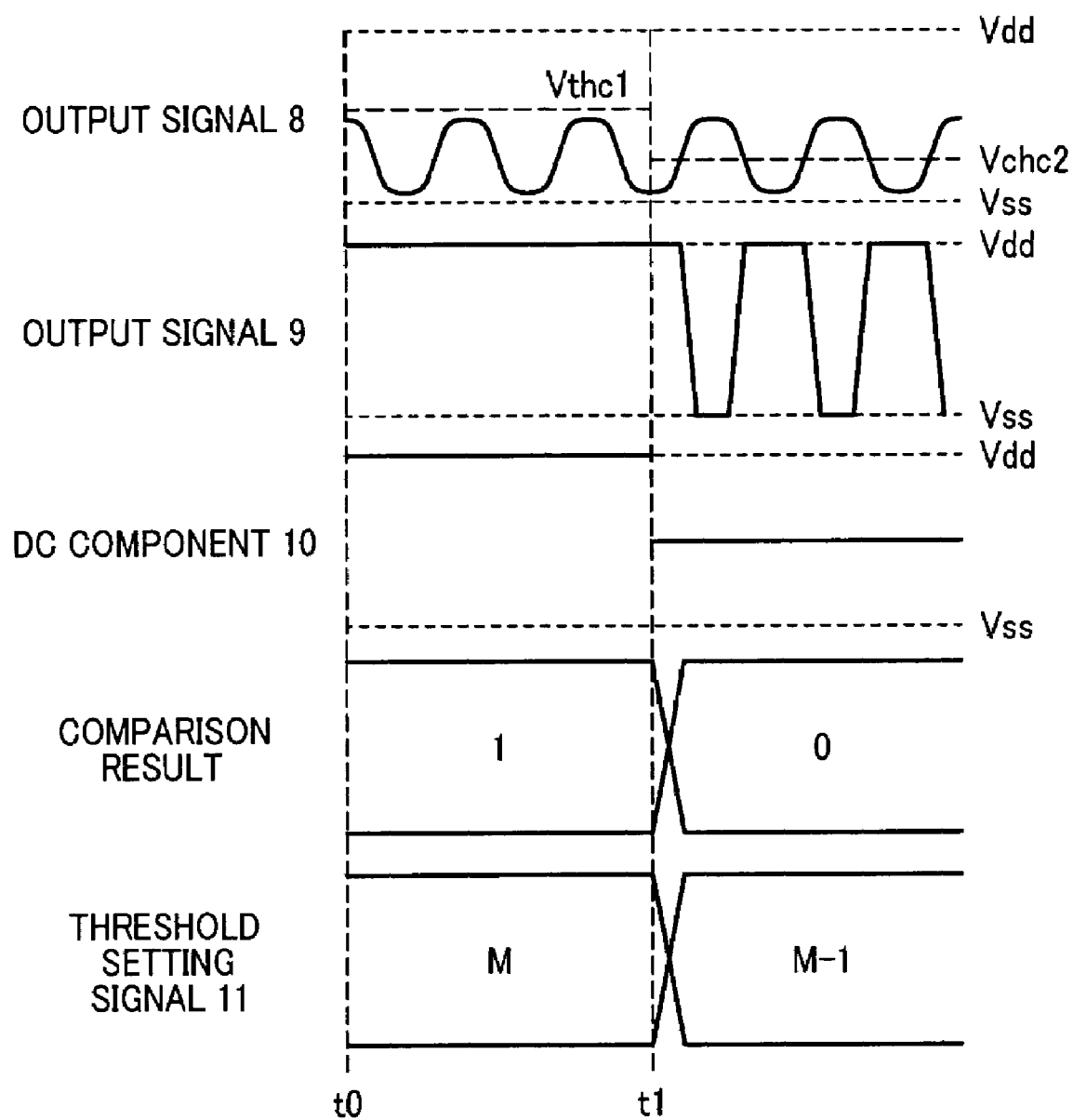
FIG. 7 is a diagram for explaining an example of the operation of the logical level converter shown in FIG. 2.

FIG. 7 shows the operation waveform of the logical level converter 5 according to this embodiment, and the operation of the logical level converter 5 will be described with reference to FIG. 7.

The output signal 8 of the VCO 4 is inputted to the logical level converter 5 at a time t0. The threshold setting signal 11 is a signal of M as initial setting. In the threshold variable inverter 51, the switches 511 and 51A turn on, and all of other switches turn off according to the threshold setting signal 11 that is M. The threshold value of the transistors 514 and 517 that are on is Vthc1. In this situation, it is assumed that the threshold value Vthc1 is higher in the voltage than the output signal 8 and does not intersect with the output signal 8. In this case, the output signal 9 of the logical level converter 5 is fixed to high. As a result, the DC component 10 that is outputted by the low pass filter 52 becomes high, and the comparison result that is an inner signal of the comparator 53 becomes 1.

As a result, at a time t1, the comparator 53 outputs the threshold setting signal 11 of M−1 whose threshold value is made lower by one step to the threshold variable inverter 51. The threshold variable inverter 51 that has received the threshold setting signal 11 of M−1 newly turns on the switch 51B in addition to the switches 511 and 51A at the time t1. As a result, the threshold value changes from Vthc1 to Vthc2.

With the above operation, the threshold value Vthc2 is capable of intersecting with the output signal 8, and the output signal 9 of the logical level converter 5 becomes a clock signal whose amplitude is Vdd, that is, a clock signal of the logical level. In this case, the DC component 10 that is outputted from the low pass filter 52 becomes ½ Vdd, and the comparison result that is an inner signal of the comparator 53 becomes 0. As a result, the comparator 53 conducts the operation of holding the threshold setting signal 11 to M−1, and completes the operation of the logical level converter 5. When the threshold Vthc2 does not intersect with the output signal 8 even if the threshold value is changed, the threshold value is further changed. The change of the threshold value continues until the threshold value intersects with the output signal 8.

Now, a description will be given of a case in which the output signal 8 is higher in the voltage than the threshold value Vthc1, and the operation is reverse to that in the above case. As the initial setting, the threshold setting signal 11 is M. In the threshold variable inverter 51, the switches 511 and 51A turn on, and all of other switches turn off according to the threshold setting signal 11 that is M. The threshold value of the transistors 514 and 517 that are on is Vthc1. In this situation, the threshold value Vthc1 is lower in the voltage than the output signal 8 and does not intersect with the output signal 8. For that reason, the output signal 9 of the logical level converter 5 is fixed to low. As a result, the DC component 10 that is outputted by the low pass filter 52 becomes low, and the comparison result that is an inner signal of the comparator 53 becomes −1.

As a result, the comparator 53 outputs the threshold setting signal 11 of M+1 whose threshold value is made higher by one step to the threshold variable inverter 51. The threshold variable inverter 51 that has received the threshold setting signal 11 of M+1 newly turns on the switch 512 in addition to the switches 511 and 51A. As a result, the threshold value changes from Vthc1 to Vthc3.

With the above operation, the threshold value Vthc3 is capable of intersecting with the output signal 8, and the output signal 9 of the logical level converter 5 becomes a clock signal whose amplitude is Vdd, that is, a clock signal of the logical level. In this case, the DC component 10 that is outputted from the low pass filter 52 becomes ½ Vdd, and the comparison result that is an inner signal of the comparator 53 becomes 0.

As a result, the comparator 53 conducts the operation of holding the threshold setting signal 11 to M+1, and completes the operation of the logical level converter 5. As in the above case, when the threshold Vthc2 does not intersect with the output signal 8 even if the threshold value is changed, the threshold value is further changed. The change of the threshold value continues until the threshold value intersects with the output signal 8.

The logical level converter 5 according to this embodiment makes it possible to lower the amplitude of the output signal 8 of the VCO 4 with the higher oscillation frequency, and also to always output the clock signal whose amplitude is Vdd as the output signal 9.

The judgment circuit 56 and the threshold variable inverter 51 can be variously modified, respectively, and the use of those modified members makes it possible to realize various logical level converters 5 different in the structure.

Figure 8:
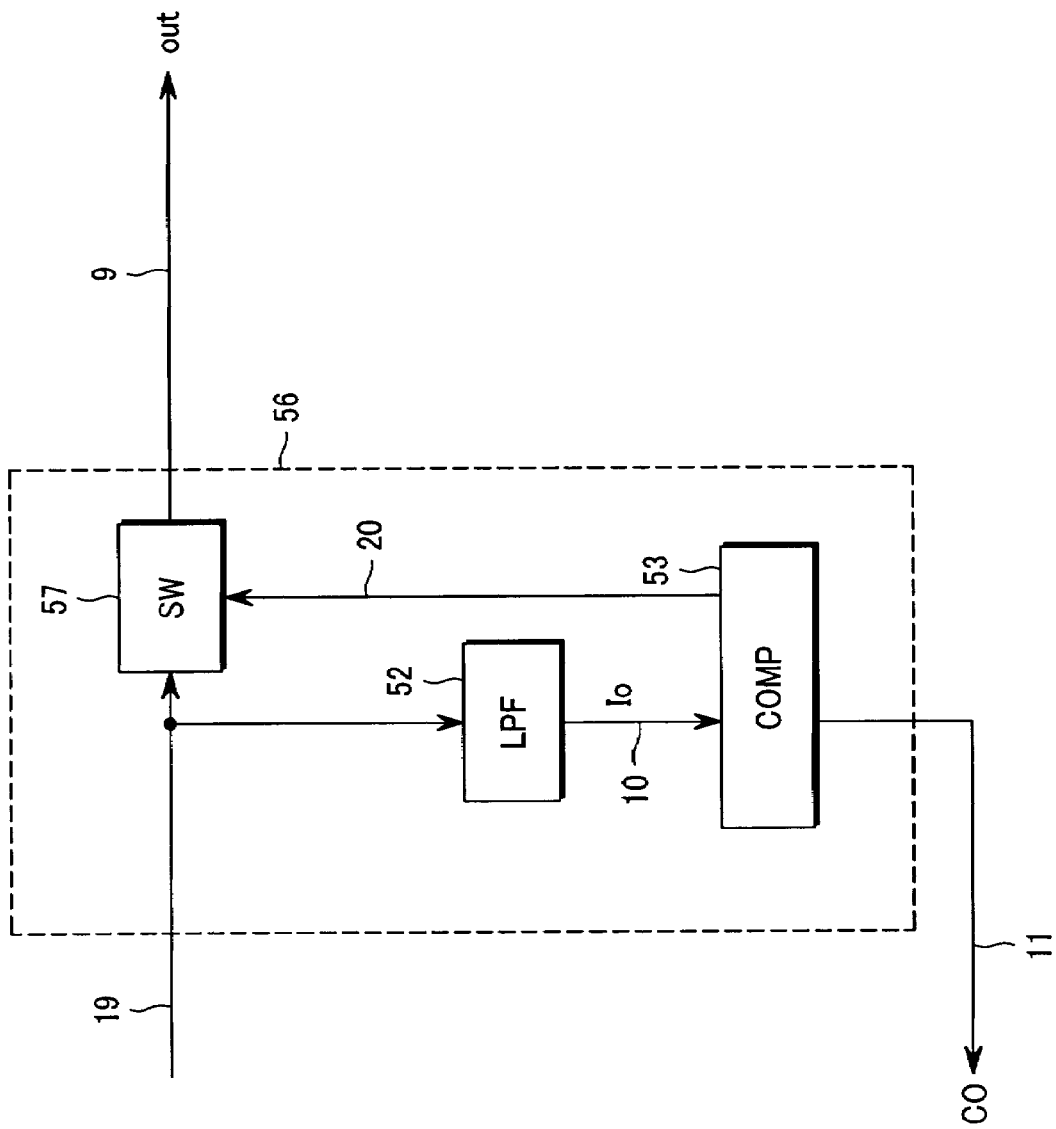
FIG. 8 is a block diagram for explaining an example of a second judgment circuit for use in the first logical level converter shown in FIG. 2.

FIG. 8 shows a second structural example of the judgment circuit 56. The second judgment circuit 56 includes a low pass filter (LPF) 52 that inputs the signal 19 and outputs a DC component (1o) 10 of the signal 19, and a comparator (COMP) 53 that inputs the DC component 10 and outputs the threshold setting signal 11 and an operation judgment signal 20 on the basis of a result compared with the comparison voltage. The second judgment circuit 56 also includes a switch (SW) 57 that inputs the signal 19 and the operation judgment signal 20 and outputs a signal 9 under the control according to the operation judgment signal 20.

Hereinafter, a description will be given of the operation of the logical level converter 5 using the second judgment circuit 56 shown in FIG. 8.

The output signal 8 of the VCO 4 is inputted to the logical level converter 5 at a certain time. The threshold setting signal 11 is M as initial setting. With this operation, in the threshold variable inverter 51 shown in FIG. 6, the switches 511 and 51A turn on, and all of other switches turn off. The threshold value of the transistors 514 and 517 that are on is Vthc1. Also, as the initial setting, the switch 57 is so controlled as to turn off according to the operation judgment signal 20. In this situation, it is assumed that the threshold value Vthc1 is higher in the voltage than the output signal 8 and does not intersect with the output signal 8. In this case, the output signal 19 of the threshold variable inverter 51 is fixed to high. As a result, the DC component 10 that is outputted by the low pass filter 52 becomes high, and the comparison result that is an inner signal of the comparator 53 becomes 1.

As a result, the comparator 53 outputs the threshold setting signal 11 of M−1 whose threshold value is made lower by one step to the threshold variable inverter 51. The threshold variable inverter 51 that has received the threshold setting signal 11 of M−1 newly turns on the switch 51B in addition to the switches 511 and 51A. As a result, the threshold value changes from Vthc1 to Vthc2.

With the above operation, the threshold value Vthc2 is capable of intersecting with the output signal 8, and the output signal 19 that is outputted by the threshold variable inverter 51 becomes Vdd in the amplitude. In this case, the DC component 10 that is outputted from the low pass filter 52 becomes ½ Vdd, and the comparison result that is an inner signal of the comparator 53 becomes 0. As a result, the comparator 53 conducts the operation of holding the threshold setting signal 11 to M−1. In addition, the comparator 53 outputs the operation judgment signal 20 that allows the switch 57 to turn on. The switch 57 that becomes in the on state outputs the signal 19 as the output signal 9, and then completes the operation of the logical level converter 5.

Now, a description will be given of a case in which the output signal 8 is higher in the voltage than the threshold value Vthc1, and the operation is reverse to that in the above case. The threshold setting signal 11 is M as initial setting. In the first threshold variable inverter 51, the switches 511 and 51A turn on, and all of other switches turn off according to the threshold setting signal that is M. The threshold value of the transistors 514 and 517 that are on is Vthc1. Also, as the initial setting, the switch 57 is so controlled as to turn off according to the operation judgment signal 20. In this situation, the threshold value Vthc1 is lower in the voltage than the output signal 8 and does not intersect with the output signal 8. In this case, the output signal 19 of the threshold variable inverter 51 is fixed to low. As a result, the DC component 10 that is outputted by the low pass filter 52 becomes low, and the comparison result that is an inner signal of the comparator 53 becomes −1.

As a result, the comparator 53 outputs the threshold setting signal 11 of M+1 whose threshold value is made higher by one step to the threshold variable inverter 51. The threshold variable inverter 51 that has received this threshold setting signal 11 newly turns on the switch 512 in addition to the switches 511 and 51A. As a result, the threshold value changes from Vthc1 to Vthc3.

With the above operation, the threshold value Vthc3 is capable of intersecting with the output signal 8, and the output signal 19 that is outputted by the threshold variable inverter 51 becomes Vdd in the amplitude. In this case, the DC component 10 that is outputted from the low pass filter 52 becomes ½ Vdd, and the comparison result that is an inner signal of the comparator 53 becomes 0. As a result, the comparator 53 conducts the operation of holding the threshold setting signal 11 to M+1. In addition, the comparator 53 outputs the operation judgment signal 20 that allows the switch 57 to turn on. The switch 57 that has turned on outputs the signal 19 as the output signal 9, and then completes the operation of the logical level converter 5.

In the second judgment circuit 56, the power on sequence of the logical circuit that inputs the output signal 9 is readily controlled because the signal that is fixed to high or the signal that is fixed to low in the above initial operation is not outputted as the output signal 9.

Figure 9:
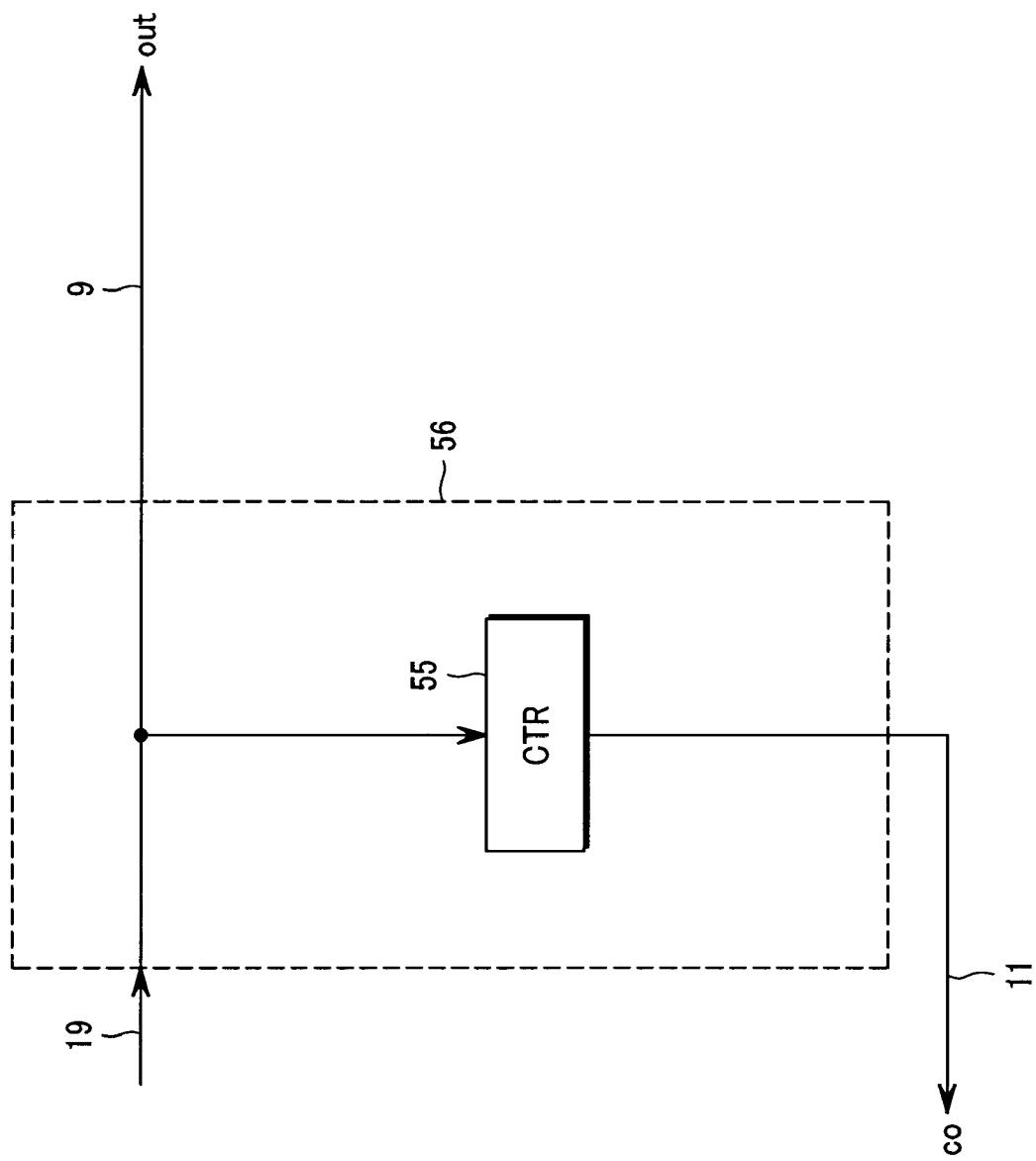
FIG. 9 is a block diagram for explaining an example of a third judgment circuit for use in the first logical level converter shown in FIG. 2.

FIG. 9 shows a third structural example of the judgment circuit 56. The third judgment circuit 56 shown in FIG. 9 outputs the signal 19 as the output signal 9. Also, the third judgment circuit 56 includes a counter (CTR) 55 that inputs the signal 19, counts up for a given period of time, and then outputs the threshold setting signal 11 on the basis of the count result. The counter 55 compares the count result with a desired count representative of a given state, and then changes the threshold setting signal 11 until an appropriate count result is obtained, and outputs the appropriate count result.

Now, a description will be given of the operation of the logical level converter 5 using the third judgment circuit 56 shown in FIG. 9.

The output signal 8 of the VCO 4 is inputted to the threshold variable inverter 51. The threshold setting signal 11 is M as initial setting. With this operation, in the threshold variable inverter 51 shown in FIG. 6, the switches 511 and 51A turn on, and all of other switches turn off. The threshold value of the transistors 514 and 517 that are on is Vthc1. In this situation, it is assumed that the threshold value Vthc1 is higher in the voltage than the output signal 8 and does not intersect with the output signal 8. In this case, the output signal 19 of the threshold variable inverter 51 is fixed to high. With the above operation, the signal 19 is inputted to the counter 55. The count result is smaller than the desired count because the output signal 19 is fixed to high.

The counter 55 first outputs the threshold setting signal 11 that makes the threshold value of the threshold variable inverter 51 higher by one step as the initial operation setting because count is conducted without discriminating between high and low of the output signal 19. In this case, the threshold setting signal 11 becomes M+1. The threshold variable inverter 51 that has received the threshold setting signal. 11 of M+1 newly turns on the switch 512 in addition to the switches 511 and 51A to make the threshold value higher by one step. Then, the threshold variable inverter 51 again processes the output signal 8, and outputs the signal 19. The signal 19 is inputted to the counter 55. The counter 55 counts up the output signal 9 for a given period of time, and compares the count result with a desired count. As a result of comparison, in the case where the count result is again smaller than the desired count, the counter 55 outputs the threshold setting signal 11 that makes the threshold value of the first threshold variable inverter 51 further higher by one step. In this situation, the threshold setting signal 11 is M+2.

In the case where an appropriate count result is not obtained even if the threshold variable inverter 51 sets the settable maximum threshold value, the threshold setting signal 11 is set to M−1. The threshold variable inverter 51 that has received the threshold setting signal 11 of M−1 newly turns on the switch 51B in addition to the switches 511 and 51A to make the threshold value lower by one step. The signal 19 is inputted to the counter 55. The counter 55 counts up the output signal 9 for a given period of time, and compares the count result with a desired count. In the case where the count result is again smaller than the desired count as a result of comparison, the counter 55 outputs the threshold setting signal 11 that makes the threshold value of the first threshold variable inverter 51 further lower by one step. In this situation, the threshold setting signal 11 is M−2.

The threshold value of the threshold variable inverter 51 is sequentially made lower in the above manner, and when an appropriate count result representative of the given state is obtained, the counter 55 completes the count operation, and holds the threshold setting signal 11 of that time. It is needless to say that when the appropriate count result is obtained at a stage where the threshold value is increased, the counter 55 completes the count operation at that time, and holds the threshold setting signal 11 of that time.

The above third judgment circuit 56 reduces the mounted area in the case where the circuit is integrated through the micro process because the circuit is structured by only the logical circuits, thereby making it possible to reduce the current consumption.

Figure 10:
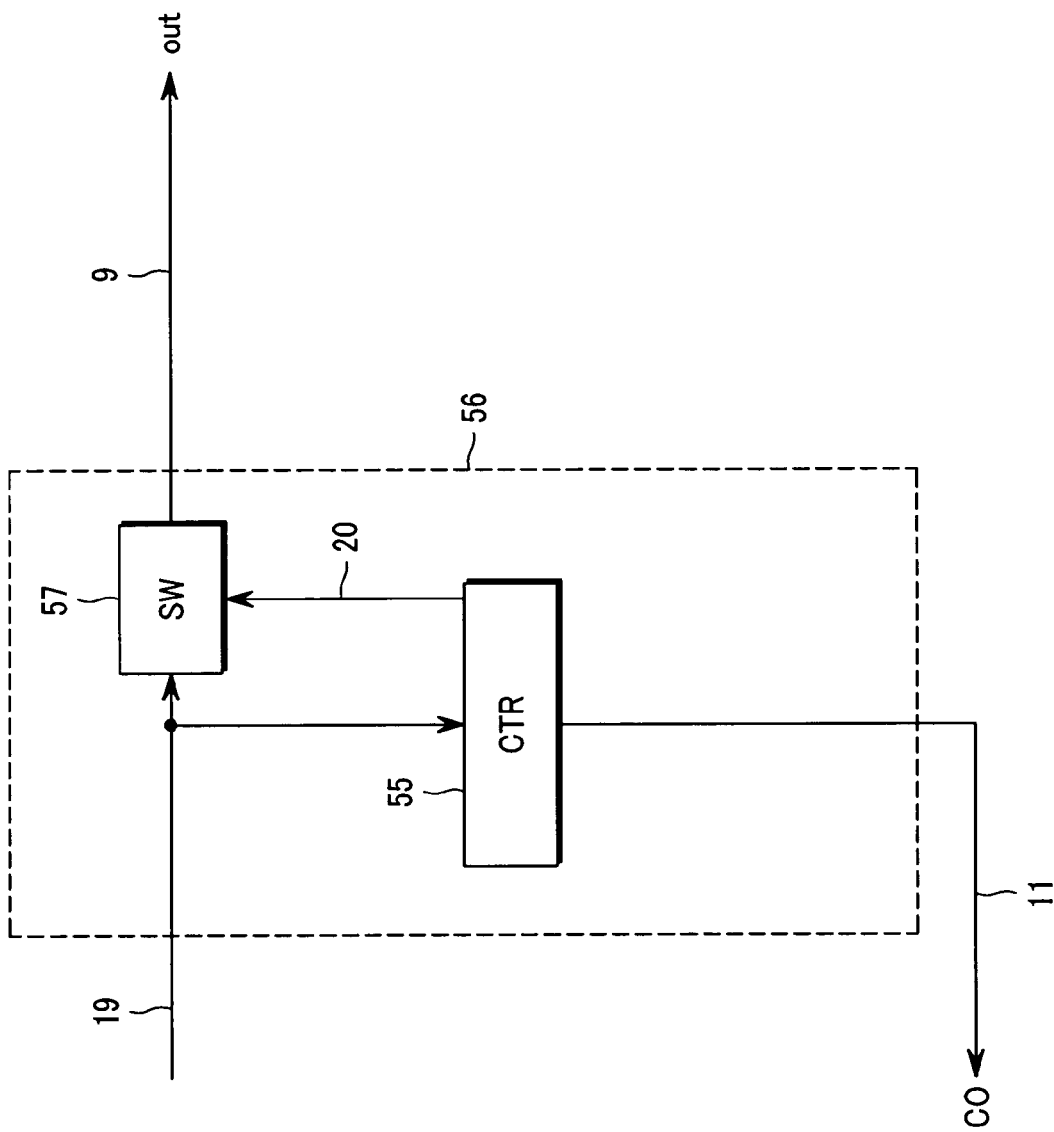
FIG. 10 is a block diagram for explaining an example of a fourth judgment circuit for use in the first logical level converter shown in FIG. 2.

FIG. 10 shows a fourth structural example of the judgment circuit 56. The fourth judgment circuit 56 shown in FIG. 10 includes a counter 55 that inputs the signal 19 and counts up the signal 19 for a given period of time, and then outputs the threshold setting signal 11 and the operation judgment signal 20 on the basis of the count result, and a switch 57 whose on/off operation is controlled according to the operation judgment signal 20 and which outputs the signal 19 as the output signal 9 when the switch 57 is on.

Now, a description will be given of the operation of the logical level converter 5 using the fourth judgment circuit 56 shown in FIG. 10.

The output signal 8 of the VCO 4 is inputted to the threshold variable inverter 51. The threshold setting signal 11 is M as initial setting. With this operation, in the threshold variable inverter 51 shown in FIG. 6, the switches 511 and 51A turn on, and all of other switches turn off. The threshold value of the transistors 514 and 517 that are on is Vthc1. Also, as the initial setting, the switch 57 is so controlled as to turn off according to the operation judgment signal 20. In this situation, it is assumed that the threshold value Vthc1 is higher in the voltage than the output signal 8 and does not intersect with the output signal 8. In this case, the output signal 19 of the threshold variable inverter 51 is fixed to high. The above process is conducted, and the signal 19 is inputted to the counter 55. The count result is smaller than the desired count because the output signal 19 is fixed to high.

The counter 55 first outputs the threshold setting signal 11 that makes the threshold value of the threshold variable inverter 51 higher by one step as the initial operation setting because the counter 55 counts up the signal 19 without discriminating between high and low of the output signal 19. In this case, the threshold setting signal 11 becomes M+1. The threshold variable inverter 51 that has received the threshold setting signal 11 of M+1 newly turns on the switch 512 in addition to the switches 511 and 51A to make the threshold value higher by one step. Then, the threshold variable inverter 51 again processes the output signal 8, and outputs the signal 19. The signal 19 is inputted to the counter 55. The counter 55 counts up the output signal 9 for a given period of time, and compares the count result with a desired count. As a result of comparison, in the case where the count result is again smaller than the desired count, the counter 55 outputs the threshold setting signal 11 that makes the threshold value of the first threshold variable inverter 51 further higher by one step. In this situation, the threshold setting signal 11 is M+2.

In the case where an appropriate count result is not obtained even if the threshold variable inverter 51 sets the settable maximum threshold value, the threshold setting signal 11 is set to M−1. The threshold variable inverter 51 that has received the threshold setting signal 11 of M−1 newly turns on the switch 51B in addition to the switches 511 and 51A to make the threshold value lower by one step. The threshold variable inverter 51 again processes the output signal 8 and then outputs the signal 19. The signal 19 is inputted to the counter 55. The counter 55 counts up the output signal 9 for a given period of time, and compares the count result with a desired count. In the case where the count result is again smaller than the desired count as a result of comparison, the counter 55 outputs the threshold setting signal 11 that makes the threshold value of the first threshold variable inverter 51 further lower by one step. In this situation, the threshold setting signal 11 is M−2.

The threshold value of the threshold variable inverter 51 is sequentially made lower in the above manner, and when an appropriate count result representative of the given state is obtained, the counter 55 completes the count operation, and holds the threshold setting signal 11 of that time. It is needless to say that when the appropriate count result is obtained at a stage where the threshold value is increased, the counter 55 completes the count operation at that time, and holds the threshold setting signal 11 of that time. The counter 55 outputs the operation judgment signal 20 that turns on the switch 57 at the time where the counter 55 completes the count operation by obtaining the appropriate count result. The switch 57 that has turned on outputs the signal 19 as the output signal 9, and completes the operation of the logical level converter 5.

In the above fourth judgment circuit 56, the power on sequence of the logical circuit that inputs the output signal 9 is readily controlled because the signal that is fixed to high or the signal that is fixed to low in the above initial operation is not outputted as the output signal 9. In addition, the fourth judgment circuit 56 reduces the mounted area in the case where the circuit is integrated through the micro process because the circuit is structured by only the logical circuits, thereby making it possible to reduce the current consumption.

Figure 11:
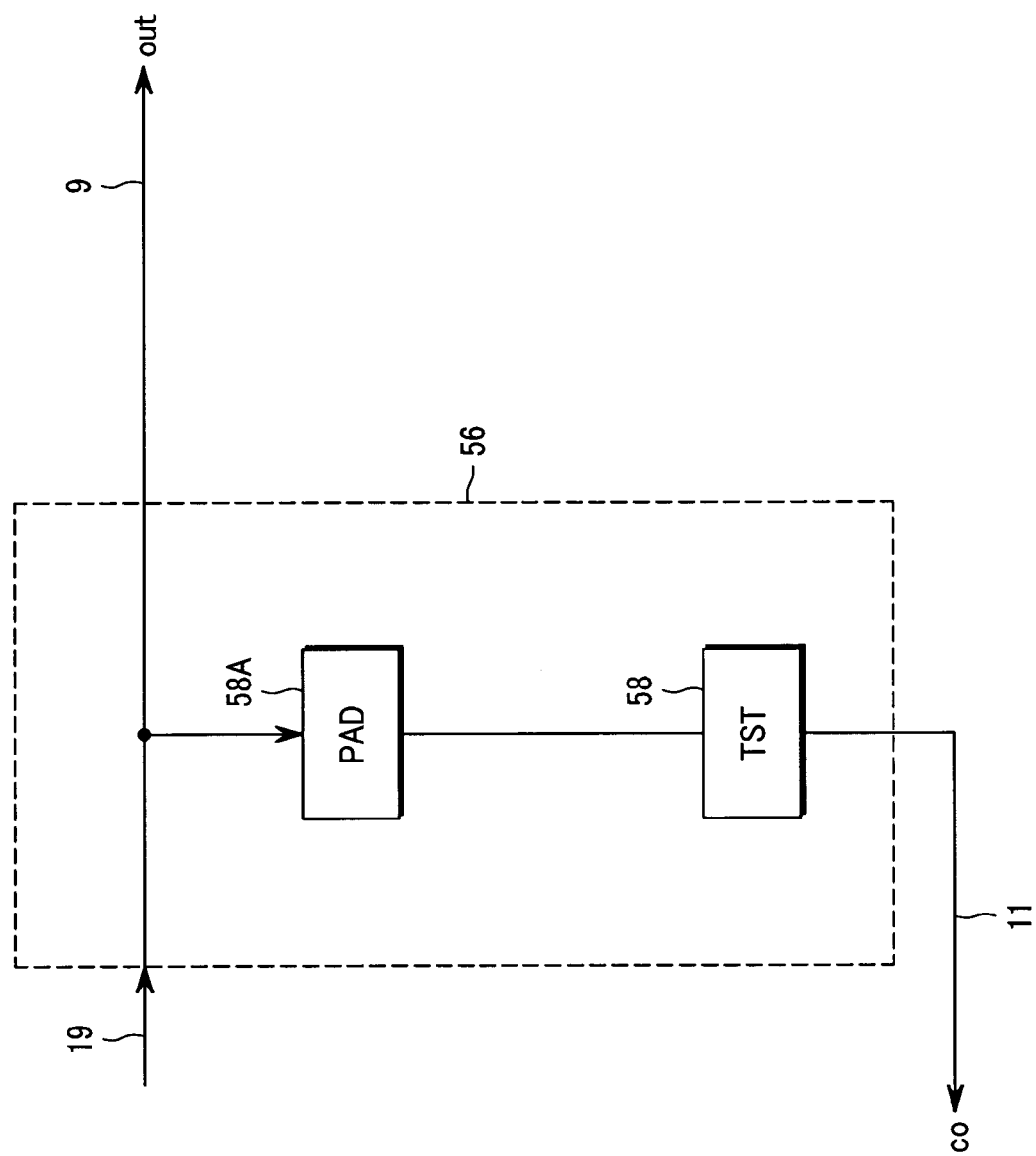
FIG. 11 is a block diagram for explaining an example of a fifth judgment circuit for use in the first logical level converter shown in FIG. 2.

FIG. 11 shows a fifth structural example of the judgment circuit 56. The fifth judgment circuit 56 shown in FIG. 11 outputs the signal 19 as the output signal 9. Also, the fifth judgment circuit 56 includes a pad 58A that measures the output signal 9 outside of a chip and outputs a setting signal to a tester 58 on the basis of the measurement result, and the tester (TST) 58 that inputs the setting signal and outputs the threshold setting signal 11.

Hereinafter, the operation of the fifth judgment circuit 56 will be described. The output signal 9 is measured by the pad 58A outside of the chip. In the case where the measurement result is a high fixed signal, the setting signal is outputted to the tester 58 from the pad 58A so that the threshold value of the threshold variable inverter 51 is made lower by one step. The tester 58 that has received the setting signal sets the threshold setting signal 11 that makes the threshold value of the threshold variable inverter 51 lower by one step. After the threshold setting signal 11 has been set, the output signal 9 is again measured outside of the chip. In this manner, the threshold setting signal 11 is set such that the output signal 9 becomes an appropriate signal best duty within a range where the threshold value of the threshold variable inverter 51 can be set, that is, the output signal 9 becomes the given state. In the present specification, the "duty" expresses a rate of a section in which the signal is high with respect to a section of one cycle of the signal by percentage.

Figure 12:
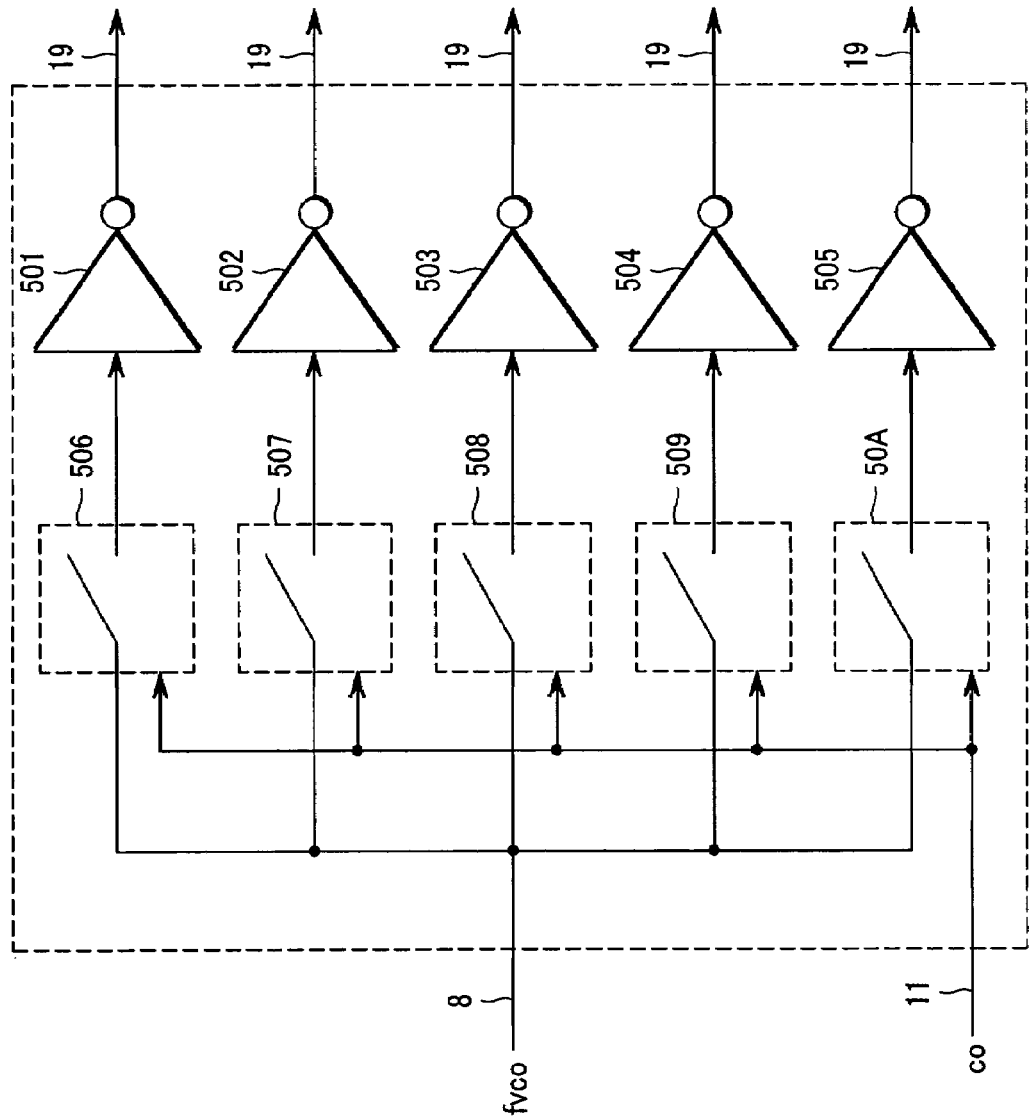
FIG. 12 is a block diagram for explaining an example of a second threshold variable inverter for use in the logical level converter shown in FIG. 2.

FIG. 12 shows a second structural example of the threshold variable inverter 51 shown in FIG. 2, which inputs the output signal 8 and the threshold setting signal 11 and outputs the signal 19. The second threshold variable inverter 51 includes inverters 501, 502, 503, 504, and 505, and switches 506, 507, 508, 509, and 50A which are interposed between the output signal 8 and the inverters 501, 502, 503, 504, and 505, and controlled according to the threshold setting signal 11.

The second threshold variable inverter 51 inputs the output signal 8 and the threshold setting signal 11, and outputs the output signals of the inverters 501, 502, 503, 504, and 505 as the signals 19, respectively. The inverters 501, 502, 503, 504, and 505 are set so that the respective threshold values are different from each other.

Now, a description will be given of the operation of the logical level converter 5 shown in FIG. 2, which uses the second threshold variable inverter 51 shown in FIG. 12 and the first judgment circuit 56 shown in FIG. 3.

The output signal 8 is inputted to the logical level converter 5 at a time t0. The threshold setting signal 11 is M as initial setting. With the above operation, in the second threshold variable inverter 51, the switch 508 turns on, and all of other switches turn off. In this situation, it is assumed that the threshold value of the inverter 503 that is connected to the switch 508 is higher in the voltage than the output signal 8 and does not intersect with the output signal 8. In this case, the output signal 9 is fixed to high. As a result, the DC component 10 that is outputted by the low pass filter 52 becomes high, and the comparison result that is an inner signal of the comparator 53 becomes 1.

As a result, the comparator 53 outputs the threshold setting signal 11 of M−1 whose threshold value is made lower by one step to the threshold variable inverter 51. The second threshold variable inverter 51 that has received the threshold setting signal 11 of M−1 turns off the switch 508 and turns on the switch 509.

With the above operation, the threshold value of the inverter 504 that is connected to the switch 509 is capable of intersecting with the output signal 8, and the output signal 9 of the logical level converter 5 becomes a clock signal of the logical level whose amplitude is Vdd. In this case, the DC component 10 that is outputted from the low pass filter 52 becomes ½ Vdd, and the comparison result that is an inner signal of the comparator 53 becomes 0. As a result, the comparator 53 conducts the operation of holding the threshold setting signal 11 to M−1, and completes the operation of the logical level converter 5.

Now, a description will be given of a case in which the output signal 8 is higher in the voltage than the threshold value of the inverter 503, and the operation is reverse to that in the above case. The threshold setting signal is M as initial setting. In the second threshold variable inverter 51, the switch 503 turns on, and all of other switches turn off according to the threshold setting signal that is M. The threshold value of the inverter 503 is lower in the voltage than the output signal 8 and does not intersect with the output signal 8. For that reason, the signal 19 is fixed to low. As a result, the DC component 10 that is outputted by the low pass filter 52 becomes low, and the comparison result that is an inner signal of the comparator 53 becomes −1.

As a result, the comparator 53 outputs the threshold setting signal 11 of M+1 that makes the threshold value lower by one step to the threshold variable inverter 51. The second threshold variable inverter 51 that has received the threshold setting signal 11 of M+1 turns off the switch 508 and turns on the switch 507. With the above operation, the threshold value of the inverter 502 that is connected to the switch 507 is capable of intersecting with the output signal 8, and the output signal 9 of the logical level converter 5 becomes a clock signal of the logical level whose amplitude is Vdd. In this case, the DC component 10 that is outputted from the low pass filter 52 becomes ½ Vdd, and the comparison result that is an inner signal of the comparator 53 becomes 0. As a result, the comparator 53 conducts the operation of holding the threshold setting signal 11 to M+1, and completes the operation of the logical level converter 5.

Now, a description will be given of the operation of the logical level converter 5 shown in FIG. 2, which uses the second threshold variable inverter 51 shown in FIG. 12 and the second judgment circuit 56 shown in FIG. 8.

The output signal 8 is inputted to the logical level converter 5 at a certain time. The threshold setting signal 11 is M as initial setting, and the switch 57 is also so controlled as to turn off according to the operation judgment signal 20. In this state, in the second threshold variable inverter 51, the switch 508 turns on, and all of other switches turn off. In this situation, it is assumed that the threshold value of the inverter 503 is higher in the voltage than the output signal 8 and does not intersect with the output signal 8. In this case, the output signal 19 of the second threshold variable inverter 51 is fixed to high. As a result, the DC component 10 that is outputted by the low pass filter 52 becomes high, and the comparison result that is an inner signal of the comparator 53 becomes 1.

As a result, the comparator 53 outputs the threshold setting signal 11 of M−1 that makes threshold value lower by one step to the threshold variable inverter 51. The second threshold variable inverter 51 that has received the threshold setting signal 11 of M−1 turns off the switch 508 and turns on the switch 509.

With the above operation, the threshold value of the inverter 504 that is connected to the switch 509 is capable of intersecting with the output signal 8, and the output signal 9 of the logical level converter 5 becomes a clock signal of the logical level whose amplitude is Vdd. In this case, the DC component 10 that is outputted from the low pass filter 52 becomes ½ Vdd, and the comparison result that is an inner signal of the comparator 53 becomes 0. As a result, the comparator 53 conducts the operation of holding the threshold setting signal 11 to M−1. Furthermore, the comparator 53 outputs the operation judgment signal 20 that turns on the switch 57. The switch 57 that has turned on outputs the signal 19 as the output signal 9, and completes the operation of the logical level converter 5.

Now, a description will be given of a case in which the threshold value of the inverter 503 is lower in the voltage than the output signal 8, and the operation is reverse to that in the above case. The threshold setting signal 11 is M as initial setting, and the switch 57 is also so controlled as to turn off according to the operation judgment signal 20. In this state, in the second threshold variable inverter 51, the switch 508 turns on, and all of other switches turn off. In this situation, the threshold value of the inverter 503 is lower in the voltage than the output signal 8 and does not intersect with the output signal 8. For that reason, the output signal 19 is fixed to low. As a result, the DC component 10 that is outputted by the low pass filter 52 becomes low, and the comparison result that is an inner signal of the comparator 53 becomes −1.

As a result, the comparator 53 outputs the threshold setting signal 11 of M+1 that makes threshold value higher by one step to the threshold variable inverter 51. The second threshold variable inverter 51 that has received the threshold setting signal 11 turns off the switch 508 and turns on the switch 507. As a result, the threshold value of the inverter 504 is capable of intersecting with the output signal 8, and the output signal 19 that is outputted by the second threshold variable inverter 51 becomes Vdd in the amplitude. In this case, the DC component 10 that is outputted from the low pass filter 52 becomes ½ Vdd, and the comparison result that is an inner signal of the comparator 53 becomes 0. As a result, the comparator 53 conducts the operation of holding the threshold setting signal 11 to M+1. Furthermore, the comparator 53 outputs the operation judgment signal 20 that turns on the switch 57. The switch 57 that has turned on outputs the signal 19 as the output signal 9, and completes the operation of the logical level converter 5.

Now, a description will be given below of the second operation of the logical level converter 5 shown in FIG. 2, which uses the second threshold variable inverter 51 shown in FIG. 12 and the second judgment circuit 56 shown in FIG. 9.

The output signal 8 of the VCO 4 is inputted to the logical level converter 5 at a certain time. As the initial setting, all of the switches 506, 507, 508, 509, and 50A turn on. Also, as the initial setting, the switch 57 is also so controlled as to turn off according to the operation judgment signal 20. In this state, the inverters 501, 502, 503, 504, and 505 that have inputted the output signal 8 output the signals 19, respectively. The low pass filter 52 that has inputted all of the output signals 19 outputs the DC components 10 of the respective output signals 19. The comparator 53 compares the respective DC components 10 with the comparison voltage, and outputs the threshold setting signal 11 that controls so as to select only the inverters whose comparison result is 0 and not to operate other inverters. In addition, the comparator 53 outputs the operation judgment signal 20 that turns on the switch 57, and completes the operation of the logical level converter 5.

Now, a description will be given below of the operation of the logical level converter 5 shown in FIG. 2, which uses the second threshold variable inverter 51 shown in FIG. 12 and the second judgment circuit 56 shown in FIG. 9.

The output signal 8 of the VCO 4 is inputted to the second threshold variable inverter 51. The threshold setting signal 11 is M as initial setting. With this operation, in the second threshold variable inverter 51, the switch 508 turns on, and all of other switches turn off. In this situation, it is assumed that the threshold value of the inverter 503 that is connected to the switch 508 is higher in the voltage than the output signal 8 and does not intersect with the output signal 8. In this case, the output signal 19 that is outputted from the second threshold variable inverter 51 is fixed to high. The signal 19 that has been subjected to the above processing is inputted to the counter 55. The count result is smaller than the desired count because the output signal 19 is fixed to high.

The counter 55 first outputs the threshold setting signal 11 that makes the threshold value of the second threshold variable inverter 51 higher by one step as the initial operation setting because count is conducted without discriminating between high and low of the output signal 19. In this case, the threshold setting signal 11 becomes M+1. The second threshold variable inverter 51 that has received the threshold setting signal 11 of M+1 turns off the switch 508 and turns on the switch 507. The second threshold variable inverter 51 again processes the output signal 8 in this manner, and outputs the signal 19. The signal 19 is inputted to the counter 55. The counter 55 counts up the output signal 19 for a given period of time, and compares the count result with a desired count. As a result of comparison, in the case where the count result is again smaller than the desired count, the counter 55 outputs the threshold setting signal 11 so as to make the threshold value of the first threshold variable inverter 51 further higher by one step. In this situation, the threshold setting signal 11 is M+2. The second threshold variable inverter 51 that has received the threshold setting signal of M+2 turns off the switch 507 and turns on the switch 506.

In the case where an appropriate count result is not obtained even if the second threshold variable inverter 51 sets the settable maximum threshold value, the threshold setting signal 11 is then set to M−1. The second threshold variable inverter 51 that has received the threshold setting signal of M−1 turns off the switch 506 and turns on the signal 509. The second threshold variable inverter 51 again processes the output signal 8 in the above manner, and outputs the signal 19. The signal 19 is inputted to the counter 55. The counter 55 counts up the signal 19 for a given period of time, and compares the count result with a desired count. In the case where the count result is again smaller than the desired count as a result of comparison, the counter 55 outputs the threshold setting signal 11 that makes the threshold value of the first threshold variable inverter 51 further lower by one step. In this situation, the threshold setting signal 11 is M−2.

The threshold value of the threshold variable inverter 51 is sequentially made lower in the above manner, and when an appropriate count result is obtained, the counter 55 completes the count operation, and holds the threshold setting signal 11 of that time. When the appropriate count result is obtained at a stage where the threshold value is increased, the counter 55 completes the count operation at that time, and holds the threshold setting signal 11 of that time.

Now, a description will be given of the operation of the logical level converter 5 shown in FIG. 2, which uses the second threshold variable inverter 51 shown in FIG. 12 and the fourth judgment circuit 56 shown in FIG. 10.

The output signal 8 of the VCO 4 is inputted to the second threshold variable inverter 51. The threshold setting signal 11 is M as initial setting. With this operation, in the second threshold variable inverter 51 shown in FIG. 12, the switch 508 turns on, and all of other switches turn off. Also, the switch 57 is also so controlled as to turn off the switch 57 according to the operation judgment signal 20 as the initial setting. In this situation, it is assumed that the threshold value of the inverter 503 that is connected to the switch 508 is higher in the voltage than the output signal 8 and does not intersect with the output signal 8. In this case, the output signal 19 of the second threshold variable inverter 51 is fixed to high. The signal 19 that has been subjected to the above processing is inputted to the counter 55. The count result is smaller than the desired count because the output signal 19 is fixed to high.

The counter 55 first outputs the threshold setting signal 11 that makes the threshold value of the threshold variable inverter 51 higher by one step as the initial operation setting because count is conducted without discriminating between high and low of the output signal 19. In this case, the threshold setting signal 11 becomes M+1. The second threshold variable inverter 51 that has received the threshold setting signal 11 of M+1 turns off the switch 508 and turns on the switch 507. The second threshold variable inverter 51 again processes the output signal 8 in this manner, and outputs the signal 19. The signal 19 is inputted to the counter 55. The counter 55 counts up the output signal 19 for a given period of time, and compares the count result with a desired count. As a result of comparison, in the case where the count result is again smaller than the desired count, the counter 55 outputs the threshold setting signal 11 so as to make the threshold value of the second threshold variable inverter 51 further higher by one step. In this situation, the threshold setting signal 11 is M+2. The second threshold variable inverter 51 that has received the threshold setting signal of M+2 turns off the switch 507 and turns on the switch 506.

In the case where an appropriate count result is not obtained even if the second threshold variable inverter 51 sets the settable maximum threshold value, the threshold setting signal 11 is then set to M−1. The second threshold variable inverter 51 that has received the threshold setting signal of M−1 turns off the switch 506 and turns on the signal 509. The second threshold variable inverter 51 again processes the output signal 8 in the above manner, and outputs the signal 19. The signal 19 is inputted to the counter 55. The counter 55 counts up the signal 19 for a given period of time, and compares the count result with a desired count. In the case where the count result is again smaller than the desired count as a result of comparison, the counter 55 outputs the threshold setting signal 11 that makes the threshold value of the second threshold variable inverter 51 further lower by one step. In this situation, the threshold setting signal 11 is M−2.

The threshold value of the threshold variable inverter 51 is sequentially made lower in the above manner, and when an appropriate count result is obtained, the counter 55 completes the count operation, and holds the threshold setting signal 11 of that time. When the appropriate count result is obtained whereby the counter 55 completes the count operation, the counter 55 turns on the switch 57 and outputs the operation judgment signal 20. The switch 57 that has turned on outputs the signal 19 as the output signal 9, and completes the operation of the logical level converter 5.

Now, a description will be given below of the second operation of the logical level converter 5 shown in FIG. 2, which uses the second threshold variable inverter 51 shown in FIG. 12 and the fourth judgment circuit 56 shown in FIG. 10.

The output signal 8 is inputted to the logical level converter 5 at a certain time. As the initial setting, all of the switches 506, 507, 508, 509, and 50A turn on. Also, as the initial setting, the switch 57 is also so controlled as to turn off according to the operation judgment signal 20. In this state, the inverters 501, 502, 503, 504, and 505 that have inputted the output signal 8 output the signals 19, respectively. The counter 55 that has inputted all of the output signals 19 counts up the signal 19 for a given period of time, and compares the count result with the desired count. The counter 55 outputs the threshold setting signal 11 that controls so as to select only the inverters whose comparison results are optimum and not to operate other inverters. In addition, the counter 55 outputs the operation judgment signal 20 that turns on the switch 57, and completes the operation of the logical level converter 5.

Now, a description will be given below of the operation of the logical level converter 5 shown in FIG. 2, which uses the second threshold variable inverter 51 shown in FIG. 12 and the fifth judgment circuit 56 shown in FIG. 11.

In the second threshold variable inverter 51, as the initial setting, the switch 508 is on, and all of other switches are off. In this situation, the output signal 9 is measured by the pad 58A outside of the chip. In the case where the measurement result is a high fixed signal, the setting signal is outputted to the tester 58 from the pad 58A outside of the chip so that the threshold value of the second threshold variable inverter 51 is made lower by one step. The tester 58 that has received the setting signal sets the threshold setting signal 11 that makes the threshold value of the second threshold variable inverter 51 lower by one step. After the threshold setting signal 11 has been set, the output signal 9 is again measured outside of the chip. In this manner, the threshold setting signal 11 is set such that the output signal 9 becomes an appropriate signal best in the duty within a range where the threshold value of the threshold variable inverter 51 can be set.

In the above-described respective logical level converters, the mounted area can be small-scaled, and the circuit can operate with the low current consumption at the input frequencies in a wide range from the low frequency to the high frequency. For that reason, it is possible to mount the logical level converter on the large scaled integrated circuit. Also, since the above logical level converter also conducts the duty correction operation, the phase locked loop with the above logical level converter is capable of outputting the signal that maintains the duty of 50% with respect to the input frequencies in a wide range from the low frequency to the high frequency.

Second Embodiment

Figure 13:
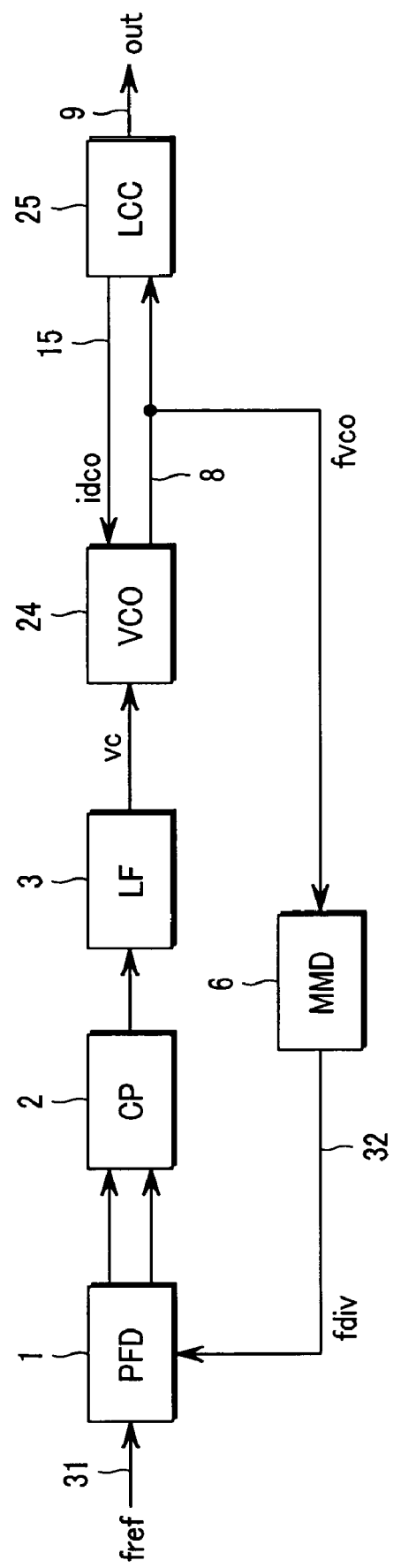
FIG. 13 is a block diagram for explaining a logical level converter and a phase locked loop using the logical level converter according to a second embodiment of the present invention.

FIG. 13 shows a second embodiment of the present invention. As shown in FIG. 13, the phase locked loop according to this embodiment includes a phase frequency detector 1, a charge pump 2, a loop filter 3, and a VCO 24 that receives a DC voltage adjustment signal (idco) 15 and adjusts the DC level of an output signal (fvco) 8. The phase locked loop also includes a logical level converter 25 that outputs the DC voltage adjustment signal 15 and converts the output signal 8 into an output signal 9 that can be accurately recognized by a next stage logical circuit (not shown), and a frequency divider 6 that divides the output frequency of the VCO 24.

Since the phase locked loop according to this embodiment conducts the same operation as that of the phase locked loop in the first embodiment, and therefore its description will be omitted.

Figure 14:
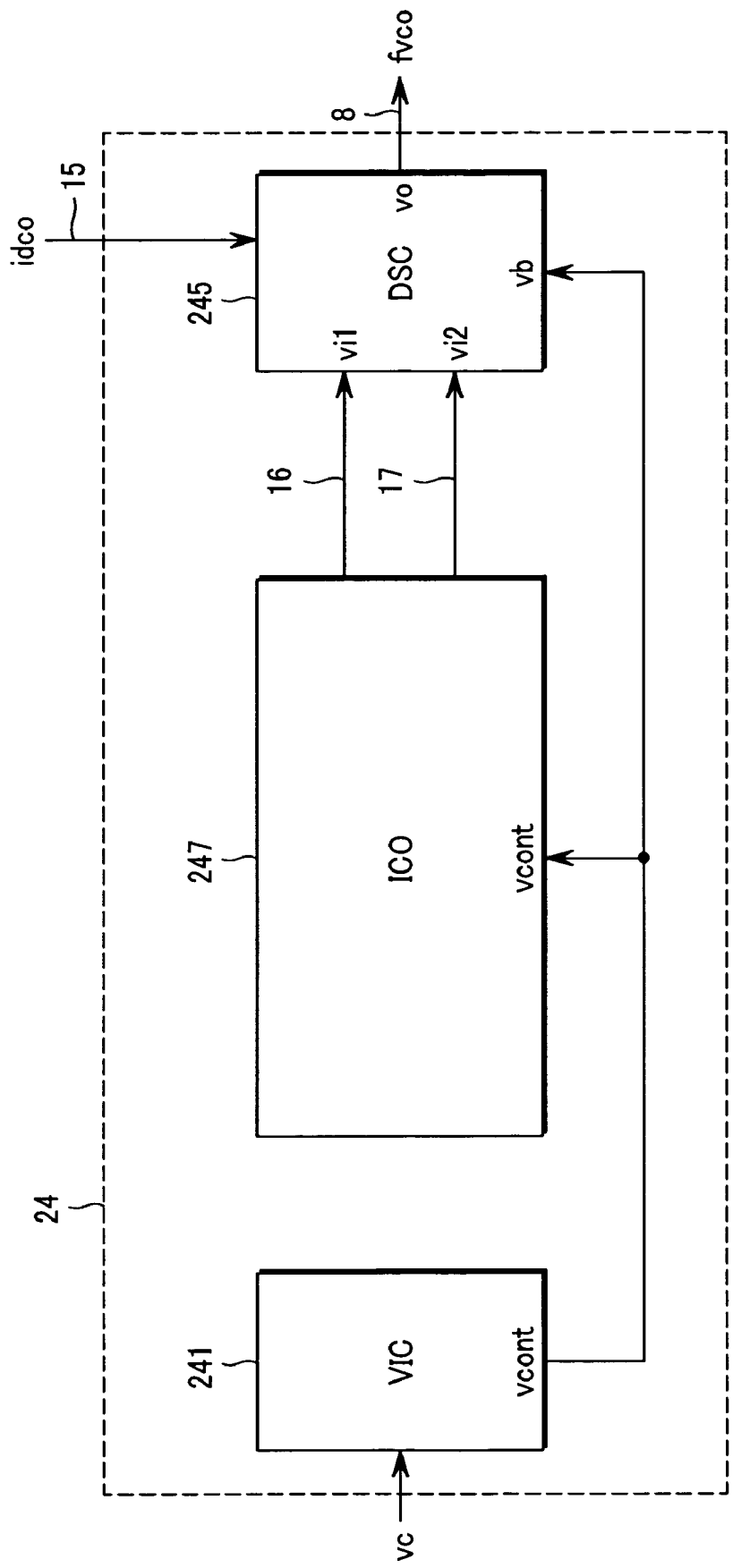
FIG. 14 is a block diagram for explaining an example of a VCO for use in the phase locked loop shown in FIG. 13.

FIG. 14 shows a structural example of the VCO 24. The VCO 24 inputs a control voltage vc and a DC voltage adjustment signal 15, and outputs an output signal 8. The VCO 24 includes a voltage to current converter circuit 241 that converts the control voltage vc into a current, a current control oscillator 247 that adjusts the amount of delay according to the current that has been generated by the voltage to current converter circuit 241, and a differential-to-single converter circuit 245 that inputs differential output signals 16 and 17 of the current control oscillator 247 and the DC voltage adjustment signal 15, and converts the differential output signals 16 and 17 of the current control oscillator 247 into a single signal. The differential-to-single converter circuit 245 adjusts the DC component according to the DC voltage adjustment signal 15, and outputs the single signal as the output signal 8.

Figure 15:
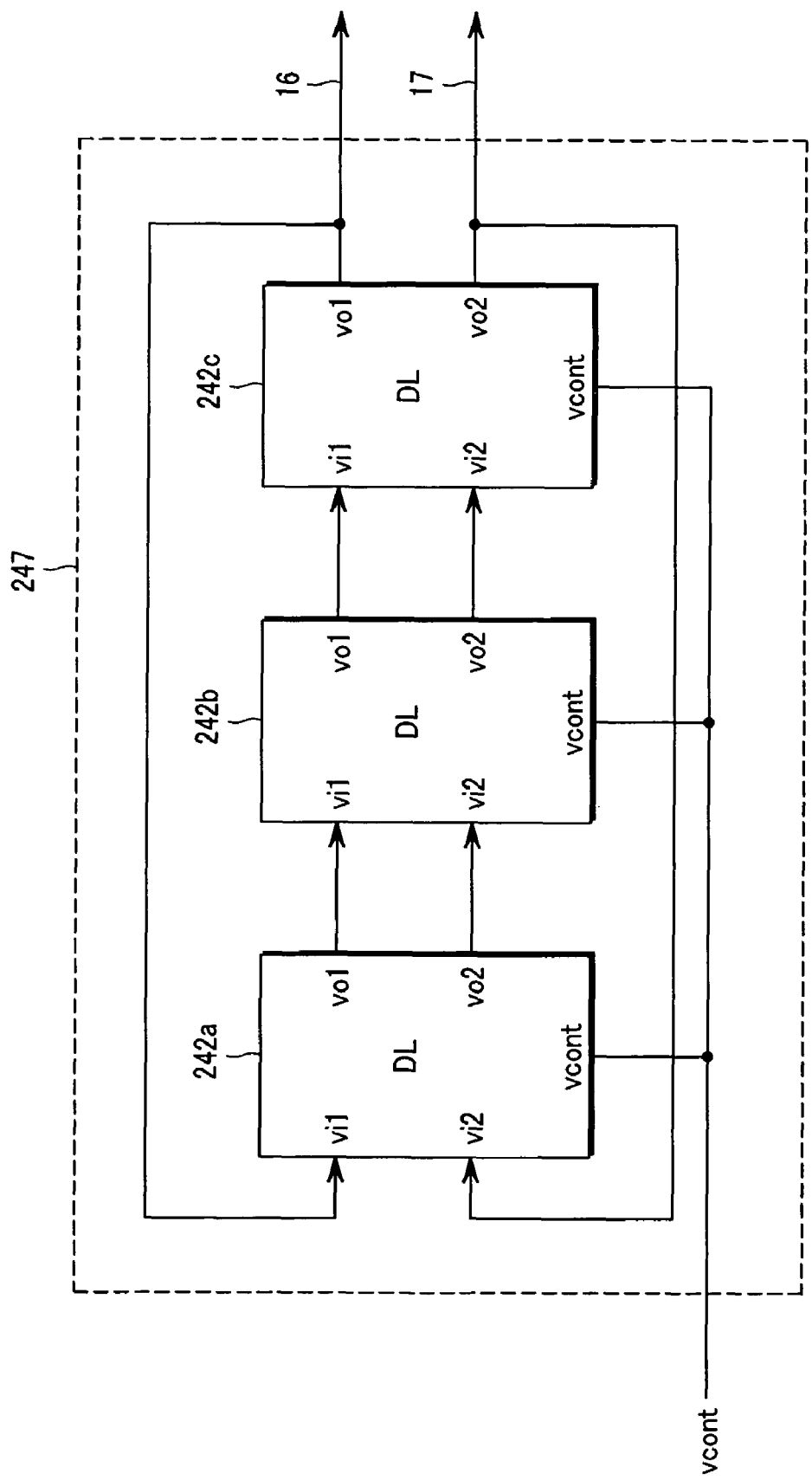
FIG. 15 is a circuit diagram for explaining an example of a current control oscillator for use in a VCO shown in FIG. 14.

FIG. 15 shows a structural example of the current control oscillator 247. The current control oscillator 247 is structured in such a manner that delay circuits 242 that adjust the amount of delay according to the driving current are connected in the form of a ring. Referring to FIG. 15, the current control oscillator 247 is structured in such a manner that the delay circuits 242 are connected at odd states (three stages).

FIG. 16 shows a structural example of the differential-to-single converter circuit 245. The differential-to-single converter circuit 245 is made up of a transistor 2451 that generates a driving current according to a bias signal vb, transistors 2452 and 2453 that receive the differential signals (vi1) 16 and (vi2), and load transistors 2454 and 2455. At a point A, the output signal 8 is adjusted to the DC level by the DC voltage adjustment signal 15 and then outputted to the logical level converter 25.

The structures of the VCO 24, the voltage to current converter circuit 241, the current control oscillator 247, and the differential-to-single converter circuit 245 may be different from the above-mentioned means if the structure inputs the control voltage vc and obtains a desired oscillation frequency by the output signal 8.

Figure 17A:
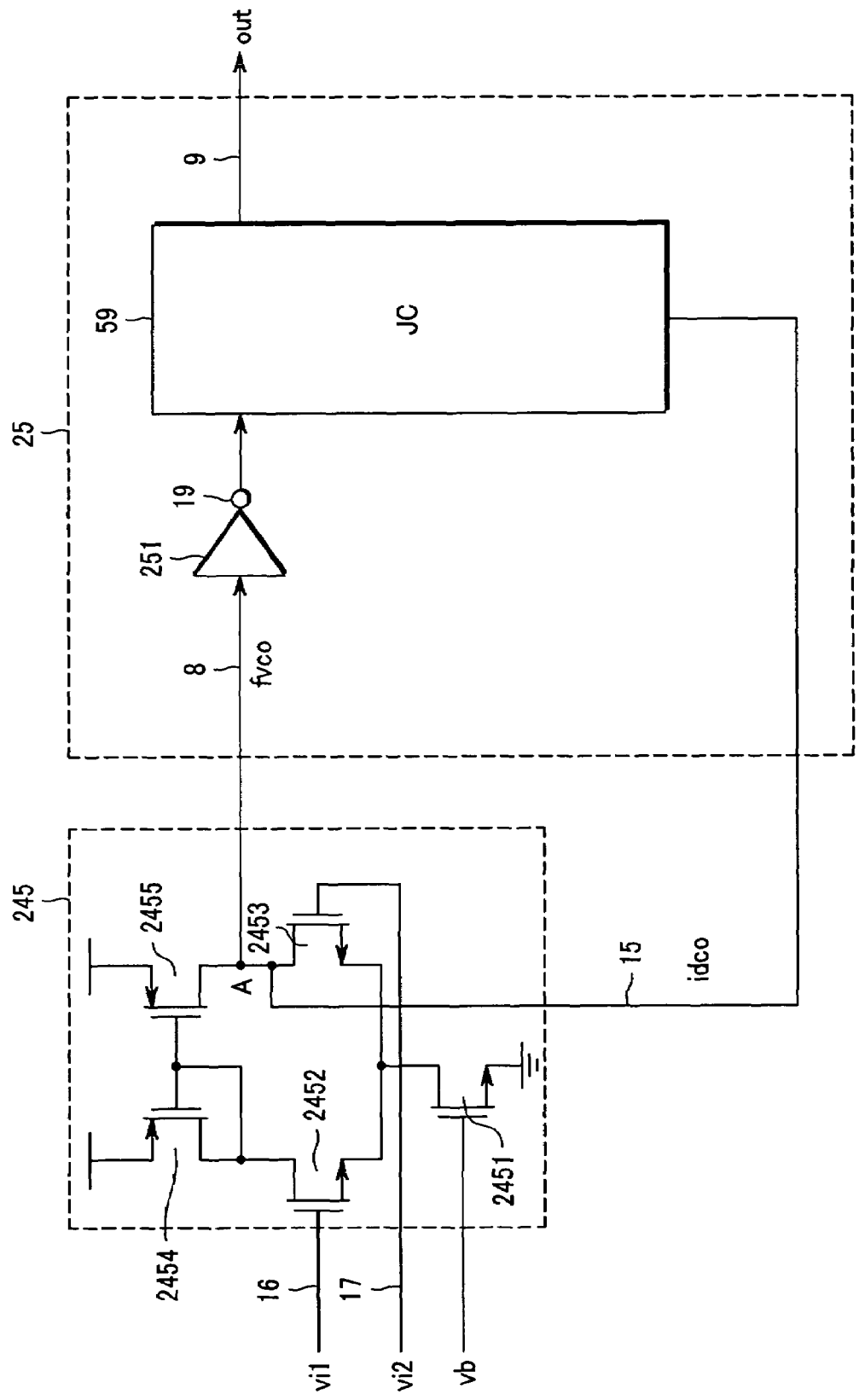
FIG. 17A is a block diagram for explaining an example of a logical level converter for use in the phase locked loop shown in FIG. 13, which is connected to the differential-to-single converter circuit shown in FIG. 16.

FIG. 17A shows a connection structural example of the differential-to-single converter circuit 245 and the logical level converter 25, and the operation of the differential-to-single converter circuit 245 and the logical level converter 25 will be described below. The logical level converter 25 includes an inverter 251 that inputs the output signal 8 of the VCO 24 which is an output signal of the differential-to-single converter circuit 245 and outputs the signal 19, and a judgment circuit (JC) 59 that inputs the signal 19 and judges the signal 19, and outputs the output signal 9 and the DC voltage adjustment signal 15 on the basis of the judgment result. The DC voltage adjustment signal 15 is supplied to the point A of the differential-to-single converter circuit 245.

Since the differential-to-single converter circuit 245 and the logical level converter 25 are connected by one wire at the input and output, the point A may exist at the input side of the logical level converter 25. In this case, the DC voltage adjustment signal 15 is supplied to the point A within the logical level converter 25 to adjust the DC level of the output signal 8 that is given to the inverter 251. This arrangement may be replaced with an arrangement in which as shown in FIG. 7B, an adder 252 is disposed at the point A within the logical level converter 245, and the adder 252 adds the DC voltage adjustment signal 15 to the output signal of the differential-to-single converter circuit 245. It is possible that the adder 252 adds a current to adjust the DC level as well as adds a voltage to adjust the DC level with the DC voltage adjustment signal 15 as a voltage signal. The following description will be given with reference to FIG. 17A.

FIG. 18 shows a first structural example of the judgment circuit 59 shown in FIG. 17A. The first judgment circuit 59 outputs the signal 19 as an output signal 9. The first judgment circuit 59 includes a low pass filter 52 that inputs the signal 19 and outputs a DC component 10 of the signal 19, and a comparator 53 that inputs the DC component 10 and outputs the threshold setting signal 11 on the basis of a result compared with the comparison voltage. The first judgment circuit 59 also includes a DA (digital to analog) converter (DAC) 254 that converts the threshold setting signal 11 into an analog signal and outputs the DC voltage adjustment signal 15.

Now, a description will be given below of the operation of the differential-to-single converter circuit 245 and the logical level converter 25 shown in FIG. 17A using the first judgment circuit 59 shown in FIG. 18.

As an initial setting, the DA converter 254 does not output the DC voltage adjustment signal 15. At a certain time, the differential-to-single converter circuit 245 inputs the differential signals 16 and 17 and outputs the output signal 8 of the VCO 24. The output signal 8 is inputted to the logical level converter 25. The threshold value of the inverter 251 is Vthi. In this example, it is assumed that the output signal 8 is lower in the voltage than the threshold value of the inverter 251, and does not intersect with the threshold value of the inverter 251. In this situation, the signal 19 is fixed to high. As a result, the DC component 10 that is outputted by the low pass filter 52 becomes high, and a comparison result that is an inner signal of the comparator 53 becomes 1.

As a result, the comparator 53 outputs the threshold setting signal 11 of M+1 which makes the DC component of the output signal 8 higher by one step to the differential-to-single converter circuit 245. The DA converter 254 that has received the threshold setting signal 11 that is M+1 outputs the DC voltage adjustment signal 15 of a current value I to the differential-to-single converter circuit 245 so as to make the DC component of the output signal 8 higher by one step. The differential-to-single converter circuit 245 that inputs the DC voltage adjustment signal 15 of the current value I increases the DC component of the output signal 8 by the current value I at the point A. In this situation, there is no change in the AC component of the output signal 8. The output signal 8 that has thus increased the DC component is again inputted to the inverter 251.

The above operation is repeated until the output signal 8 is capable of intersecting with the threshold value of the inverter 251. When the output signal 8 intersects with the threshold value of the inverter 251, the comparator 53 holds the threshold setting signal 11 that is so set as to intersect with the threshold value of the inverter 251 as it is, in order to hold that state (a given state), and completes the operation of the logical level converter 25.

Now, a description will be given of a case in which the output signal 8 is higher in the voltage than the threshold value of the inverter 251, and the operation is reverse to the above case. As an initial setting, the DA converter 254 does not output the DC voltage adjustment signal 15. At a certain time, the differential-to-single converter circuit 245 inputs the differential signals 16 and 17 and outputs the output signal 8. The output signal 8 is inputted to the logical level converter 25. In this example, the threshold value of the inverter 251 is Vthi, and because the output signal 8 is higher in the voltage than the threshold value of the inverter 251, the output signal 8 does not intersect with the threshold value of the inverter 251. For that reason, the signal 19 is fixed to low. As a result, the DC component 10 that is outputted by the low pass filter 52 becomes low, and a comparison result that is an inner signal of the comparator 53 becomes −1.

As a result, the comparator 53 outputs the threshold setting signal 11 of M−1 which makes the DC component of the output signal 8 lower by one step to the differential-to-single converter circuit 245. The DA converter 254 that has received the threshold setting signal 11 that is M−1 outputs the DC voltage adjustment signal 15 of a current value −I to the differential-to-single converter circuit 245 so as to make the DC component of the output signal 8 lower by one step. The differential-to-single converter circuit 245 that inputs the DC voltage adjustment signal of the current value −I increases the DC component of the output signal 8 by the current value −I at the point A, that is, decreases the DC component by the current value I. In this situation, there is no change in the AC component of the output signal 8. The output signal 8 that has thus decreased the DC component is again inputted to the inverter 251.

The above operation is repeated until the output signal 8 is capable of intersecting with the threshold value of the inverter 251. When the output signal 8 intersects with the threshold value of the inverter 251, the comparator 53 holds the threshold setting signal 11 that is so set as to intersect with the threshold value of the inverter 251 as it is, in order to hold that state (a given state), and completes the operation of the logical level converter 25.

Figure 19:
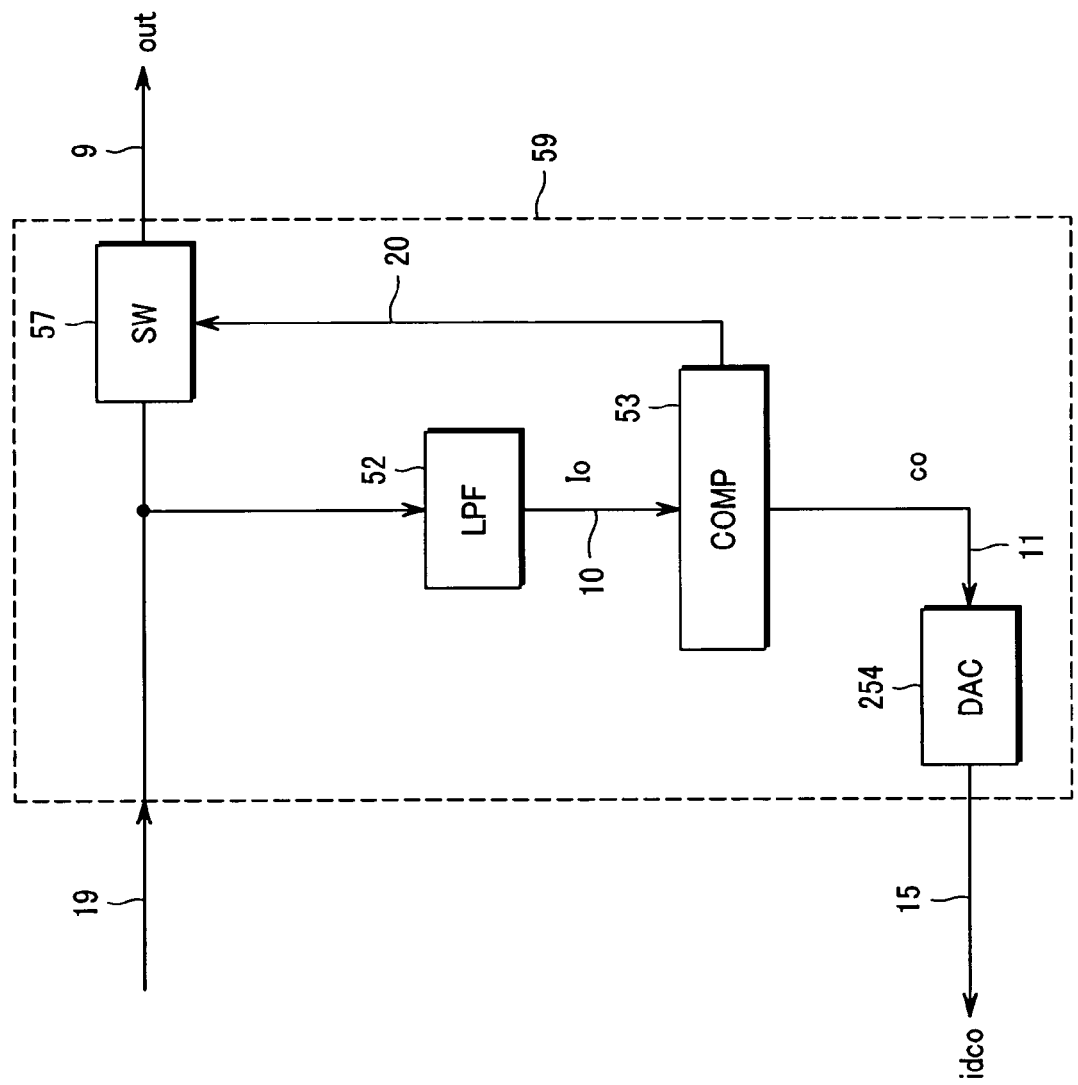
FIG. 19 is a block diagram for explaining an example of a second judgment circuit for use in the logical level converter shown in FIG. 17A and FIG. 17B.

FIG. 19 shows a second structural example of the judgment circuit 59 shown in FIG. 17A. The second judgment circuit 59 includes a low pass filter 52 that inputs the signal 19 and outputs a DC component 10 of the signal 19, and a comparator 53 that inputs the DC component 10 and outputs the threshold setting signal 11 and an operation judgment signal 20 on the basis of a result compared with the comparison voltage. The second judgment circuit 59 also includes a switch 57 whose on/off operation is controlled according to the operation judgment signal 20 and which outputs the signal 19 as the output signal 9 when the switch 57 is on, and a DA converter 254 that converts the threshold setting signal 11 into an analog signal and outputs the DC voltage adjustment signal 15.

Now, a description will be given below of the operation of the differential-to-single converter circuit 245 and the logical level converter 25 shown in FIG. 17A using the second judgment circuit 59 shown in FIG. 19.

As an initial setting, the DA converter 254 does not output the DC voltage adjustment signal 15. Also, as the initial setting, the switch 57 that is controlled according to the operation judgment signal 20 is off. At a certain time, the differential-to-single converter circuit 245 inputs the differential signals 16 and 17 and outputs the output signal 8. The output signal 8 is inputted to the logical level converter 25. In this example, the threshold value of the inverter 251 is Vthi. It is assumed that the output signal 8 is lower in the voltage than the threshold value of the inverter 251, and does not intersect with the threshold value of the inverter 251. In this situation, the signal 19 is fixed to high. As a result, the output signal 10 of the low pass filter 52 becomes high, and a comparison result that is an inner signal of the comparator 53 becomes 1.

As a result, the comparator 53 outputs the threshold setting signal 11 of M+1 which makes the DC component of the output signal 8 higher by one step to the differential-to-single converter circuit 245. The DA converter 254 that has received the threshold setting signal 11 that is M+1 outputs the DC voltage adjustment signal 15 of a current value I to the differential-to-single converter circuit 245 so as to make the DC component of the output signal 8 higher by one step. The differential-to-single converter circuit 245 that inputs the DC voltage adjustment signal 15 of the current value I increases the DC component of the output signal 8 by the current value I at the point A. In this situation, there is no change in the AC component of the output signal 8. The output signal 8 that has thus increased the DC component is again inputted to the inverter 251.

The above operation is repeated until the output signal 8 is capable of intersecting with the threshold value of the inverter 251. When the output signal 8 intersects with the threshold value of the inverter 251, the comparator 53 holds the threshold setting signal 11 that is so set as to intersect with the threshold value of the inverter 251 as it is, in order to hold that state (a given state). In addition, the comparator 53 outputs the operation judgment signal 20 that allows the switch 57 to turn on when the comparison result that is the inner signal becomes 0. The switch 57 that has turned on outputs the signal 19 as the output signal 9 and completes the operation of the logical level converter 5.

Now, a description will be given of a case in which the output signal 8 is higher in the voltage than the threshold value of the inverter 251, and the operation is reverse to the above case. As an initial setting, the DA converter 254 does not output the DC voltage adjustment signal 15. Also, the switch 57 is so controlled as to be off according to the operation judgment signal 20. At a certain time, the differential-to-single converter circuit 245 inputs the differential signals 16 and 17 and outputs the output signal 8. The output signal 8 is inputted to the logical level converter 5. The threshold value of the inverter 251 is Vthi. In this example, it is assumed that the output signal 8 is higher in the voltage than the threshold value of the inverter 251, and does not intersect with the threshold value of the inverter 251. In this situation, the signal 19 is fixed to low. As a result, the output signal 10 of the low pass filter 52 becomes low, and a comparison result that is an inner signal of the comparator 53 becomes −1.

As a result, the comparator 53 outputs the threshold setting signal 11 of M−1 which makes the DC component of the output signal 8 lower by one step to the differential-to-single converter circuit 245. The DA converter 254 that has received the threshold setting signal 11 that is M−1 outputs the DC voltage adjustment signal 15 of a current value −I to the differential-to-single converter circuit 245 so as to make the DC component of the output signal 8 lower by one step. The differential-to-single converter circuit 245 that inputs the current value −I as the DC voltage adjustment signal 15 increases the DC component of the output signal 8 by the current value −I, that is, decreases the DC component by the current value I at the point A. In this situation, there is no change in the AC component of the output signal 8. The output signal 8 that has thus decreased the DC component is again inputted to the inverter 251.

The above operation is repeated until the output signal 8 is capable of intersecting with the threshold value of the inverter 251. When the output signal 8 intersects with the threshold value of the inverter 251, the comparator 53 conducts the operation of holding the threshold setting signal 11 that is so set as to intersect with the threshold value of the inverter 251 as it is, in order to hold that state (a given state). In addition, the comparator 53 outputs the operation judgment signal 20 that allows the switch 57 to turn on when the comparison result that is the inner signal becomes 0. The switch 57 that has turned on outputs the signal 19 as the output signal 9 and completes the operation of the logical level converter 5.

Figure 20:
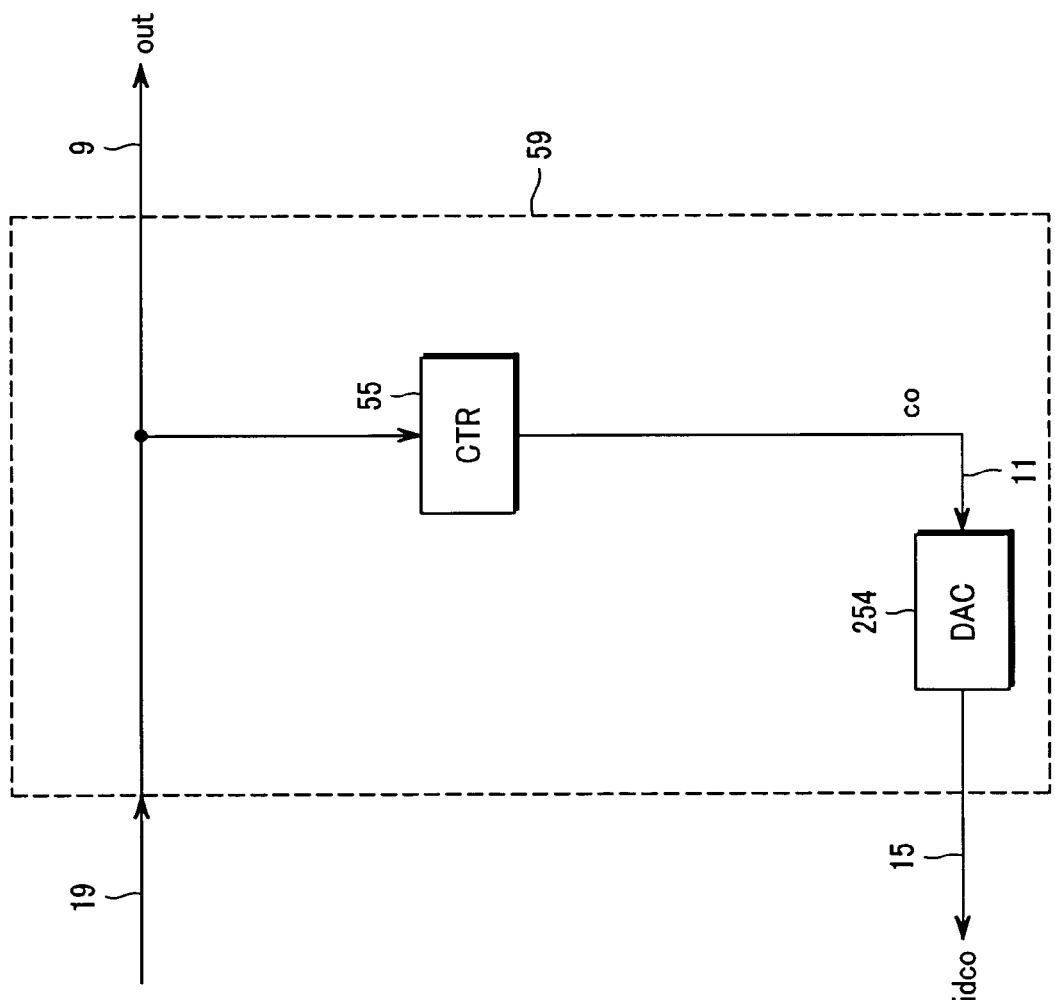
FIG. 20 is a block diagram for explaining an example of a third judgment circuit for use in the logical level converter shown in FIG. 17A and FIG. 17B.

Now, FIG. 20 shows a third structural example of the judgment circuit 59 shown in FIG. 17A. The third judgment circuit 59 is so designed as to output the signal 19 as the output signal 9, and include a counter 55 that inputs the signal 19, counts up the signal 19 for a given period of time, and outputs the threshold setting signal 11 on the basis of the count result, and a DA converter 254 that converts the threshold setting signal 11 into an analog signal, and outputs the DC voltage adjustment signal 15.

Now, a description will be given below of the operation of the differential-to-single converter circuit 245 and the logical level converter 25 shown in FIG. 17A using the third judgment circuit 59 shown in FIG. 20.

As an initial setting, the DA converter 254 does not output the DC voltage adjustment signal 15. At a certain time, the differential-to-single converter circuit 245 inputs the differential signals 16 and 17 and outputs the output signal 8. The output signal 8 is inputted to the logical level converter 5. The threshold value of the inverter 251 is Vthi. It is assumed that the output signal 8 is lower in the voltage than the threshold value of the inverter 251, and does not intersect with the threshold value of the inverter 251. In this situation, the signal 19 is fixed to high. The signal 19 is inputted to the counter 55. Because the output signal 19 is fixed to high, the count result is smaller than the desired count.

The counter 55 first outputs the threshold setting signal 11 that makes the DC component of the output signal 8 higher by one step as the initial operation setting because the counter 55 conducts count without discriminating between high and low of the output signal 19. In this case, the threshold setting signal 11 becomes M+1. The DA converter 254 that has received the threshold setting signal 11 that is M+1 outputs the DC voltage adjustment signal 15 of a current value I to the differential-to-single converter circuit 245 so as to make the DC component of the output signal 8 higher by one step. The differential-to-single converter circuit 245 that has the current value I inputted as the DC voltage adjustment signal 15 increases the DC component of the output signal 8 by the current value I. In this situation, there is no change in the AC component of the output signal 8. The output signal 8 that has thus increased the DC component is again inputted to the inverter 251. The inverter 251 that has the output signal 8 inputted outputs the signal 19. The signal 19 is inputted to the counter 55. The counter 55 counts up the output signal 9 for a given period of time, and compares the count result with a desired count. As a result of comparison, in the case where the count result is again smaller than the desired count, the counter 55 outputs the threshold setting signal 11 to the differential-to-single converter circuit 245 so as to make the DC component of the output signal 8 higher by one step. In this situation, the threshold setting signal 11 is M+2.

In the case where an appropriate count result is not obtained even if the DA converter 254 sets the settable maximum DC voltage adjustment signal 15, the threshold setting signal 11 is set to M−1. The DA converter 254 that has received the threshold setting signal 11 of M−1 outputs the DC voltage adjustment signal 15 of the current value −I to the differential single converter circuit 245 so as to make the DC component of the output signal 8 lower by one step. The differential-to-single converter circuit 245 that has inputted the DC voltage adjustment signal 15 of the current value −I increases the DC component of the output signal 8 by the current value −I, that is, decreases the DC component by the current value I at the point A. In this situation, there is no change in the AC component of the output signal 8. The inverter 251 again inputs the output signal 8 and outputs the signal 19. The signal 19 is inputted to the counter 55. The counter 55 counts up the output signal 9 for a given period of time, and compares the count result with a desired count. In the case where the count result is again smaller than the desired count as a result of comparison, the counter 55 outputs the threshold setting signal 11 so as to make the DC component of the output signal 8 further lower by one step. In this situation, the threshold setting signal 11 is M−2.

The DC component of the output signal 8 is thus reduced, and when an appropriate count result representative of the given state is obtained, the counter 55 completes the count operation, and holds the threshold setting signal 11 of that time. It is needless to say that when the appropriate count result is obtained at a stage where the threshold value is increased, the counter 55 completes the count operation at that time, and holds the threshold setting signal 11 of that time. With the above operation, the operation of the logical level converter 25 is completed.

Figure 21:
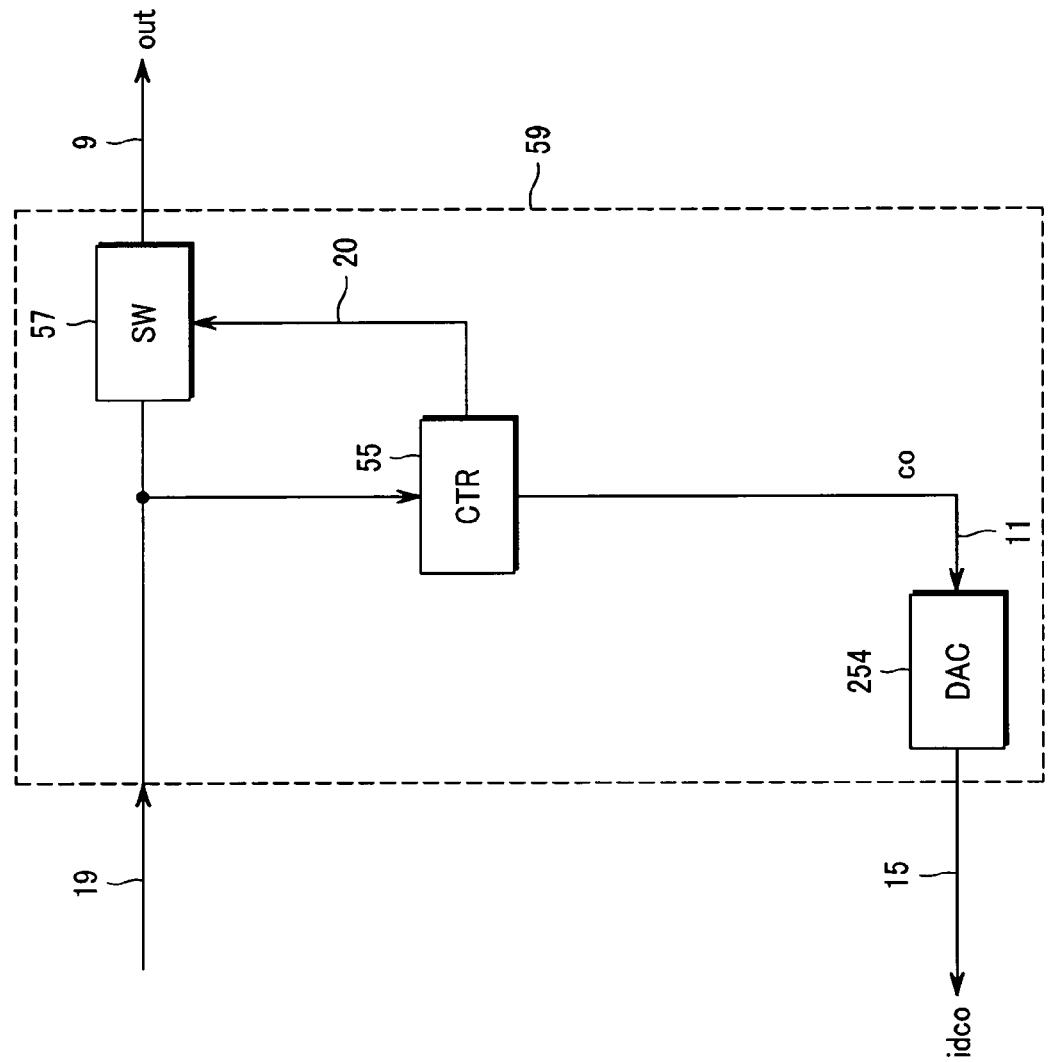
FIG. 21 is a block diagram for explaining an example of a fourth judgment circuit for use in the logical level converter shown in FIG. 17A and FIG. 17B.

FIG. 21 shows a fourth structural example of the judgment circuit 59 shown in FIG. 17A. The fourth judgment circuit 59 includes a counter 55 that inputs the signal 19, counts up the signal 19 for a given period of time, and outputs the threshold setting signal 11 and the operation judgment signal 20 on the basis of the count result, and a switch 57 whose on/off operation is controlled according to the operation judgment signal 20, and which outputs the signal 19 as the output signal 9 when the switch 57 is on.

Now, a description will be given below of the operation of the differential-to-single converter circuit 245 and the logical level converter 25 shown in FIG. 17A using the fourth judgment circuit 59 shown in FIG. 21.

As an initial setting, the DA converter 254 does not output the DC voltage adjustment signal 15. Also, the switch 57 is so controlled as to turn off according to the operation judgment signal 20. At a certain time, the differential-to-single converter circuit 245 inputs the differential signals 16 and 17 and outputs the output signal 8. The output signal 8 is inputted to the logical level converter 5. The threshold value of the inverter 251 is Vthi. It is assumed that the output signal 8 is lower in the voltage than the threshold value of the inverter 251, and does not intersect with the threshold value of the inverter 251. In this situation, the signal 19 is fixed to high. The signal 19 is inputted to the counter 55. Because the output signal 19 is fixed to high, the count result is smaller than the desired count.

The counter 55 first outputs the threshold setting signal 11 that makes the DC component of the output signal 8 higher by one step as the initial operation setting because the counter 55 conducts count without discriminating between high and low of the output signal 19. In this case, the threshold setting signal 11 becomes M+1. The DA converter 254 that has received the threshold setting signal 11 that is M+1 outputs the DC voltage adjustment signal 15 of a current value I to the differential-to-single converter circuit 245 so as to make the DC component of the output signal 8 higher by one step. The differential-to-single converter circuit 245 that inputs the current value I as the DC voltage adjustment signal 15 increases the DC component of the output signal 8 by the current value I. In this situation, there is no change in the AC component of the output signal 8. The output signal 8 that has thus increased the DC component is again inputted to the inverter 251. The inverter 251 that has inputted the output signal 8 outputs the signal 19. The signal 19 is inputted to the counter 55. The counter 55 counts up the output signal 9 for a given period of time, and compares the count result with a desired count. As a result of comparison, in the case where the count result is again smaller than the desired count, the counter 55 outputs the threshold setting signal 11 to the differential-to-single converter circuit 245 so as to make the DC component of the output signal 8 higher by one step. In this situation, the threshold setting signal 11 is M+2.

In the case where an appropriate count result is not obtained even if the DA converter 254 sets the settable maximum DC voltage adjustment signal 15, the threshold setting signal 11 is then set to M−1. The DA converter 254 that has inputted the threshold setting signal 11 of M−1 outputs the DC voltage adjustment signal 15 of the current value −I to the differential single converter circuit 245 so as to make the DC component of the output signal 8 lower by one step. The differential-to-single converter circuit 245 that has inputted the current value −I as the DC voltage adjustment signal 15 increases the DC component of the output signal 8 by the current value −I, that is, decreases the DC component by the current value I at the point A. In this situation, there is no change in the AC component of the output signal 8. The inverter 251 again inputs the output signal 8 and outputs the signal 19. The signal 19 is inputted to the counter 55. The counter 55 counts up the output signal 9 for a given period of time, and compares the count result with a desired count. In the case where the count result is again smaller than the desired count as a result of comparison, the counter 55 outputs the threshold setting signal 11 so as to make the DC component of the output signal 8 further lower by one step. In this situation, the threshold setting signal 11 is M−2.

The DC component of the output signal 8 is thus reduced, and when an appropriate count result representative of the given state is obtained, the counter 55 completes the count operation, and holds the threshold setting signal 11 of that time. It is needless to say that when the appropriate count result is obtained at a stage where the threshold value is increased, the counter 55 completes the count operation at that time, and holds the threshold setting signal 11 of that time. Also, the counter 55 outputs the operation judgment signal 20 that turns on the switch 57. The switch 57 that has turned on outputs the signal 19 as the output signal 9, and completes the operation of the logical level converter 25.

In this embodiment, the DA converter 254 of the DC output is required in the judgment circuit 59. However, because the inverter 251 is fixed in threshold value, the circuit structure is simple as compared with the threshold variable inverter 51. In general, since it is possible to further improve the frequency characteristic as the circuit structure is simpler, it is expected to obtain the effects of the wide frequency range in this embodiment.

Third Embodiment

Figure 22:
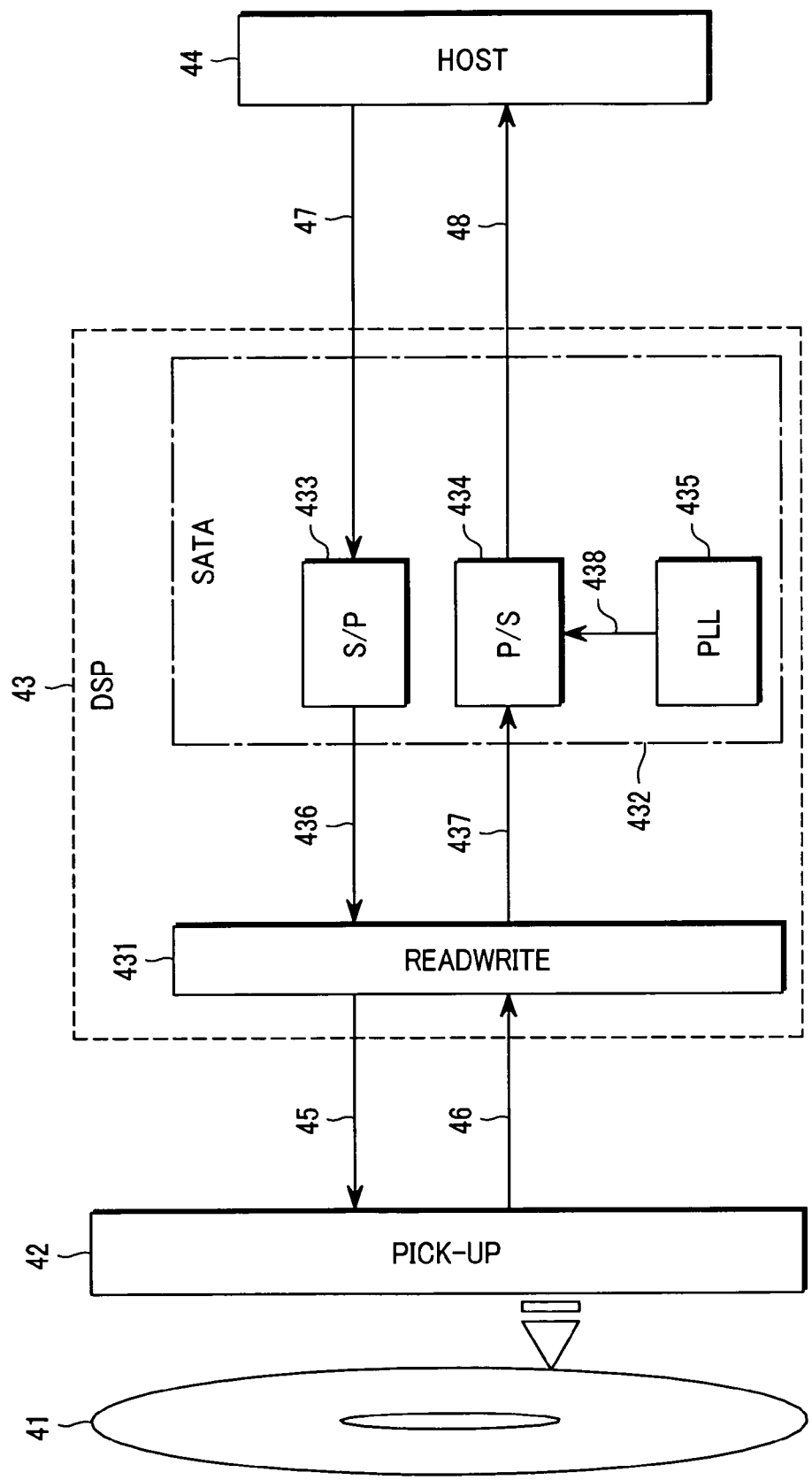
FIG. 22 is a block diagram for explaining an interface device according to a third embodiment of the present invention.

FIG. 22 shows a third embodiment of the present invention. This embodiment pertains to an interface device, and the phase locked loop described in the first and second embodiments is used in the interface device. In general, there is ATA (Advanced Technology Attachment) of the standard as an interface for connecting a memory media such as an optical disk driver or a hard disk driver to a computer such as a personal computer. With the use of the ATA, various memory media are connected to a computer on the basis of the same commands and the same control software. In this embodiment, an optical disk driver is applied as an example of the memory media, and the optical disk driver is connected to a host computer through a serial ATA (SATA).

Referring to FIG. 22, the optical disk driver includes an optical disk 41, and an optical pickup 42 that illuminates the optical disk 41 with an optical beam, inputs write data 45, writes the write data 45 in the optical disk 41, reads the data from the optical disk 41, and outputs read data 46. The optical disk driver also includes a signal processing unit (read write) 431 that inputs input data 436, conducts an appropriate processing on the input data 436, outputs write data 45 to the optical pickup 42, inputs the read data 46 from the optical pickup 42, conducts an appropriate processing on the read data 46, and outputs output data 437. The optical disk driver further includes an interface device (SATA: Serial ATA interface device) 432 that inputs receive data, conducts processing in conformity with the standard, outputs the signal to the signal processing device 431 as the input data 436, inputs output data 437 from the signal processing device 431, processes processing in conformity with the standard, and outputs data as transmit data. A host computer (HOST) 44 that is connected to the optical disk driver outputs the receive data 47 to the interface device 432, and inputs the transmit data 48 from the interface device 432.

It is possible that the signal processing device 431 and the-serial ATA interface device 432 are constituted by a semiconductor integrated circuit device, respectively, and a digital signal processor (DSP: Digital Signal Processor) is made up of both of the signal processing device 431 and the serial ATA interface device 432.

In the signal processing device 431, the write data 45, the read data 46, the input data 436, and the output data 437 are processed in parallel. On the other hand, the digital signal processor 43 and the host computer 44 transmit and receive the receive data 47 and the transmit data 48 with respect to each other through serial transfer. For that reason, in the interface device 432, the serial receive data 47 from the host computer 44 is converted into the parallel input data 436 by a serial to parallel converter device (S/P) 433.

On the other hand, after the parallel output data 437 from the signal processing device 432 has been converted into the serial transmit data 48 by the parallel-to-serial converter device (P/S) 434, the output data 437 is supplied to the host computer 44. The serial ATA interface device 432 receives the receive data 47 from the host computer 44 and transmits the transmit data to the host computer 44 in conformity with the serial ATA standard.

The phase locked loop according to the first and second embodiments is applied to the phase locked loop (PLL) 435 that generates the clock signal 438 which is supplied to the parallel-to-serial converter device 434.

In the description of the threshold setting operation in this embodiment, the phase locked loop 435 is representative of the phase locked loop according to the first embodiment shown in FIG. 1, and is applied with the phase locked loop using the first judgment circuit 56 shown in FIG. 3 and the first threshold variable inverter 51 shown in FIG. 6 in the logical level converter 5 shown in FIG. 2.

Figure 23:
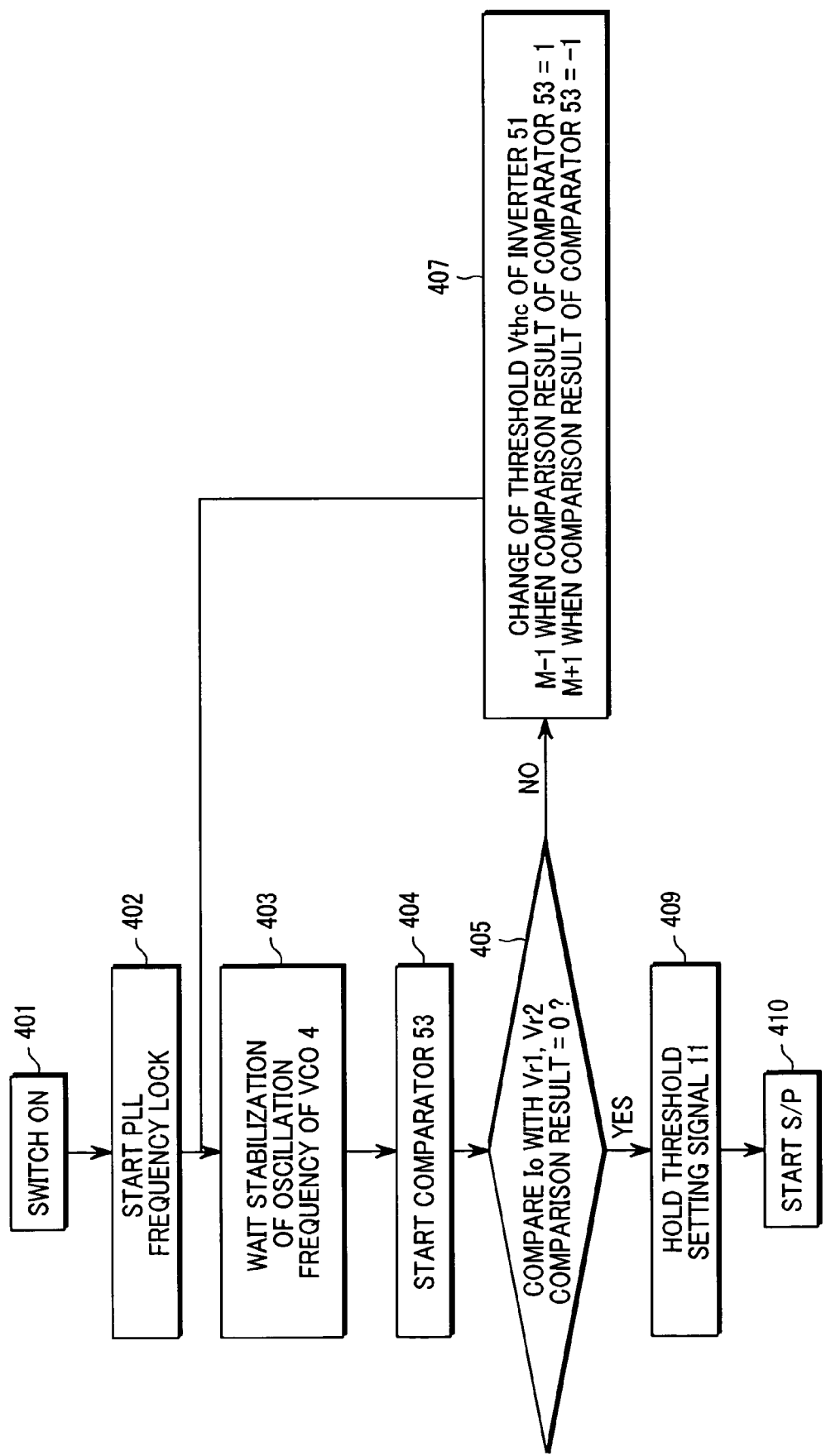
FIG. 23 is a flowchart for explaining the operation of setting a threshold value in the phase locked loop for use in the interface device shown in FIG. 22.

FIG. 23 shows a flowchart showing the threshold setting operation. First, a control switches on the interface device 432 (Step S401). Upon switching on, the control starts the phase locked loop 435, and starts the frequency lock operation (Step S402). The control waits for the PLL lock operation for a given period of time until the VCO 4 of the phase locked loop 435 is stabilized so as to output a desired oscillation frequency (Step S403). After a given period of time has been elapsed, the comparator 53 operates (Step S404), and compares the DC component ($1o$) 10 of the output signal 9 with the comparison voltages Vr1 and Vr2. When the comparison result is not 0 (Step S405), the comparator 53 outputs the threshold setting signal 11 to the threshold variable inverter 51. When the judgment result of comparison is 1, the comparator 53 outputs M−1 and outputs a command for making the threshold value of the threshold variable inverter 51 lower by one step. On the other hand, when the judgment result of comparison is −1, the comparator 53 outputs M+1 and outputs a command for making the threshold value of the threshold variable inverter 51 higher by one step. The threshold variable inverter 51 that has received the threshold setting signal 11 from the comparator 53 changes the threshold value (Step S407).

The control again waits for a given period of time until the VCO 4 is so stabilized as to output the desired frequency after the threshold value has been changed(Step S403). During this period of time, the comparator 53 does not operate. After the given period of time has been elapsed, the comparator 53 starts (Step S404), and the control again compares the DC component 10 of the output signal 9 with the comparison voltages Vr1 and Vr2. When the comparison result is not 0 (Step S405), the control repeats the above operation until the comparison result is 0. When the comparison result becomes 0 (a given state) (Step S405), the comparator 53 holds the value of the present threshold setting signal 11 (Step S409). Then, the control starts the parallel-to-serial converter circuit 433 and then starts the communication with the host computer 44 (Step S410).

Figure 17B:
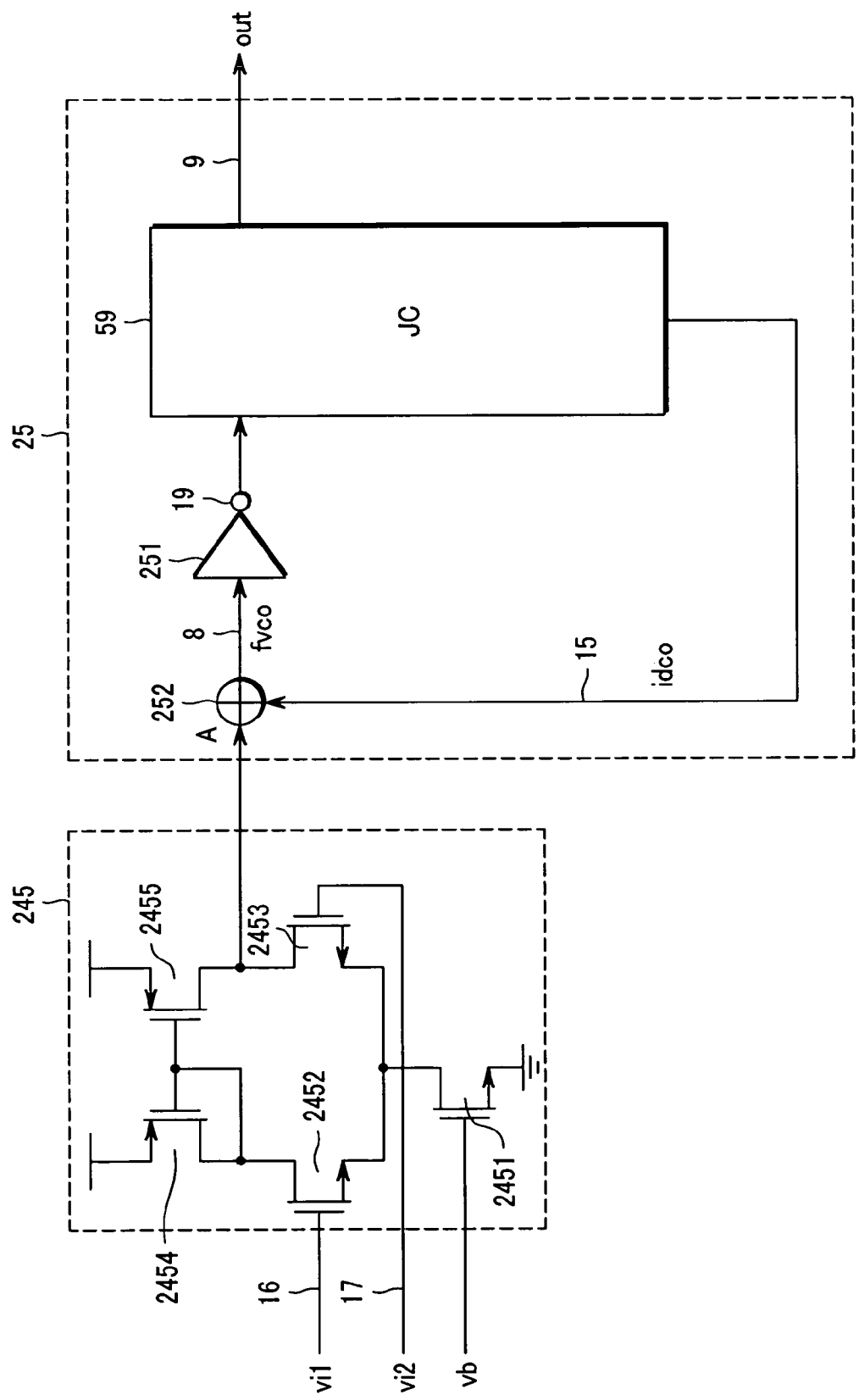
FIG. 17B is a block diagram for explaining another example of a logical level converter which is connected to the differential-to-single converter circuit shown in FIG. 16.

As described above, in the phase locked loop 435, the logical level converter 5 converts the output signal 8 of the VCO 4 into the output signal 9 that can be appropriately recognized by the local circuit. As a result, the malfunction of the host computer 44 is prevented. Accordingly, the data communication is normally conducted between the host computer 44 and the optical disk 41 to enhance the reliability of the signal processing device 431 and the interface device 432 which are made up of the semiconductor integrated circuit device, respectively. It is needless to say that the above effect is obtained even by the phase locked loop that is applied with the logical level converter device 25 shown in FIGS. 17A and 17B which converts the output signal 8 of the VCO 24 into the output signal 9 that can be appropriately recognized by the logical circuit.

The operation example described above may be different if the phase locked loop 435 can operate so that the parallel-to-serial converter circuit 434 is capable of inputting the output data 437 and outputting the transmit data 48 in conformity with the standard.

Figure 34:
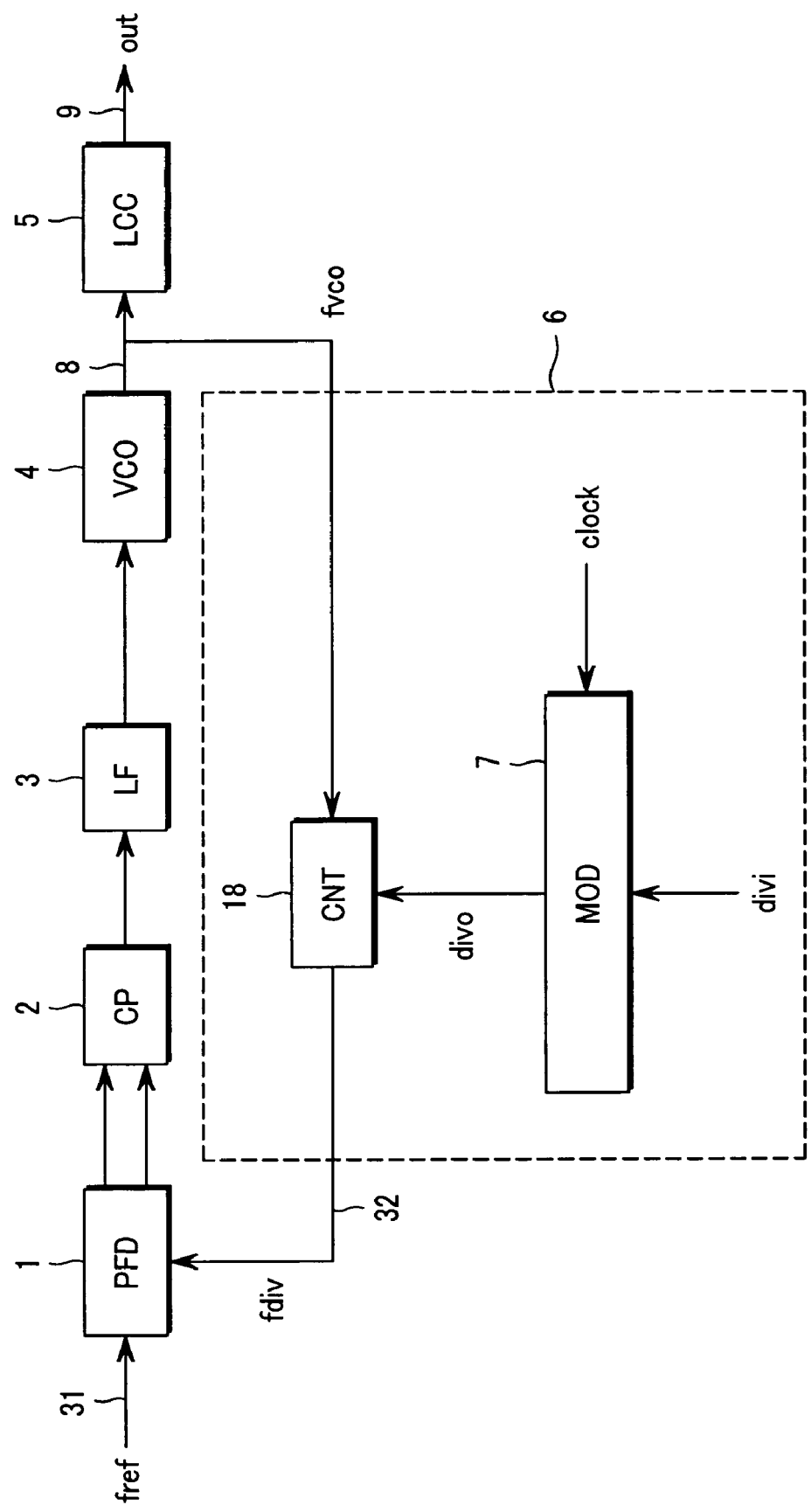
FIG. 34 is a block diagram for explaining another example of a phase locked loop for use in the third embodiment of the present invention.

Also, as the phase locked loop 435 shown in FIG. 22, for example, a fractional phase locked loop using a counter (CNT) 18 and a modulator circuit (MOD) 7 that inputs a clock signal (clock) and a frequency division input signal divi and outputs a frequency division output signal divo to a counter 18 as a frequency divider 6 as shown in FIG. 34, which is capable of using the logical level converter of the present invention, may be used other than the phase locked loop shown in FIGS. 1 and 2 as the phase locked loop 435 shown in FIG. 22.

In this embodiment, the media side is the optical disk driver whereas the host side is the host computer. However, the present invention is not limited to such a combination. For example, the present invention can be applied to the combination of a general memory media such as a hard disk driver as the media side with a network server or a DVD (digital versatile disk) recorder as the host side.

Fourth Embodiment

Figure 24:
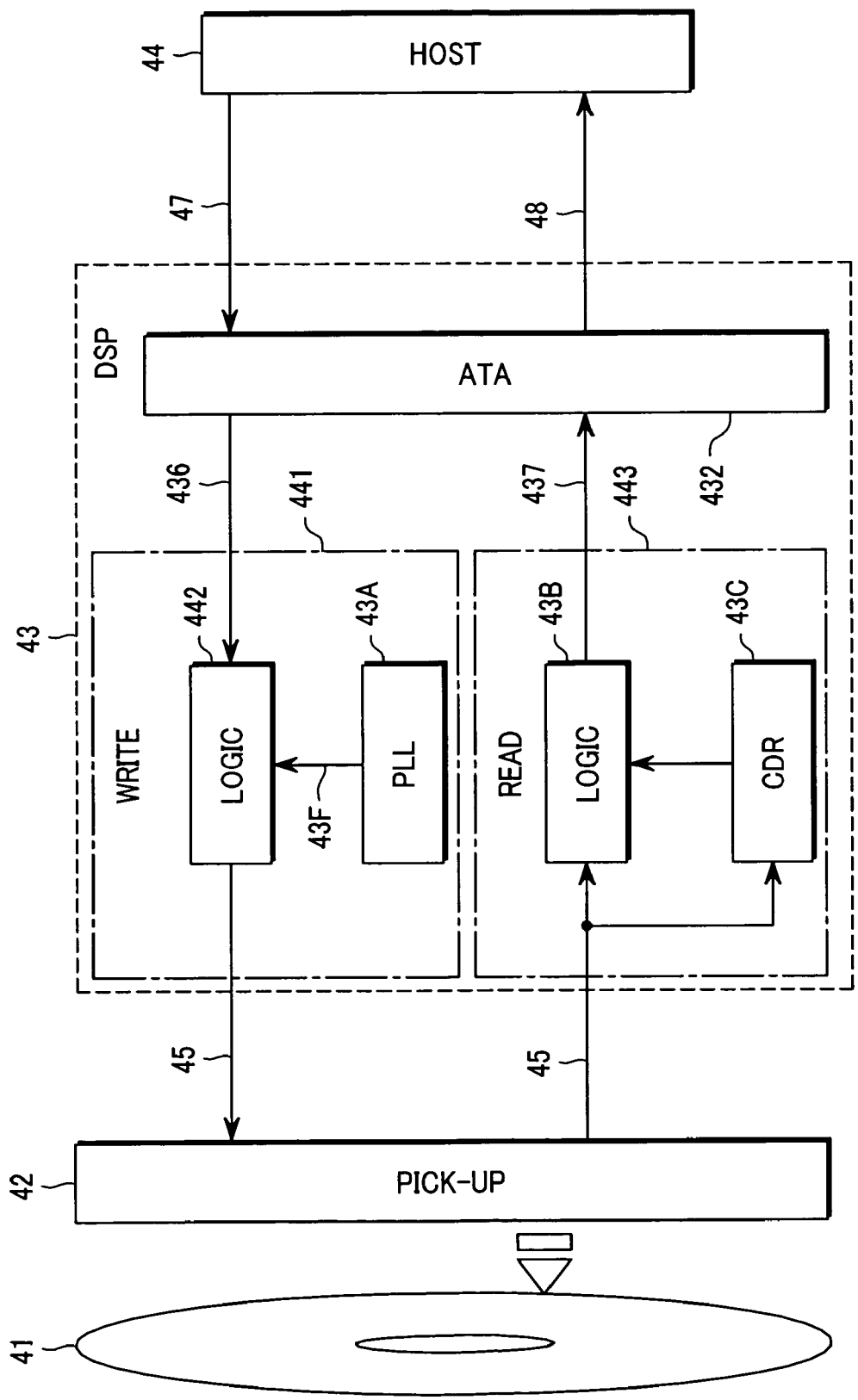
FIG. 24 is a block diagram for explaining a recording and reproducing device according to a fourth embodiment of the present invention.

FIG. 24 shows a fourth embodiment of the present invention. This embodiment pertains to a recording and reproducing device, and the phase locked loop described in the first and second embodiments is used in the recording and reproducing device. In general, there is the above-mentioned ATA of the standard as an interface for connecting a memory media such as an optical disk driver or a hard disk driver to a computer such as a personal computer. With the use of the ATA, various memory media are connected to a computer on the basis of the same commands and the same control software. In this embodiment, an optical disk driver is applied as an example of the memory media, and the optical disk driver is connected to a host computer through an ATA.

Referring to FIG. 24, the optical disk driver includes an optical disk 41, and an optical pickup 42 that illuminates the optical disk 41 with an optical beam, and reads and write data, a write device (WRITE) 441 that processes write data and a read device (READ) 443 that processes read data with respect to the optical pickup 42, and an ATA interface device 432 for inputting and outputting the data in the write device 441 and the read device 443 with respect to the host computer 44. It is possible that the write device 441, the read device 443, and the ATA interface device 432 are structured by the semiconductor integrated circuit devices, respectively. The write device 441, the read device 443, and the ATA interface device 432 constitute the signal processing device 43. In addition, the optical pickup 42 and the signal processing device 43 constitute the recording and reproducing device of the present invention. Also, the interface device 432 shown in FIG. 22 is used in the ATA interface device 432.

The write device 441 includes a logical circuit (LOGIC) 442 and a phase locked loop (PLL) 43A. The phase locked loop 43A determines the double speed of writing a data write signal 45 in a media 41, and generates an operation clock (output signal 9) 43F of the logical circuit 442.

The phase locked loop according to the first and second embodiments of the present invention is applied to the phase locked loop 43A that generates the operation clock 43F of the logical circuit 442.

The read device 443 includes a clock data restore device (CDR) and a logical circuit (LOGIC) 43B that operates upon receiving an output signal from the logical circuit 43B.

In the description of the threshold setting operation in this embodiment, the phase locked loop 435 is representative of the phase locked loop according to the first embodiment shown in FIG. 1, and is applied with the phase locked loop using the first judgment circuit 56 shown in FIG. 3 and the first threshold variable inverter 51 shown in FIG. 6 in the logical level converter 5 shown in FIG. 2.

Figure 25:
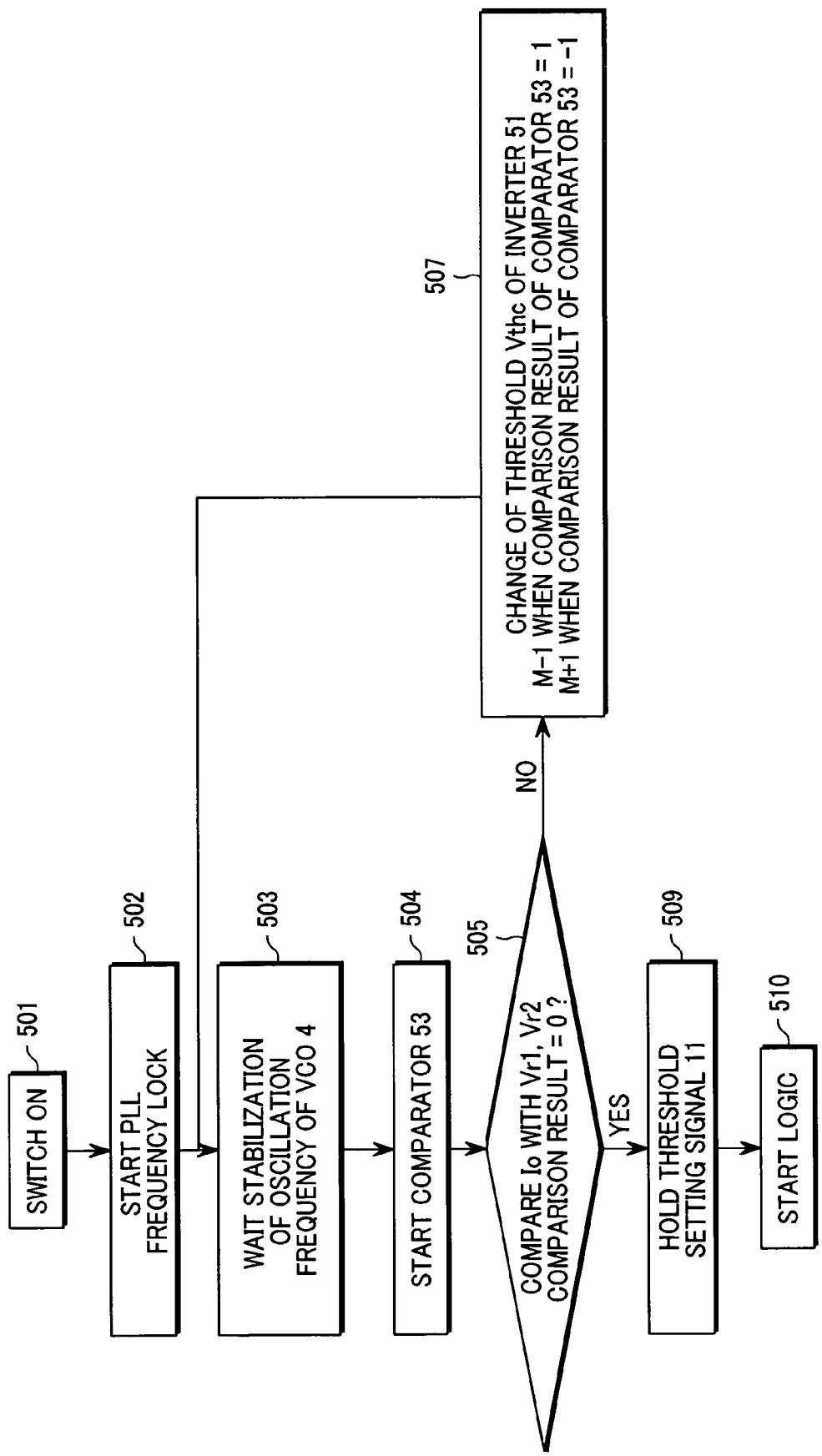
FIG. 25 is a flowchart for explaining the operation of setting a threshold value in a phase locked loop for use in the recording and reproducing device shown in FIG. 24.

FIG. 25 shows a flowchart showing the threshold setting operation. First, the control switches on the recording and reproducing device 432 (Step S501). Upon switching on, the control starts the phase locked loop 43A, and starts the frequency lock operation (Step S502). The control waits for the PLL lock operation for a given period of time until the VCO 4 of the phase locked loop 43A is stabilized so as to output a desired oscillation frequency (Step S503). After a given period of time has been elapsed, the comparator 53 operates (Step S504), and compares the DC component (1$o$) 10 of the output signal 9 with the comparison voltages Vr1 and Vr2. When the comparison result is not 0 (Step S505), the comparator 53 outputs the threshold setting signal 11 to the threshold variable inverter 51. When the judgment result of comparison is 1, the comparator 53 outputs M−1 and outputs a command for making the threshold value of the threshold variable inverter 51 lower by one step. On the other hand, when the judgment result of comparison is −1, the comparator 53 outputs M+1 and outputs a command for making the threshold value of the threshold variable inverter 51 higher by one step. The threshold variable inverter 51 that has received the threshold setting signal 11 from the comparator 53 changes the threshold value (Step S507).

The control again waits for a given period of time until the VCO 4 is so stabilized as to output the desired frequency after the threshold value has been changed (Step S503). During this period of time, the comparator 53 does not operate. After the given period of time has been elapsed, the comparator -53 starts (Step S504), and the control again compares the DC component 10 of the output signal 9 with the comparison voltages Vr1 and Vr2. When the comparison result is not 0 (Step S505), the control repeats the above operation until the comparison result is 0. When the comparison result becomes 0 (a given state) (Step S505), the comparator 53 holds the value of the present threshold setting signal 11 (Step S509). Then, the control starts the logical circuit 442 and then starts the communication with the host computer 44 (Step S510).

As described above, in the phase locked loop 435, the logical level converter 5 converts the output signal 8 of the VCO 4 into the output signal 9 (operation clock 43F) that can be appropriately recognized by the local circuit 442. As a result, the malfunction of write is prevented in the write operation into the media 41, to thereby enhance the reliability of the signal processing device 43 in the recording and reproducing device that is made up of the semiconductor integrated circuit device. It is needless to say that the above effect is obtained even by the phase locked loop that is applied with the logical level converter device 25 shown in FIG. 17A which converts the output signal 8 of the VCO 24 into the output signal 9 that can be appropriately recognized by the logical circuit 442.

In this embodiment, the media side is the optical disk driver whereas the host side is the host computer. However, the present invention is not limited to such a combination. For example, the present invention can be applied to the combination of a general memory media such as a hard disk driver as the media side with a network server or a DVD recorder as the host side.

Fifth Embodiment

Figure 26:
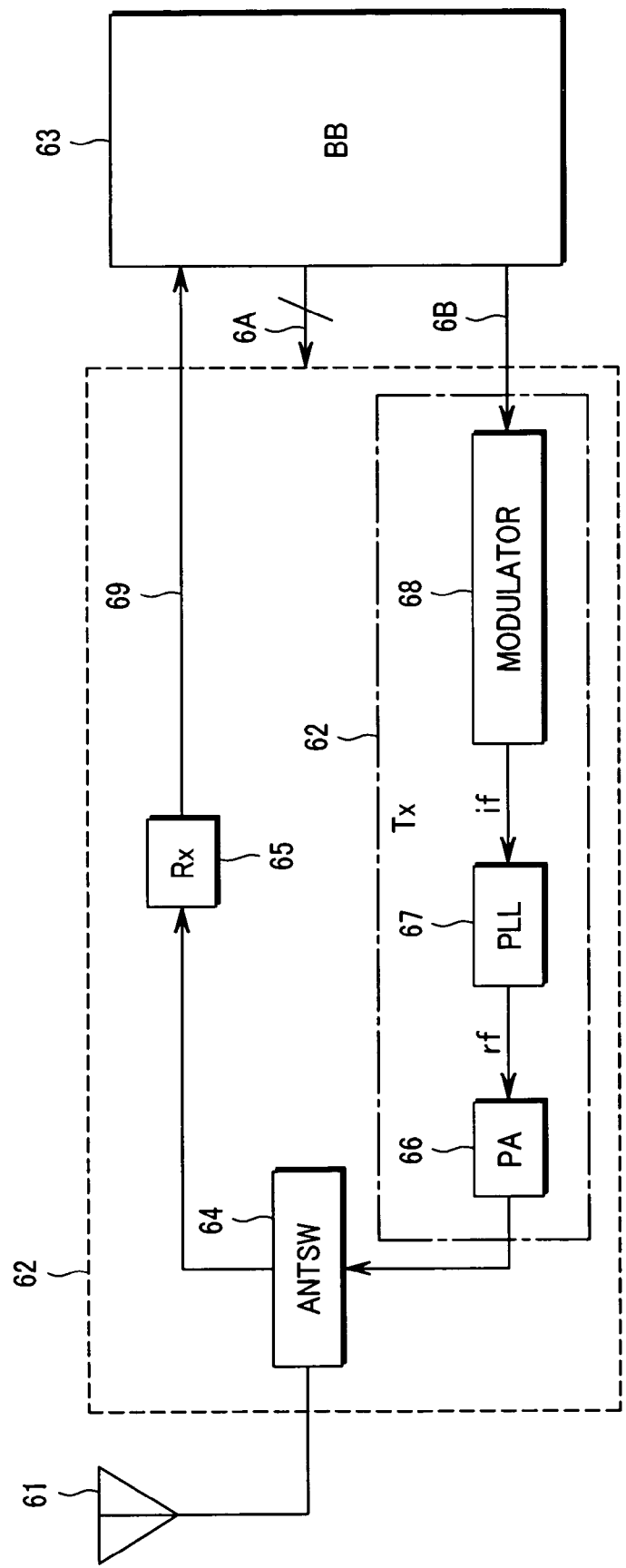
FIG. 26 is a block diagram for explaining a radio communication terminal device according to a fifth embodiment of the present invention.

FIG. 26 shows a fifth embodiment of the present invention. This embodiment pertains to a radio communication terminal device, and the phase locked loop described in the first and second embodiments is used in the radio communication terminal device. The radio communication terminal device according to this embodiment includes a base band circuit (BB) 63, a transmitter system (Tx) 62, an antenna switch (ANTSW) 64, an antenna 61, and a receiver circuit (Rx) 65. The transmitter system 62 further includes a modulator (MOD) 68, a phase locked loop 67 using the logical level converter described in the first and second embodiments, and a power amplifier (PA) 66. Also, the transmitter system 62, the antenna switch 64, and the receiver circuit 65 constitute a transmitter and receiver circuit 70.

The base band circuit 63 outputs a base band signal 6B to the modulator 68 on the basis of an audio signal or a data signal, and reproduces the audio signal or the data signal on the basis of a base band signal 69 that is inputted from the receiver circuit 65. The base band circuit 63 also outputs a control signal 6A for controlling the respective portions of the transmitter and receiver circuit 70.

In the modulator 68, a modulation signal 'if' of an IF (Intermediate Frequency) band is generated on the basis of the base band signal 6B. The modulation signal 'if' that is outputted by the modulator 68 is inputted to the phase locked loop 67, and then subjected to frequency conversion. As a result, a transmit signal rf is outputted from the phase locked loop 67. The transmit signal rf is inputted to the power amplifier 66 and amplified in power. The transmit signal rf is then transmitted from the antenna 62 through the antenna switch 64. The antenna switch 64 allows the antenna 61 and the power amplifier 66 to be connected to each other at the time of transmission, and the antenna 61 and the receiver circuit 65 to be connected to each other at the time of reception. The signal that has been received by the antenna 61 is inputted to the receiver circuit 65, subjected to demodulation into the base band signal 69, and then outputted to the base band circuit 63.

Figure 27:
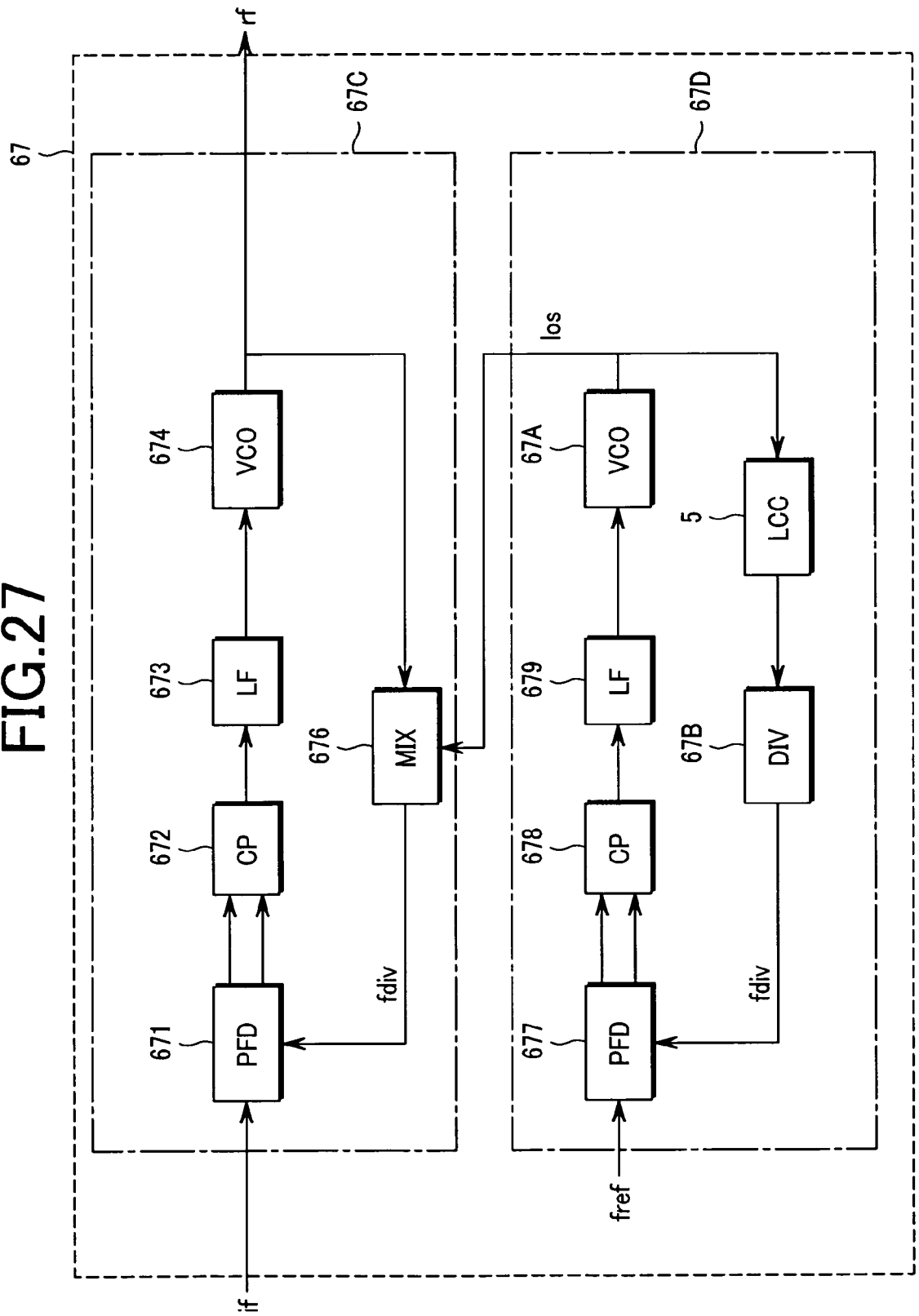
FIG. 27 is a block diagram for explaining an example of a phase locked loop according to the fifth embodiment.
Figure 28:
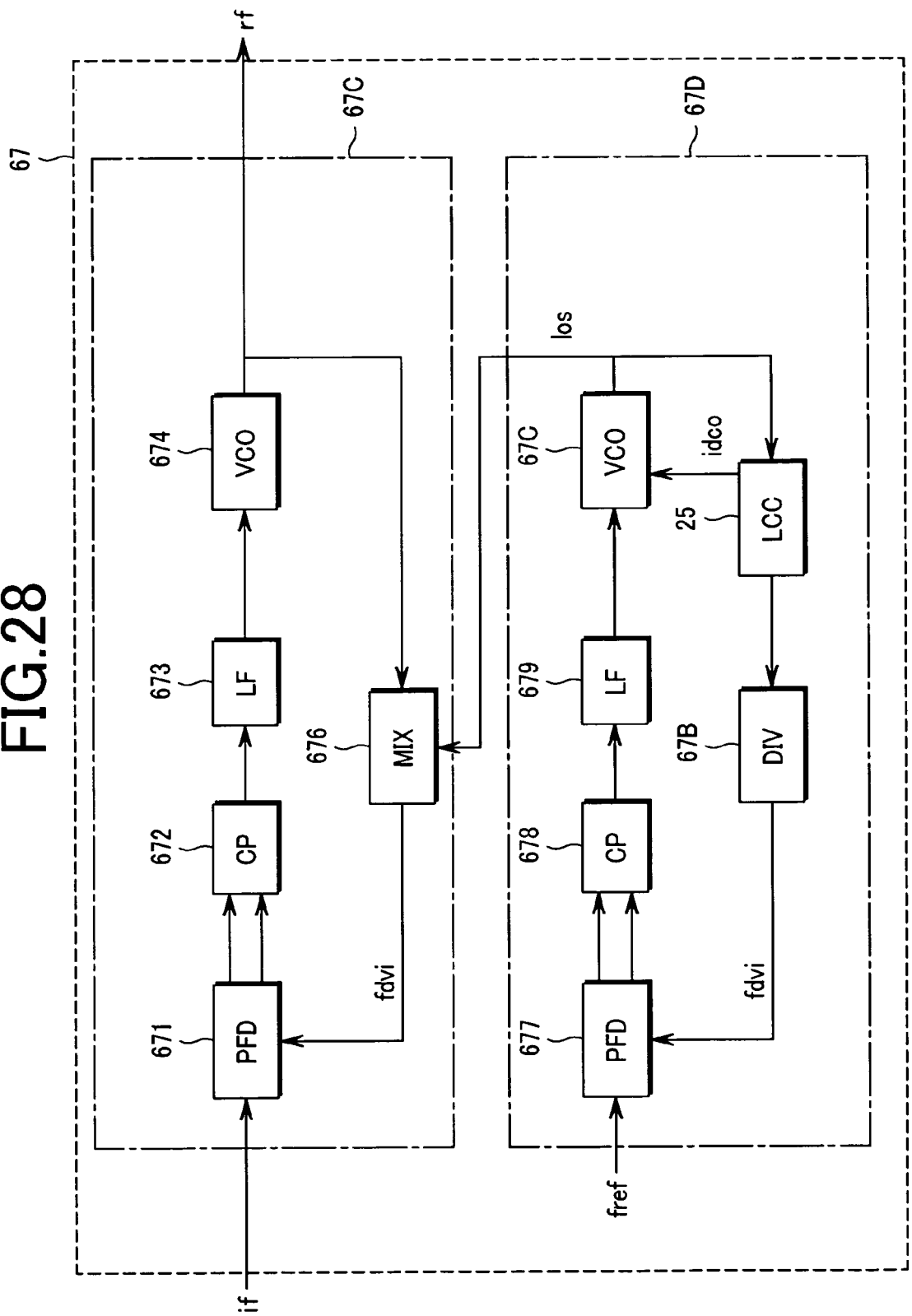
FIG. 28 is a block diagram for explaining another example of a phase locked loop according to the fifth embodiment.

FIGS. 27 and 28 show structural examples of the phase locked loop 67. The phase locked loop 67 includes an offset phase locked loop 67C that inputs the modulation signal 'if' that is outputted by the modulator 68 and the local signal los and generates the transmit signal rf, and an RF (Radio Frequency) phase locked loop 67D that inputs a reference signal fref and outputs the local signal los. As the RF phase locked loop 67D, there are a first RF phase locked loop 67D (FIG. 27) using the logical level converter 5 according to the first embodiment as the logical level converter, and a second RF phase locked loop 67D (FIG. 28) using the logical level converter 25 according to the second embodiment as the logical level converter.

The offset phase locked loop 67C includes a phase comparator 671, a charge pump 672, a loop filter 673, a VCO 674, and a mixer (MIX) 676. The phase comparator 671 is inputted with the modulation signal 'if' as a reference signal, and a comparison signal fdi that is outputted by the mixer 676 as a comparison signal.

Referring to FIG. 27, the first RF phase locked loop 67D includes a phase comparator 677, a charge pump 678, a loop filter 679, a VCO 67A, a logical level converter 5, and a frequency divider (DIV) 67B.

Hereinafter, a description will be given of the operation of the first RF phase locked loop 67D having the logical level converter 5 according to the present invention with reference to FIG. 27. The structure of the first RF phase locked loop 67D is identical with that of the phase locked loop shown in FIG. 1 except that the logical level converter 5 is interposed between the VCO 67A and the frequency divider 67B.

The frequency divider 67B divides the local signal los (corresponding to an output signal (fvco) 8 of the VCO 4 in FIG. 1) which is outputted by the VCO 67A. The comparison signal fdiv obtained by the frequency division is fed back to the phase comparator 677. The phase comparator 677 detects a phase difference between the reference signal fref and the comparison signal fdiv, and outputs a voltage pulse of a pulse width corresponding to the phase difference to the charge pump 678. The charge pump 678 comes to any state of the discharge or charge of electric charges, or high impedance according to the voltage pulse, and outputs the charge pump output current to the loop filter 679. The charge pump output current is smoothed and converted into a voltage by the loop filter 679 to obtain the control voltage of the VCO 67A.

The VCO 67A outputs an output signal los according to the control voltage, and then supplies the output signal los to the offset phase locked loop 67C and the logical level converter 5. The logical level converter 5 inputs the output signal Los of the VCO 67A, generates a signal (Vdd in the amplitude, ½ Vdd in the DC component) which can be normally operated by the frequency divider 67B, and outputs the signal.

In the description of the threshold setting operation in this embodiment, the first RF phase locked loop 67D is representative of the logical level converter 5 shown in FIG. 2, using the first judgment circuit 56 shown in FIG. 3 and the first threshold variable inverter 51 shown in FIG. 6.

Figure 29:
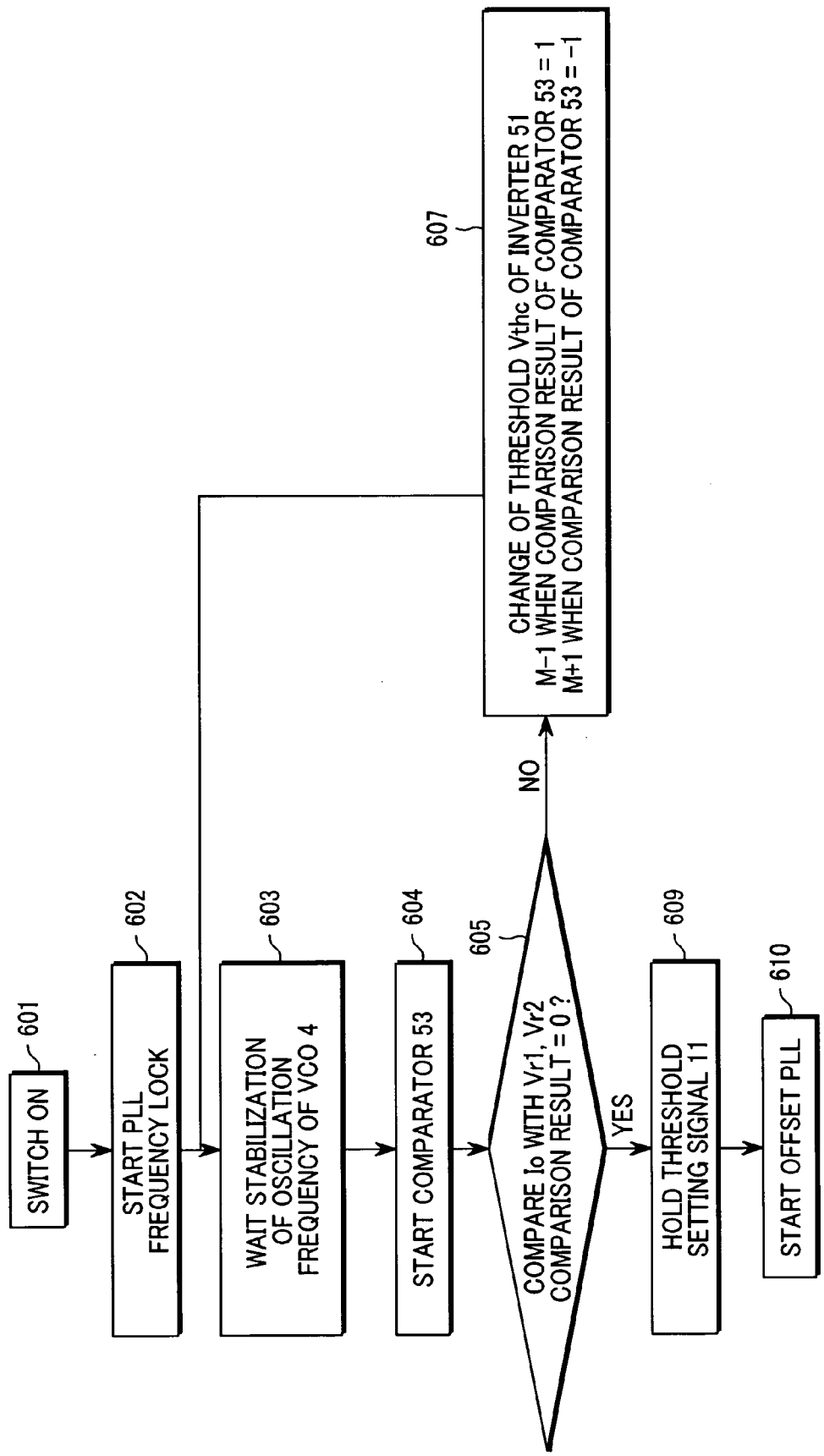
FIG. 29 is a flowchart for explaining the operation of setting a threshold value in a phase locked loop for use in the radio communication terminal device shown in FIG. 26.

FIG. 29 shows a flowchart showing the threshold setting operation. First, the control switches on the radio communication terminal device (Step S601). Upon switching on, the control starts the first RF phase locked loop 67D, and starts the frequency lock operation (Step S602). The control waits for the PLL lock operation for a given period of time until the VCO 67A is stabilized so as to output a desired oscillation frequency (Step S603). After a given period of time has been elapsed, the comparator 53 operates (Step S604), and compares the DC component (1*o*) 10 of the output signal 9 with the comparison voltages Vr1 and Vr2. When the comparison result is not 0 (Step S605), the comparator 53 outputs the threshold setting signal 11 to the threshold variable inverter 51. When the judgment result of comparison is 1, the comparator 53 outputs M−1 and outputs a command for making the threshold value of the threshold variable inverter 51 lower by one step. On the other hand, when the judgment result of comparison is −1, the comparator 53 outputs M+1 and outputs a command for making the threshold value of the threshold variable inverter 51 higher by one step. The threshold variable inverter 51 that has received the threshold setting signal 11 from the comparator 53 changes the threshold value (Step S607).

The control again waits for a given period of time until the VCO 67A is so stabilized as to output the desired frequency after the threshold value has been changed (Step S603). During this period of time, the comparator 53 does not operate. After the given period of time has been elapsed, the comparator 53 starts (Step S604), and the control again compares the DC component 10 of the output signal 9 with the comparison voltages Vr1 and Vr2. When the comparison result is not 0 (Step S605), the control repeats the above operation until the comparison result is 0. When the comparison result becomes 0 (Step S605), the comparator 53 holds the value of the present threshold setting signal 11 (Step S609). Then, the control starts the offset phase locked loop 67C and transmits the transmit signal RF to the amplifier 66 (Step S610).

FIG. 28 shows a phase locked loop 67 using a second RF phase locked loop 67D. The second RF phase locked loop 67D includes a phase comparator 677, a charge pump 678, a loop filter 679, a VCO 67C, a logical level converter 25, and a frequency divider 67B.

Hereinafter, a description will be given of the operation of the second RF phase locked loop having the logical level converter 25. The frequency divider 67B divides the local signal los (corresponding to an output signal (fvco) 8 of the VCO 4 in FIG. 1) which is outputted by the VCO 67A. The comparison signal fdiv obtained by the frequency division is fed back to the phase comparator 677. The phase comparator 677 detects a phase difference between the reference signal fref and the comparison signal fdiv, and outputs a voltage pulse of a pulse width corresponding to the phase difference to the charge pump 678. The charge pump 678 comes to any state of the discharge or charge of electric charges, or high impedance according to the voltage pulse, and outputs the charge pump output current to the loop filter 679. The charge pump output current is smoothed and converted into a voltage by the loop filter 679 to obtain the control voltage of the VCO 67A. The VCO 67A outputs an output signal los according to the control voltage, which is the output signal los whose DC component is adjusted according to the DC voltage adjustment signal idco. The output signal los is outputted to the offset phase locked loop 67C and the logical level converter 25. The logical level converter 25 inputs the output signal los of the VCO 67A, outputs the DC voltage adjustment signal idco so that the frequency divider 67B can normally operate, generates and outputs an appropriate signal (Vdd in the amplitude, ½ Vdd in the DC component) to the frequency divider 67B.

In the description of the threshold setting operation in this embodiment, the second RF phase locked loop 67D is representative of the logical level converter 25 shown in FIG. 17A, using the first judgment circuit 59 shown in FIG. 18 and the inverter 251 shown in FIG. 17A, and the differential-to-single converter circuit 245 shown in FIG. 16. A flowchart of the threshold setting operation in this case is identical with that in FIG. 29.

As was described above, in the phase locked loop 67, the logical level converters 5 and 25 convert the local signal los that is outputted from the VCO 67A into an output signal which can be appropriately recognized by the frequency divider 67B.

As a result, it is possible to obtain the transmission signal rf of the stable frequency, and it is expected to realize the radio communication terminal device that is high in reliability.

It is further understood by those skilled in the art that the foregoing description is a preferred embodiment of the disclosed device and that various changes and modifications may be made in the invention without departing from the spirit and scope thereof.

What is claimed is:

1. A logical level converter, comprising:
a threshold variable inverter that inputs a first signal and a second signal and converts the first signal into a third signal by a threshold value that is set according to the second signal; and
a judgment circuit that judges the third signal on the basis of a given state after setting the second signal to a given value, newly generates the second signal on the basis of a judgment result, and outputs the third signal as a fourth signal,
wherein the judgment circuit holds a value of the second signal when the third signal is in the given state.

2. The logical level converter according to claim 1, wherein the threshold variable inverter comprises a plurality of series circuits each of which is a series circuit of a PMOS transistor and an NMOS transistor whose gates are connected to each other, and whose drains are connected to each other, and each of which is provided with a first switch that is controlled according to the second signal and is disposed between the source of the PMOS transistor and a supply voltage, and a second switch that is controlled according to the second signal and is disposed between the source of the NMOS transistor and the ground,
wherein the respective gates of the plurality of series circuits are connected to each other to provide an input terminal, and the respective drains of the plurality of series circuits are connected to each other to provide an output terminal to connect the plurality of series circuits in series to each other, and
wherein the first signal is inputted to the input terminal, and the third signal is outputted from the output terminal.

3. The logical level converter according to claim 1, wherein the threshold variable inverter comprises a plurality of inverters different in threshold value from each other, which are inputted with the first signal through the switch,
wherein the switch is controlled according to the second signal, and
wherein each of the plurality of inverters outputs the third signal when the switch is on.

4. The logical level converter according to claim 1, wherein the judgment circuit comprises a low pass filter that outputs a DC component of the third signal, and a comparator that compares the DC component with a comparison voltage corresponding to the given state to generate a comparison result,
wherein the comparator newly outputs the second signal by using the comparison result as the given result.

5. The logical level converter according to claim 1, wherein the judgment circuit comprises a counter that counts up the third signal for a given period of time, and
wherein the counter newly generates the second signal by using a count result as the judgment result corresponding to the given state.

6. The logical level converter according to claim 1, wherein the judgment circuit comprises a pad that measures the third signal on the basis of the given state outside of a chip and outputs a setting signal; and a tester that newly generates the second signal by using the setting signal as the judgment result.

7. The logical level converter according to claim 1, wherein the judgment circuit comprises a switch that inputs the third signal and outputs the fourth signal, and
wherein the switch is on when the third signal is in the given state.

8. A phase locked loop, comprising:
a phase comparator that compares a comparison reference signal with an inputted reference signal to output a phase difference;
a charge pump that converts the phase difference into a current;
a loop filter that extracts a low frequency component from the current which is outputted by the charge pump, and converts the extracted low frequency component of the current into a control voltage to output the control voltage;
a voltage control oscillator that changes an oscillation frequency according to the control voltage and outputs an oscillation output as a first signal;
a frequency divider that divides the first signal in frequency and outputs the comparison signal; and
a logical level converter that inputs the first signal and outputs the fourth signal,
wherein the logical level converter comprises:
a threshold variable inverter that inputs a first signal and a second signal and converts the first signal into a third signal by a threshold value that is set according to the second signal; and
a judgment circuit that judges the third signal on the basis of a given state after setting the second signal to a given value, newly generates the second signal on the basis of a judgment result, and outputs the third signal as a fourth signal, and
wherein the judgment circuit holds a value of the second signal when the third signal is in the given state.

9. The phase locked loop according to claim 8, wherein the voltage control oscillator, comprises:
a voltage to current converter circuit that inputs the control voltage and outputs a control current;
a current control oscillator that changes the oscillation frequency according to the control current, and outputs the oscillation output as a differential oscillation signal; and
a differential-to-single converter circuit that converts the differential oscillation signal into the first signal of a single phase.

10. The phase locked loop according to claim 8, wherein the threshold variable inverter comprises a plurality of series circuits each of which is a series circuit of a PMOS transistor and an NMOS transistor whose gates are connected to each other, and whose drains are connected to each other, and each of which is provided with a first switch that is controlled according to the second signal and is disposed between the source of the PMOS transistor and a supply voltage, and a second switch that is controlled according to the second signal and is disposed between the source of the NMOS transistor and the ground,
wherein the respective gates of the plurality of series circuits are connected to each other to provide an input terminals, and the respective drains of the plurality of series circuits are connected to each other to provide an output terminal to connect the plurality of series circuits in series to each other, and
wherein the first signal is inputted to the input terminal, and the third signal is outputted from the output terminal.

11. The phase locked loop according to claim 8, wherein the threshold variable inverter includes a plurality of inverters different in threshold value from each other, which are inputted with the first signal through the switch,
wherein the switch is controlled according to the second signal, and
wherein each of the plurality of inverters outputs the third signal when the switch is on.

12. The phase locked loop according to claim 8,
wherein the judgment circuit comprises a low pass filter that outputs a DC component of the third signal, and a comparator that compares the DC component with a comparison voltage corresponding to the given state to generate a comparison result, and
wherein the comparator newly outputs the second signal by using the comparison result as the given result.

13. The phase locked loop according to claim 8,
wherein the judgment circuit comprises a counter that counts up the third signal for a given period of time, and
wherein the counter newly generates the second signal by using a count result as the judgment result corresponding to the given state.

14. The phase locked loop according to claim 8,
wherein the judgment circuit comprises a pad that measures the third signal on the basis of the given state outside of a chip and outputs a setting signal; and a tester that newly generates the second signal by using the setting signal as the judgment result.

15. The phase locked loop according to claim 8,
wherein the judgment circuit comprises a switch that inputs the third signal and outputs the fourth signal, and
wherein the switch is on when the third signal is in the given state.

* * * * *